US012696741B2

(12) United States Patent
Liu et al.

(10) Patent No.: US 12,696,741 B2
(45) Date of Patent: Jul. 28, 2026

(54) SEMICONDUCTOR DEVICE AND METHOD

(71) Applicant: Taiwan Semiconductor Manufacturing Co., Ltd., Hsinchu (TW)

(72) Inventors: Tzuan-Horng Liu, Longtan Township (TW); An-Jhih Su, Taoyuan City (TW); Mill-Jer Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 334 days.

(21) Appl. No.: 18/450,738

(22) Filed: Aug. 16, 2023

(65) Prior Publication Data

US 2024/0413012 A1    Dec. 12, 2024

Related U.S. Application Data

(60) Provisional application No. 63/507,148, filed on Jun. 9, 2023.

(51) Int. Cl.
H01L 21/768 (2006.01)
H10P 50/00 (2026.01)
(Continued)

(52) U.S. Cl.
CPC ......... H10W 20/056 (2026.01); H10P 50/267 (2026.01); H10P 50/667 (2026.01); (Continued)

(58) Field of Classification Search
CPC ............. H01L 21/76877; H01L 21/308; H01L 21/32134; H01L 21/32136; H01L 21/76816; H01L 21/76831; H01L 21/76873; H01L 22/14; H01L 23/481; H01L 24/08; H01L 24/80; H01L 25/0652; H01L 24/16; H01L 24/32; H01L 24/48; H01L 24/73; H01L 25/105; H01L 25/16; H01L 2224/08148; H01L 2224/16148; H01L 2224/16225; H01L 2224/32145; (Continued)

(56) References Cited

U.S. PATENT DOCUMENTS 8,993,380 B2    3/2015  Hou et al.
9,281,254 B2    3/2016  Yu et al.
(Continued)

FOREIGN PATENT DOCUMENTS

KR    20170022825 A    3/2017
TW    202113382 A    4/2021

*Primary Examiner* — Karen Kusumakar
(74) *Attorney, Agent, or Firm* — Slater Matsil, LLP

(57)    ABSTRACT

An embodiment is a method including a first dielectric layer over a first substrate, the first dielectric layer having a first metallization pattern therein. The method also includes forming a second dielectric layer over the first dielectric layer and the first metallization pattern. The method also includes forming a sacrificial pad over and extending into the second dielectric layer, the sacrificial pad being electrically coupled to a first conductive feature in the first metallization pattern. The method also includes performing a circuit probe test on the sacrificial pad. The method also includes after performing the circuit probe test, performing an etch process, the etch process removing the sacrificial pad.

20 Claims, 50 Drawing Sheets

(51) Int. Cl.

| | |
|---|---|
| *H10P 50/26* | (2026.01) |
| *H10P 50/66* | (2026.01) |
| *H10P 74/20* | (2026.01) |
| *H10W 20/00* | (2026.01) |
| *H10W 20/20* | (2026.01) |
| *H10W 90/00* | (2026.01) |
| *H10W 74/15* | (2026.01) |
| *H10W 80/00* | (2026.01) |

(52) U.S. Cl.
CPC .......... *H10P 50/691* (2026.01); *H10P 74/207* (2026.01); *H10W 20/043* (2026.01); *H10W 20/076* (2026.01); *H10W 20/089* (2026.01); *H10W 20/20* (2026.01); *H10W 90/00* (2026.01); *H10W 74/15* (2026.01); *H10W 80/312* (2026.01); *H10W 80/327* (2026.01); *H10W 90/722* (2026.01); *H10W 90/724* (2026.01); *H10W 90/732* (2026.01); *H10W 90/754* (2026.01); *H10W 90/792* (2026.01)

(58) Field of Classification Search
CPC . H01L 2224/48229; H01L 2224/73204; H01L 2224/80895; H01L 2224/80896; H01L 2224/0346; H01L 2224/0347; H01L 2224/0361; H01L 2224/08145; H01L 21/76898; H01L 22/32; H01L 24/03; H01L 24/05; H01L 25/0657; H01L 21/4857; H01L 23/49822; H01L 23/49838; H01L 23/5226; H01L 23/5283; H01L 24/04; H01L 24/81; H01L 2224/0231; H01L 2224/0233; H01L 2224/02381; H01L 2224/81001; G01R 31/2886

See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,633,917 B2 | 4/2017 | Tsai et al. | |
| 9,666,502 B2 | 5/2017 | Chen et al. | |
| 9,735,131 B2 | 8/2017 | Su et al. | |
| 11,293,974 B2 | 4/2022 | Chen et al. | |
| 2022/0028748 A1* | 1/2022 | Liu | H01L 22/20 |
| 2023/0117629 A1* | 4/2023 | Maruyama | H01L 24/08 |
| | | | 257/444 |

* cited by examiner

SEMICONDUCTOR DEVICE AND METHOD

PRIORITY CLAIM AND CROSS-REFERENCE

This application claims the benefit of U.S. Provisional Application No. 63/507,148 filed on Jun. 9, 2023 entitled "Innovative Sacrificial Pad Design for 3D Die Stacking," which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
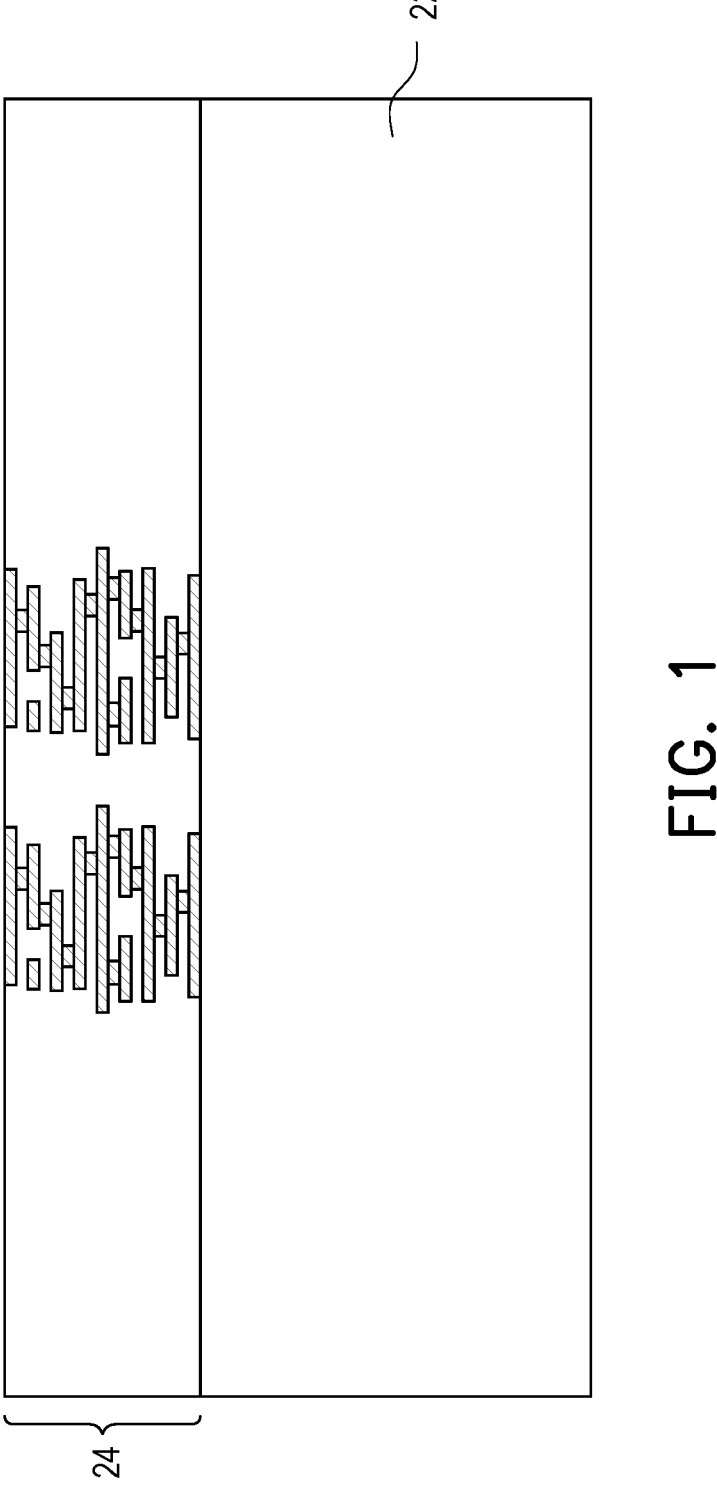
FIGS. 1-14, 15A, 15B, 15C, 15D, 15E, and 16-18, 19A, 19B, and 20 illustrate cross-sectional views and plan views of intermediate stages in the formation of a die according to embodiments.
Figure 1:

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely an interconnect structure with a sacrificial probe pad that can be integrated into a device (e.g., a chip or die) or a package (e.g., system on integrated chip (SoIC), a chip-on-wafer (CoW) package structure, or a wafer-on-wafer (WoW) package structure). The interconnect structure includes sacrificial probe pad to allow intermediate testing of the chip or device for known good die integration while increasing the area for interconnect routing. In some embodiments, the sacrificial probe pad is formed of a material that can be removed after the testing is performed so that underlying metallization layers can be reached by conductive vias. In some embodiments, the same metallization feature or metal pad is that the sacrificial probe pad is formed on subsequently has a conductive via formed on. Further, in some embodiments, the subsequent conductive via is formed in the same opening that the sacrificial probe pad was formed in. In conventional structures, the probe pad is not removable, and the underlying area is not reachable by conductive vias such that the underlying area is not used for interconnect routing but is unutilized space of the interconnect. By having the probe pad be removable, the routing area of the interconnect can be increased.

Further, the teachings of this disclosure are applicable to any interconnect structure with a removable probe pad that can increase the routing area of the interconnect and/or redistribution structure. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIGS. 1 through 20 illustrate cross-sectional views and a plan view of intermediate stages in the formation of a die in accordance with some embodiments.

FIG. 1 illustrates a cross-sectional view of an integrated circuit die 20 in accordance with some embodiments. The integrated circuit die 20 will be packaged in subsequent processing to form an integrated circuit package. The integrated circuit die 20 may be a logic die (e.g., central processing unit (CPU), graphics processing unit (GPU), system-on-a-chip (SoC), application processor (AP), micro-controller, etc.), a memory die (e.g., dynamic random access memory (DRAM) die, static random access memory (SRAM) die, etc.), a power management die (e.g., power management integrated circuit (PMIC) die), a radio fre-quency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 20 may be formed in a wafer, which may include different device regions that are singu-lated in subsequent steps to form a plurality of integrated circuit dies. The integrated circuit die 20 may be processed according to applicable manufacturing processes to form integrated circuits. For example, the integrated circuit die 20 includes a substrate 22, such as silicon, doped or undoped, or an active layer of a semiconductor-on-insulator (SOI) substrate. The substrate 22 may include other semiconductor materials, such as germanium; a compound semiconductor including silicon carbide, gallium arsenic, gallium phos-phide, indium phosphide, indium arsenide, and/or indium antimonide; an alloy semiconductor including SiGe, GaAsP, AlInAs, AlGaAs, GaInAs, GaInP, and/or GaInAsP; or com-binations thereof. Other substrates, such as multi-layered or gradient substrates, may also be used. The substrate 22 has an active surface (e.g., the surface facing upwards in FIG. 1), sometimes called a front side, and an inactive surface (e.g., the surface facing downwards in FIG. 1), sometimes called a back side.

Devices (not shown) may be formed at the front surface of the substrate 22. The devices may be active devices (e.g., transistors, diodes, etc.), capacitors, resistors, the like, or a combination thereof. An inter-layer dielectric (ILD) (not separately illustrated) is over the front surface of the sub-strate 22. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), Undoped Silicate Glass (USG), or the like.

Conductive plugs (not separately illustrated) extend through the ILD to electrically and physically couple the devices. For example, when the devices are transistors, the conductive plugs may couple the gates and source/drain regions of the transistors. The conductive plugs may be formed of tungsten, cobalt, nickel, copper, silver, gold, aluminum, the like, or combinations thereof. An intercon-nect structure 24 is over the ILD and the conductive plugs. The interconnect structure 24 interconnects the devices to form an integrated circuit. The interconnect structure 24 may be formed by, for example, metallization patterns in dielec-tric layers on the ILD. The metallization patterns include metal lines and vias formed in one or more low-k dielectric layers. The metallization patterns of the interconnect struc-ture 24 are electrically coupled to the devices by the con-ductive plugs. The metallization patterns may be formed using any suitable process, such as a single damascene process, a dual damascene process, a plating process, com-binations thereof, or the like.

Figure 2:
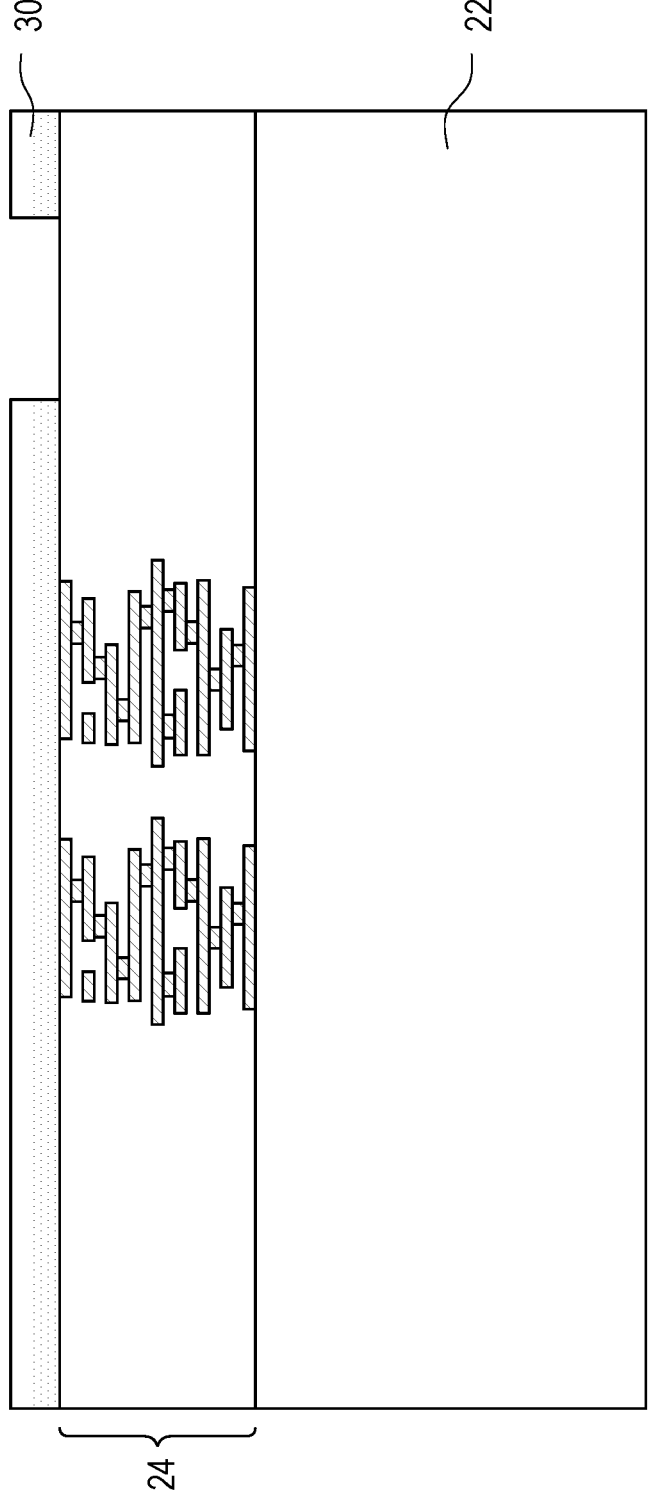

After forming the interconnect structure 24, as shown in FIG. 2, a mask 30 is formed and patterned on the intercon-nect structure 23. In some embodiments, the mask 30 is a photoresist and may be formed by spin coating or the like and may be exposed to light for patterning. The pattern of the photoresist corresponds to an upper portion of the subsequently formed through substrate via (TSV) 44 (see, e.g., FIG. 6). The patterning forms at least one opening through the photoresist 30 to expose the interconnect structure 24. In some embodiments, a stop layer (not shown), such as a chemical mechanical polishing (CMP) stop layer is deposited over a top surface of the interconnect structure 24 before the mask 30. The CMP stop layer may be used to prevent a subsequent CMP process from removing too much material by being resistant to the subsequent CMP process and/or by providing a detectable stopping point for the subsequent CMP process. In some embodiments, the CMP stop layer may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, chemical vapor deposition (CVD), plasma-enhanced CVD (PECVD), atomic layer deposition (ALD), the like, or a combination thereof.

Figure 3:
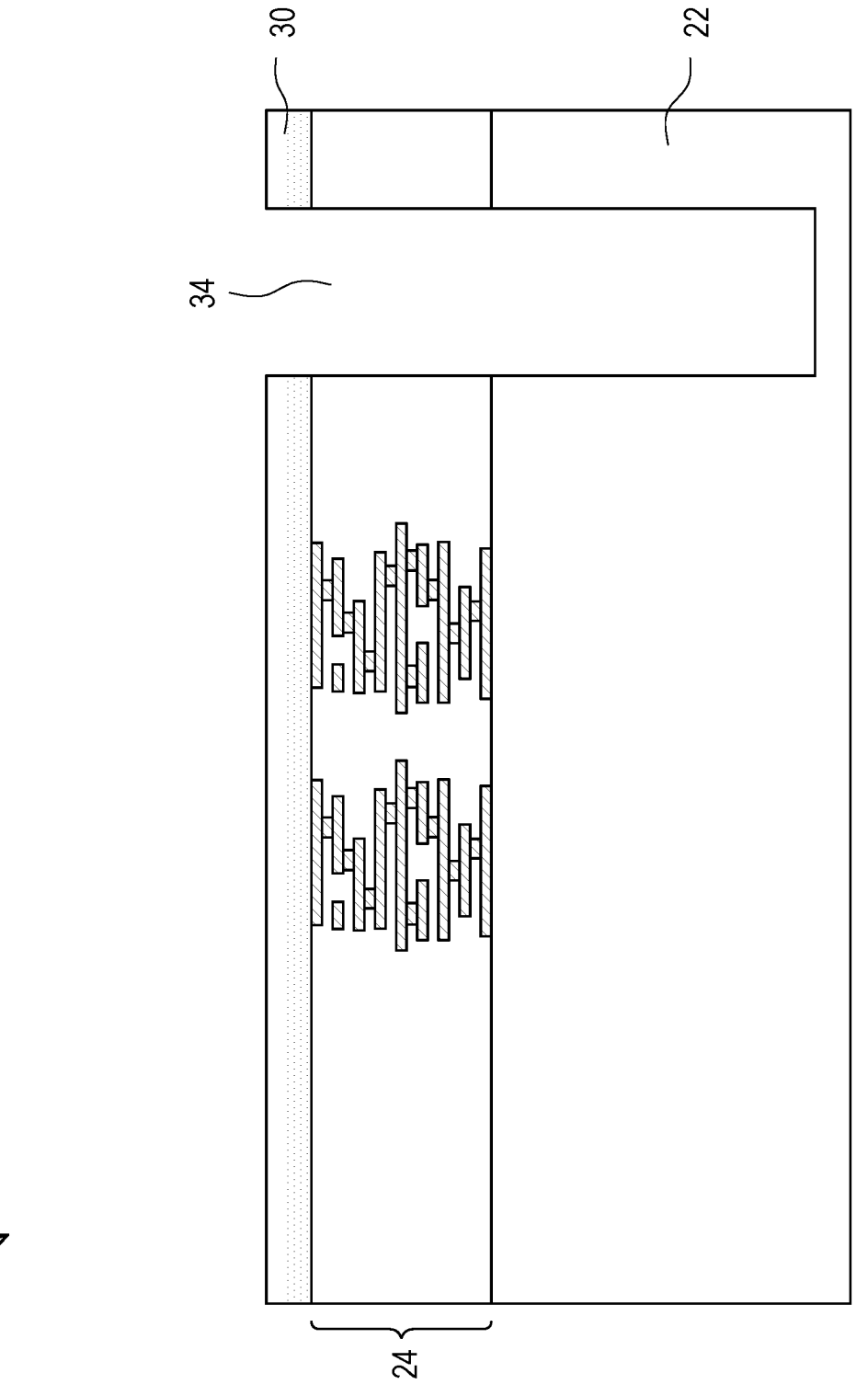

In FIG. 3, the remaining mask 30 is used as a mask during an etching process to remove exposed and underlying por-tions of the dielectric layer(s) of the interconnect structure 24 and the substrate 22. A single etch process may be used to etch an opening 34 in the interconnect structure 24 and the substrate 22 or a first etch process may be used to etch the interconnect structure 24 and a second etch process may be used to etch the substrate 22. In some embodiments, the opening 34 is formed with a plasma dry etch process, a reactive ion etch (RIE) process, such as a deep RIE (DRIE) process. In some embodiments, the DRIE process includes etch cycle(s) and passivation cycle(s) with the etch cycle(s) using, for example, $SF_6$, and the passivation cycle(s) using, for example, $C_4F_8$. The utilization of a DRIE process with the passivation cycle(s) and the etch cycle(s) enables a highly anisotropic etching process. In some embodiments, the etch process(es) may any acceptable etching process, such as by wet or dry etching.

Figure 4:
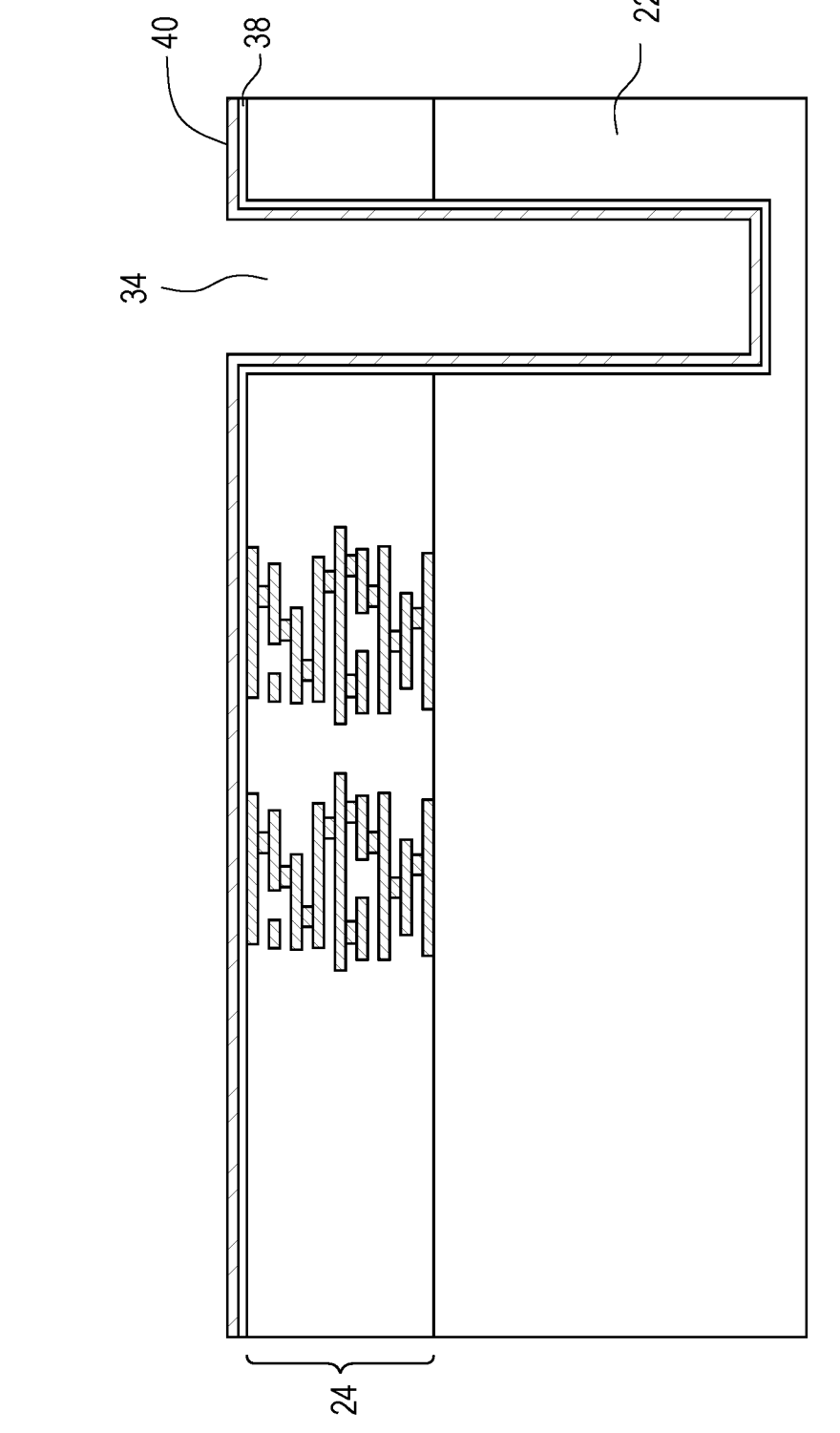

As illustrated in FIG. 4, after forming the opening 34, the photoresist 30 is removed. The photoresist 30 may be removed by an acceptable ashing or stripping process, such as using an oxygen plasma or the like.

Further in FIG. 4, a liner layer 38 is conformally deposited on the interconnect structure 24 and on the bottom surface and sidewalls of the opening 34. In some embodiments, the liner layer 38 includes one or more layers of dielectric materials and may be used to physically and electrically isolate the subsequently formed through vias from the substrate 22. Suitable dielectric materials may include oxides (such as silicon oxide, aluminum oxide, or the like), nitrides (such as SiN, or the like), oxynitrides (such as SiON, or the like), combinations thereof, or the like. The liner layer 38 may be formed using CVD, PECVD, ALD, the like, or a combination thereof.

In a subsequent step, as shown in FIG. 4, a seed layer 40 is formed over liner layer 38. In some embodiments, the seed layer 40 is a metal layer, which may be a single layer or a composite layer comprising a plurality of sub-layers formed of different materials. In some embodiments, the seed layer 40 comprises a titanium layer and a copper layer over the titanium layer. The seed layer may be formed using, for example, physical vapor deposition (PVD) or the like. In some embodiments, a barrier layer (not shown) may be formed on the liner layer 38 prior to forming the seed layer 40. The barrier layer may comprise Ti, TiN, the like, or a combination thereof.

Figure 5:
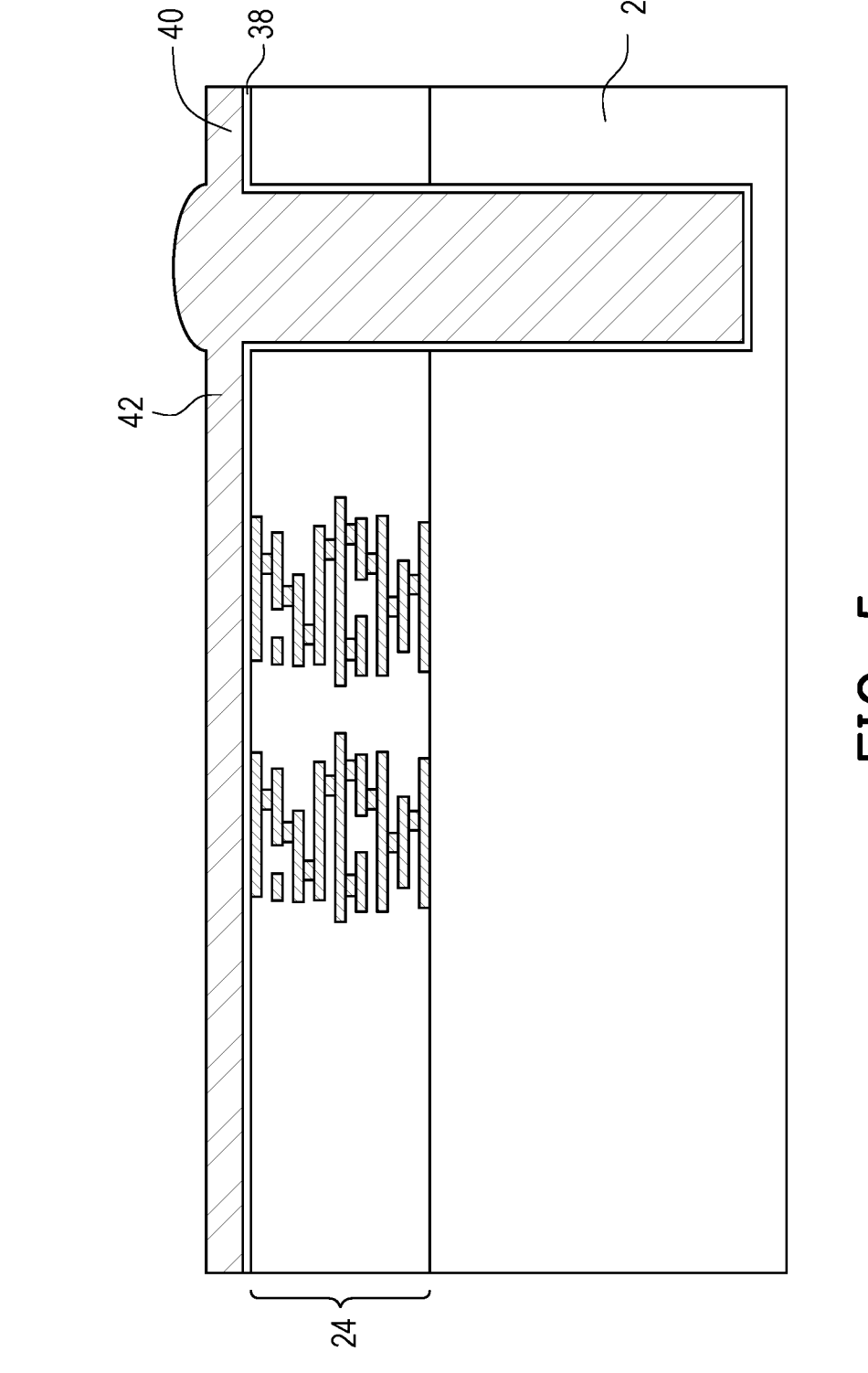

In FIG. 5, a conductive material 42 is formed on the seed layer 40 and fills the opening 34. The conductive material 42 may be formed by plating, such as electroplating including electrochemical plating, electroless plating, or the like. The conductive material may comprise a metal, like copper, titanium, tungsten, aluminum, or the like.

After the conductive material 42 is formed, an anneal process is then performed. The anneal process may be performed to prevent subsequent extrusion of the conductive material of the TSV 44 (sometime referred to as TSV pumping). The TSV pumping is caused by a coefficient of thermal expansion (CTE) mismatch between the conductive material 42 and the substrate 22 and can cause damage to structures (e.g., metallization patterns) over the TSV.

Figure 6:
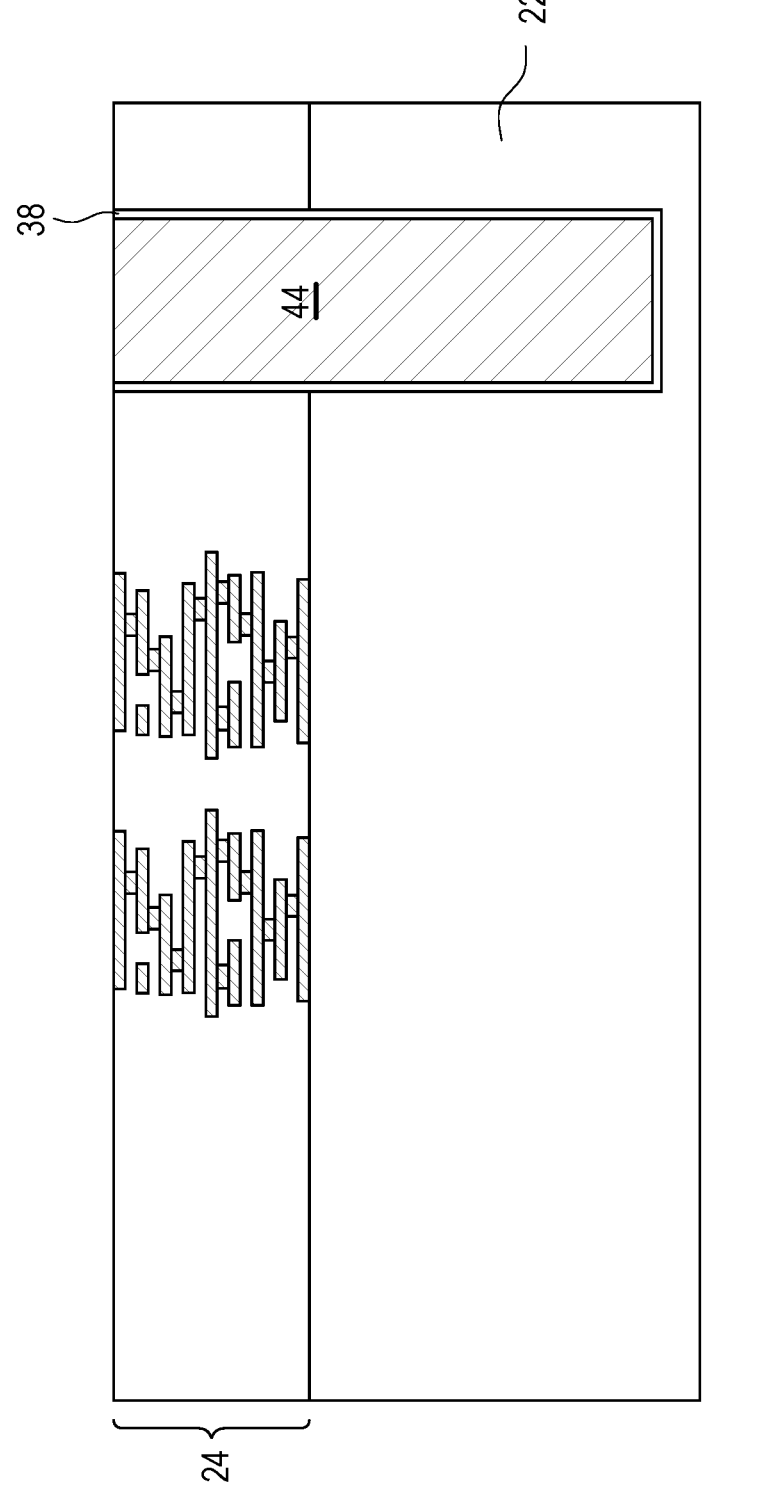

Following the anneal process, a planarization process is performed to remove portions of the conductive material 42, the seed layer 40, and the liner layer 38 outside the openings 34 to form a TSV 44 as illustrated in FIG. 6. Top surfaces of the TSV 44 and the topmost dielectric layer of the interconnect structure 24 are coplanar after the planarization process within process variations. The planarization process may be, for example, a chemical-mechanical polish (CMP), a grinding process, or the like. In some embodiments, the upper portion of the TSV 44 (formed in the interconnect structure 24) has a greater width than the lower portion of the TSV 44 (formed in the substrate 22). In some embodiments, the width of the TSV 44 is constant through the interconnect 24 and the substrate 22.

Figure 7:
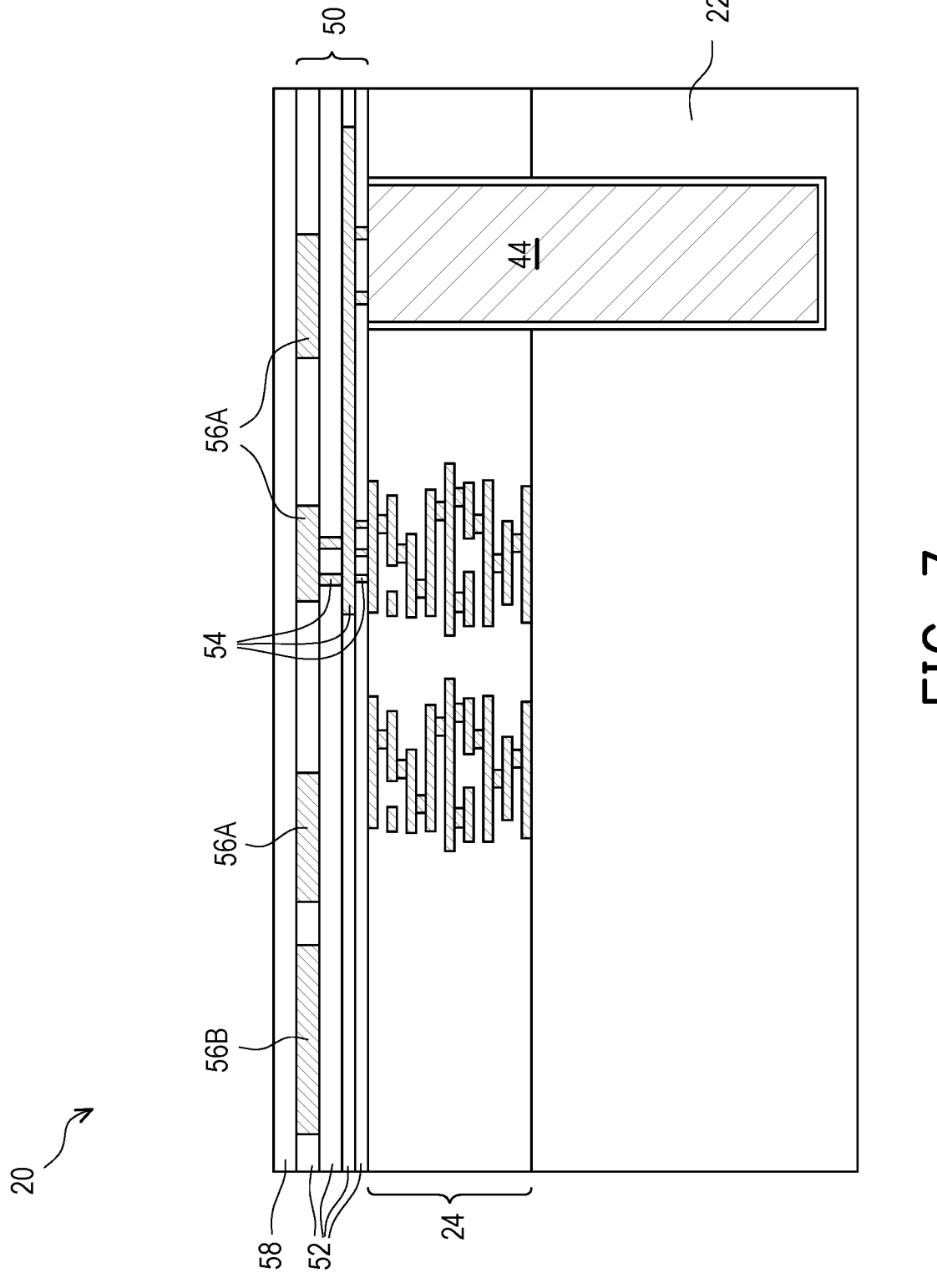
Figure 14:
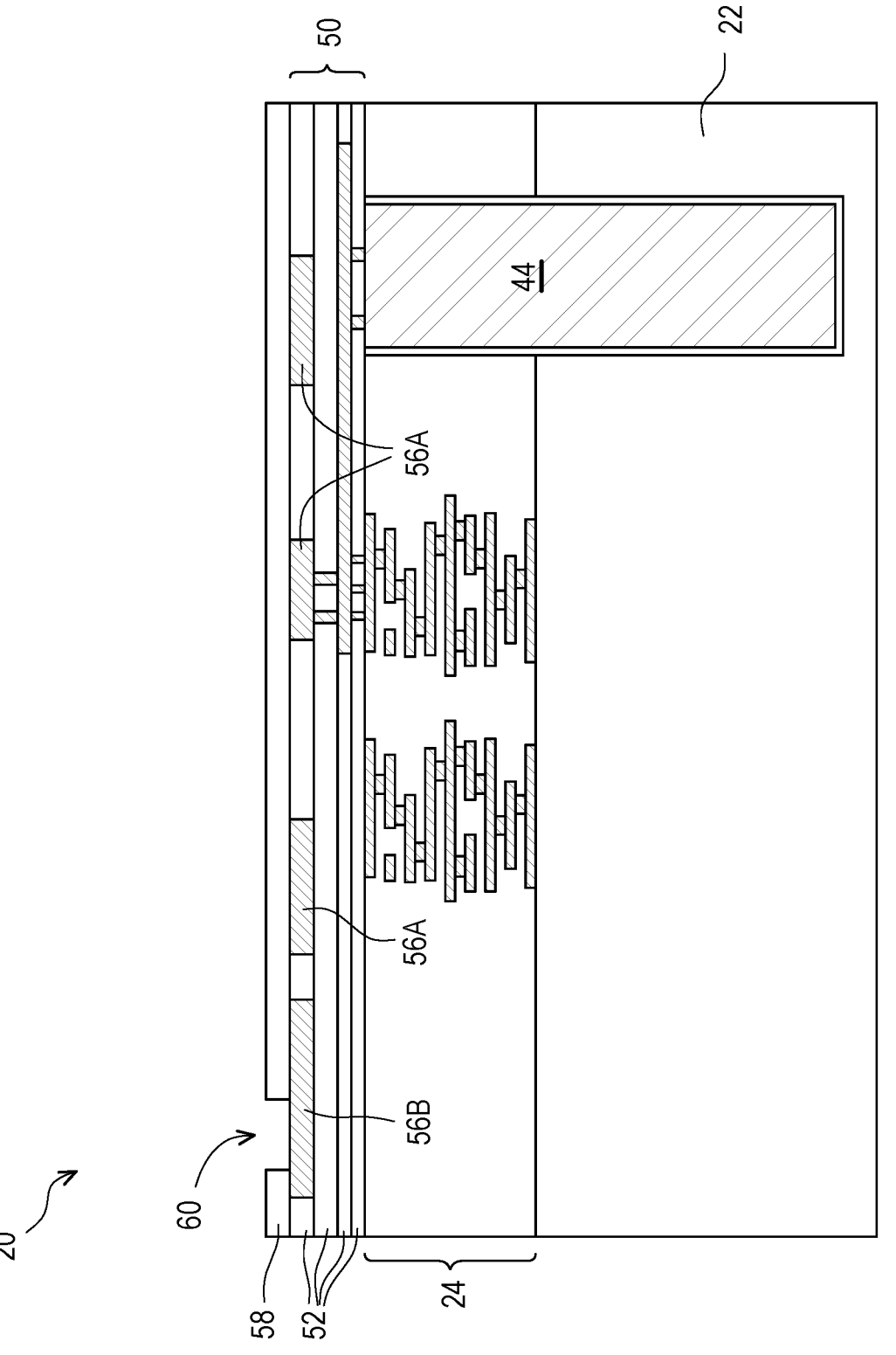

Referring to FIG. 7, an interconnect structure 50 is formed over the structure of FIG. 6. The interconnect structure 50 includes dielectric layers 52, metallization patterns and vias 54, and top metal 56 (including top metal 56A and 56B). More or fewer dielectric layers and metallization patterns and vias may be formed than is shown in FIG. 14. The interconnect structure 50 is connected to the interconnect structure 24 and TSV 44 by metallization patterns and vias formed in the dielectric layer(s) 52. The metallization patterns and vias may be formed similar processes and materials as the interconnect structure 24 and the description is not repeated herein. In some embodiments, there are more than one layer of top metal 56, such as two top metal layers.

In some embodiments, the dielectric layers 52 are a same material as the dielectric layers of the interconnect structure 24, e.g., low-k dielectric. In other embodiments, the dielectric layers 52 are formed of a silicon-containing material (which may or may not include oxygen). For example, the dielectric layers 52 may include an oxide such as silicon oxide, a nitride such as silicon nitride, or the like.

The top metal 56 include a top metal 56A and top metal 56B. The top metal 56B are top metal structures that are going to be used for chip probe testing and have a probe pad formed directly over and connected to the top metal 56B. The top metal 56A are typical top metal structures and will not have a probe pad directly over and connected to them. Although, only a single top metal 56B is illustrated, the disclosure is not limited to this and structures that include more top metal 56B are within the scope of the disclosure. The top metal 56A and 56B are formed at the same time and by same process(es).

The metallization patterns and vias 54 and the top metal 56 may be formed using any suitable process, such as a single damascene process, a dual damascene process, a plating process, combinations thereof, or the like. An example of forming the metallization patterns and vias 54 and the top metal 56 by a damascene process includes etching dielectric layers 52 to form openings, depositing a conductive barrier layer into the openings, plating a metallic material such as copper or a copper alloy, and performing a planarization to remove the excess portions of the metallic material. In other embodiments, the formation of the dielectric layers 52, the metallization patterns and vias 54, and the top metal 56 may include forming the dielectric layer 52, patterning the dielectric layer 52 to form openings, forming a metal seed layer (not shown), forming a patterned plating mask (such as photoresist) to cover some portions of the metal seed layer, while leaving other portions exposed, plating the metallization patterns and vias 54 and the top metal 56, removing the plating mask, and etching undesirable portions of the metal seed layer. The metallization patterns and vias 54 and top metal 56 may be made of tungsten, cobalt, nickel, copper, silver, gold, aluminum, the like, or combinations thereof. In some embodiments, the top metal 56 is thicker than the metallization patterns 54, such as three times thicker, five times thicker, or any suitable thickness ratio between the metallization layers.

FIG. 7 further illustrates the formation of a passivation layer 58 over the dielectric layers 52 and the top metal 56. In some embodiments, the passivation layer 58 is formed of a same material as the dielectric layers 52. In some embodiments, the passivation layer 58 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The passivation layer 58 may be formed, for example, by spin coating, lamination, chemical vapor deposition (CVD), or the like. The passivation layer 58 may have an upper surface that is level within process variations.

Although FIG. 7 illustrates the TSV 44 directly connected to the interconnect structure 50, in some embodiments, the TSV may be directly connected to the interconnect 24.

Figure 8:
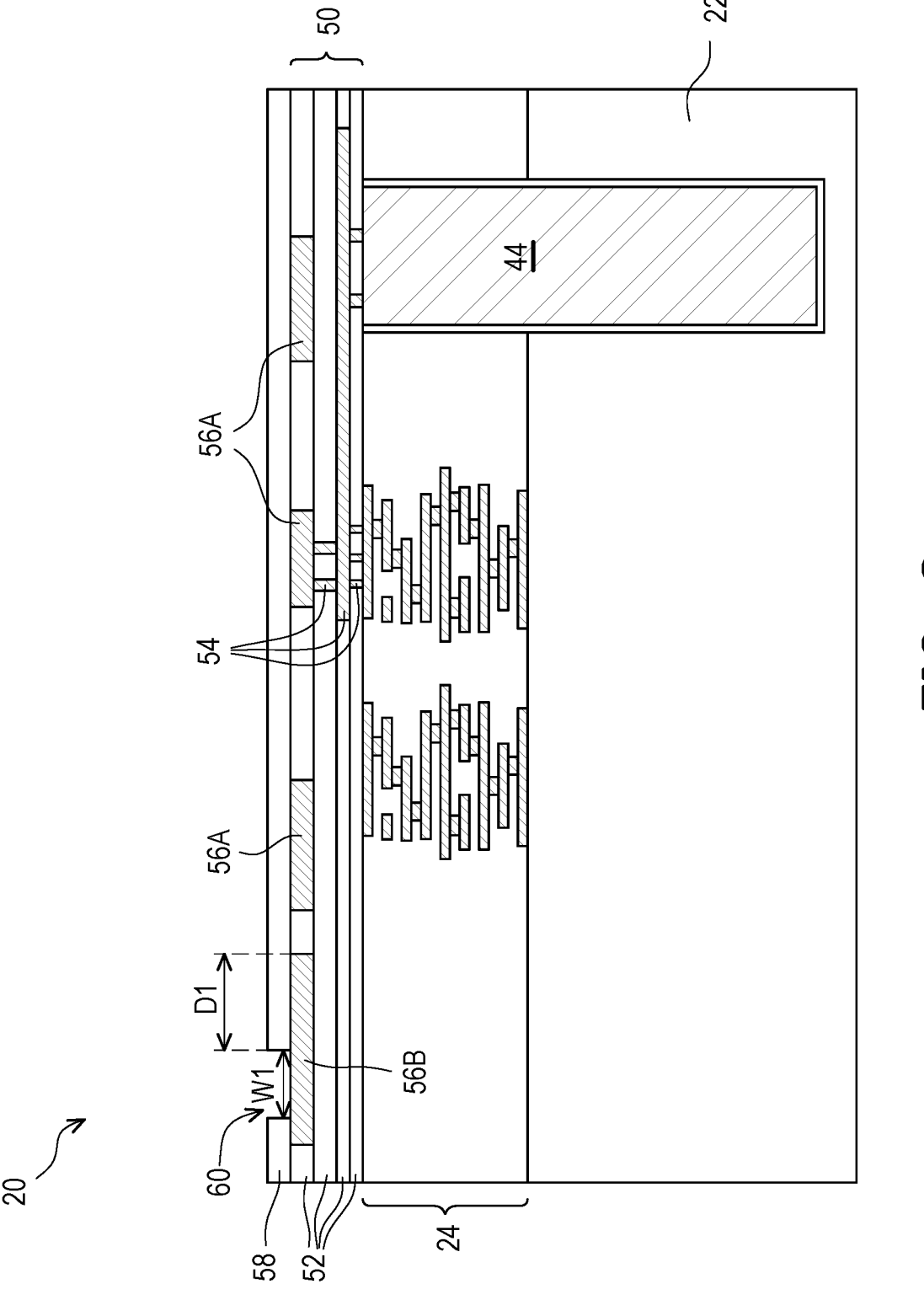

FIGS. 8 through 14 illustrate a formation and removal process of a sacrificial probe pad 68. In FIG. 8, an opening 60 is formed through the passivation layer 58 to expose portions of the top metal 56B. In some embodiments, the opening 60 has a width W1 (e.g., width of opening in passivation layer 58) in a range from 1 μm to 50 μm. The opening 60 may be formed by any suitable patterning step, such as an etching step including a mask such as a photoresist (not shown). In some embodiments, a nearest edge of the opening 60 is formed a distance D1 from a nearest edge of the top metal 56B. In some embodiments, the distance D1 may be as small as 2 μm. In some embodiments, the distance D1 may be in a range from 2 m to 30 μm.

Figure 9:
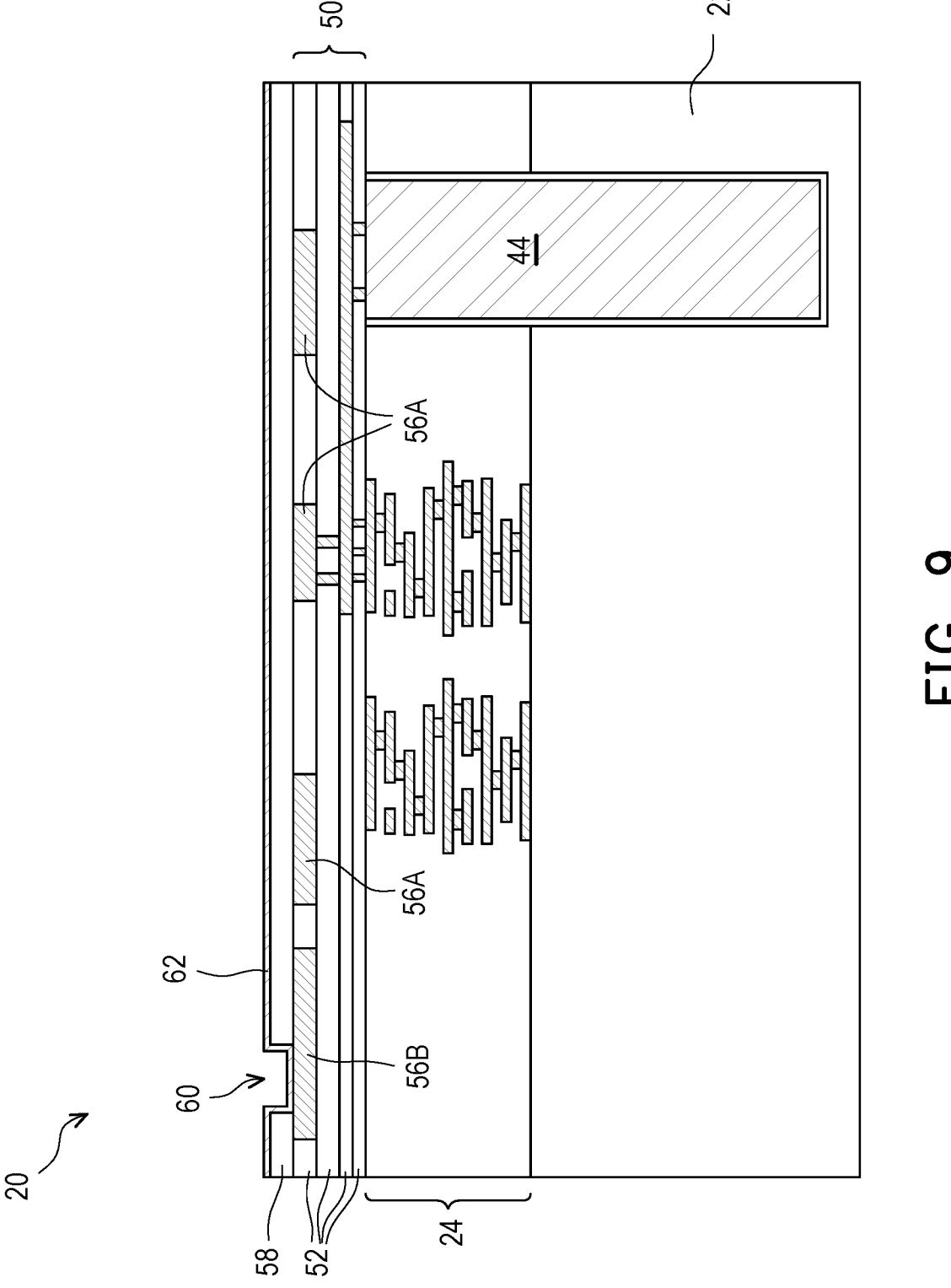

In FIG. 9, a seed layer 62 is formed over the passivation layer 58, in the openings 60, and on exposed portions of the top metal 56B in the opening 60. The materials and formation processes of the seed layer 62 may be similar to the seed layer 40 described above and the description is not repeated herein. In some embodiments, the seed layer is formed to have a thickness in a range from 0.1 μm to 0.5 μm. In some embodiments, a barrier layer (not shown) may be formed on the passivation layer 58 and in the opening 60 prior to forming the seed layer 40. The barrier layer may comprise Ti, TiN, the like, or a combination thereof. In some embodiments, the barrier layer is formed to have a thickness in a range from 0.3 μm to 3 μm. In some embodiments, the barrier layer may also function as an etch stop layer when the probe pad is removed.

Figure 10:
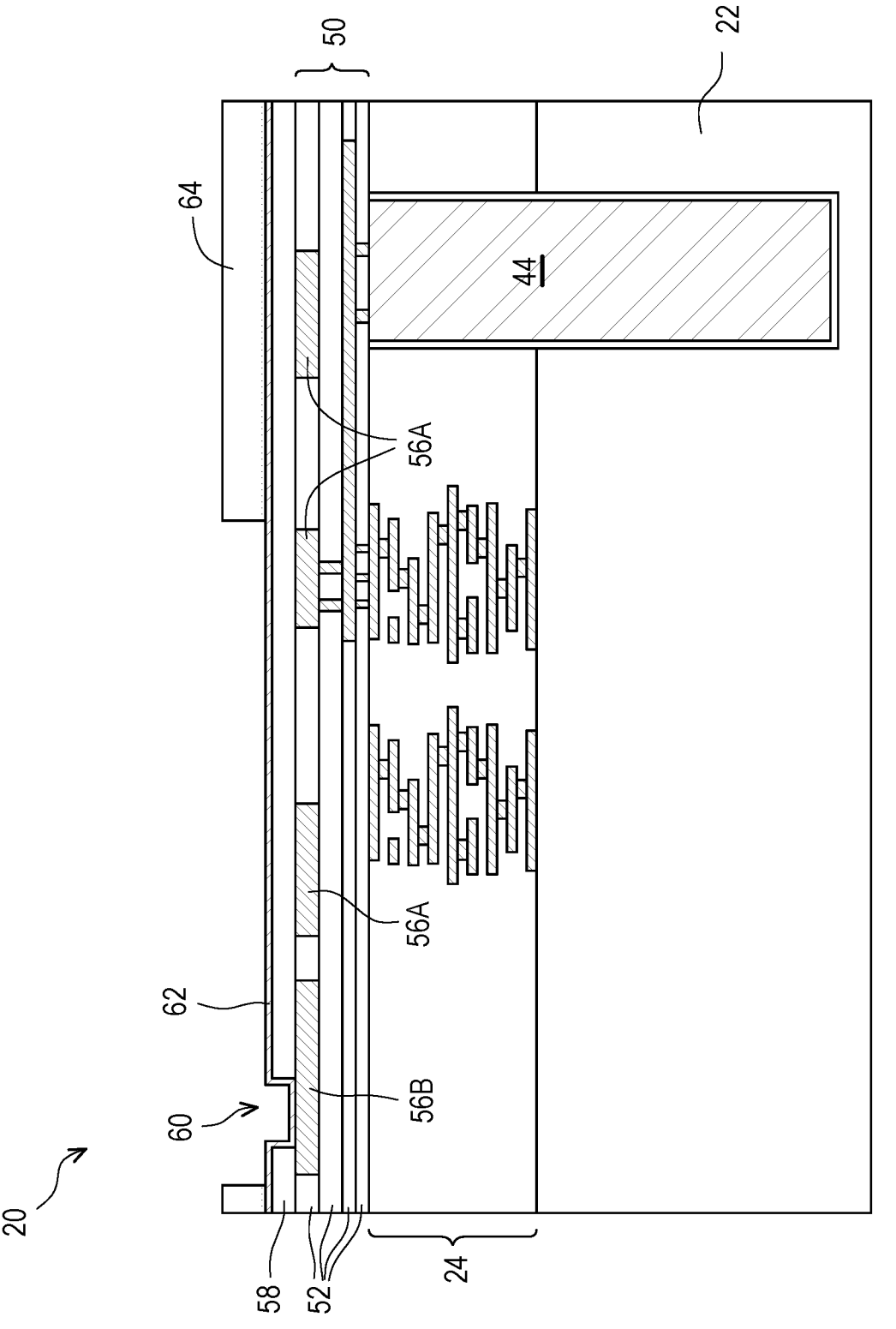

In FIG. 10, a photoresist 64 is formed and patterned over the seed layer 62. These steps are similar to the steps illustrated and described above, and the descriptions are not repeated herein.

Figure 11:
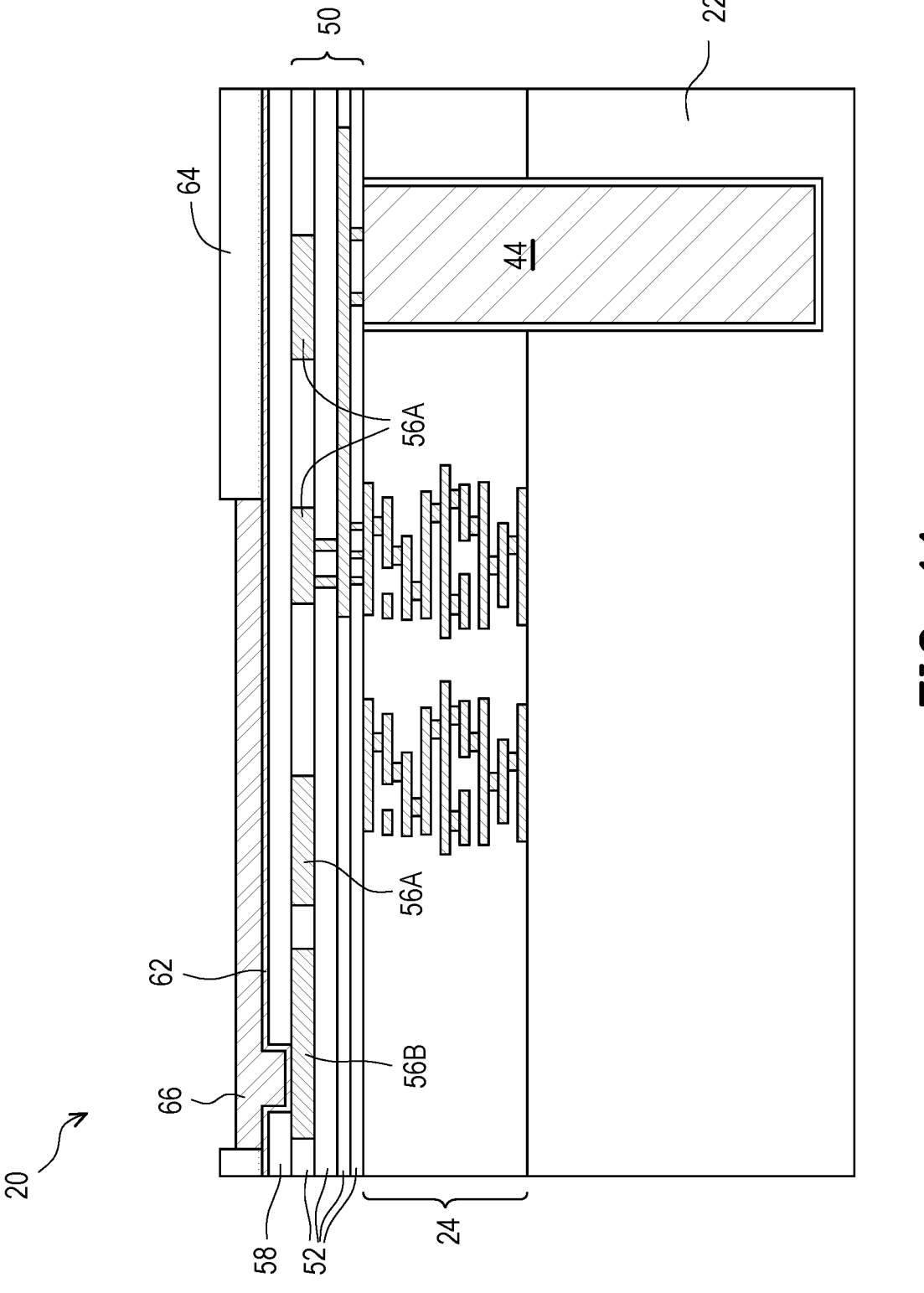

In FIG. 11, a conductive material 66 is formed on the exposed seed layer 62 in the opening of the photoresist 64. In some embodiments, the conductive material 66 is a solder (tin) material, such as nickel, aluminum, the like, or a combination thereof. The conductive material 66 may be formed by a plating process, such as electrochemical plating, electroless plating, or the like. As illustrated in FIG. 11, the probe pad 68 may overlap with one or more of the top metals 56A (e.g., top metal structures 56 without a probe pad 68 directly over and connected to them).

Figure 12:
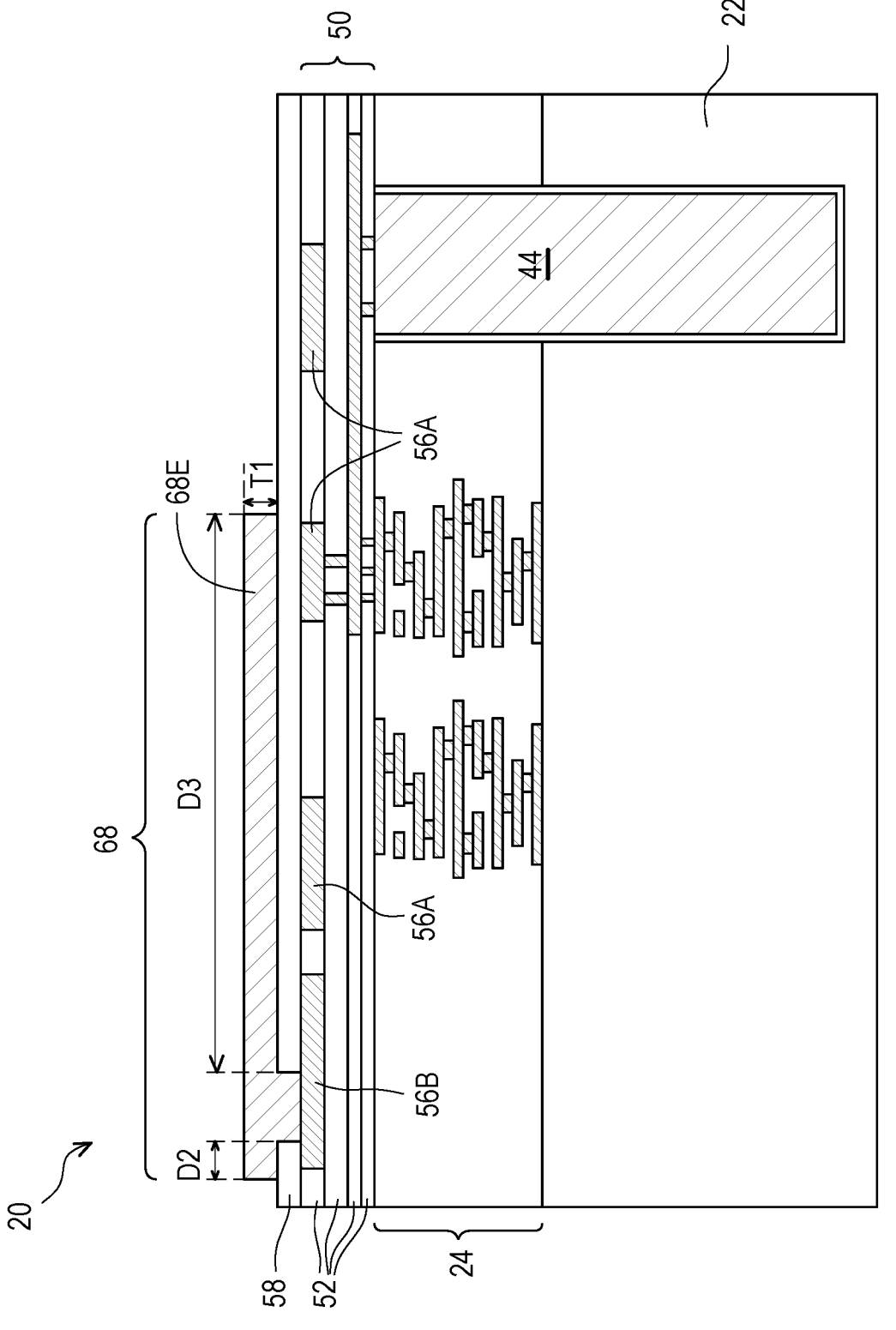
Figure 13:
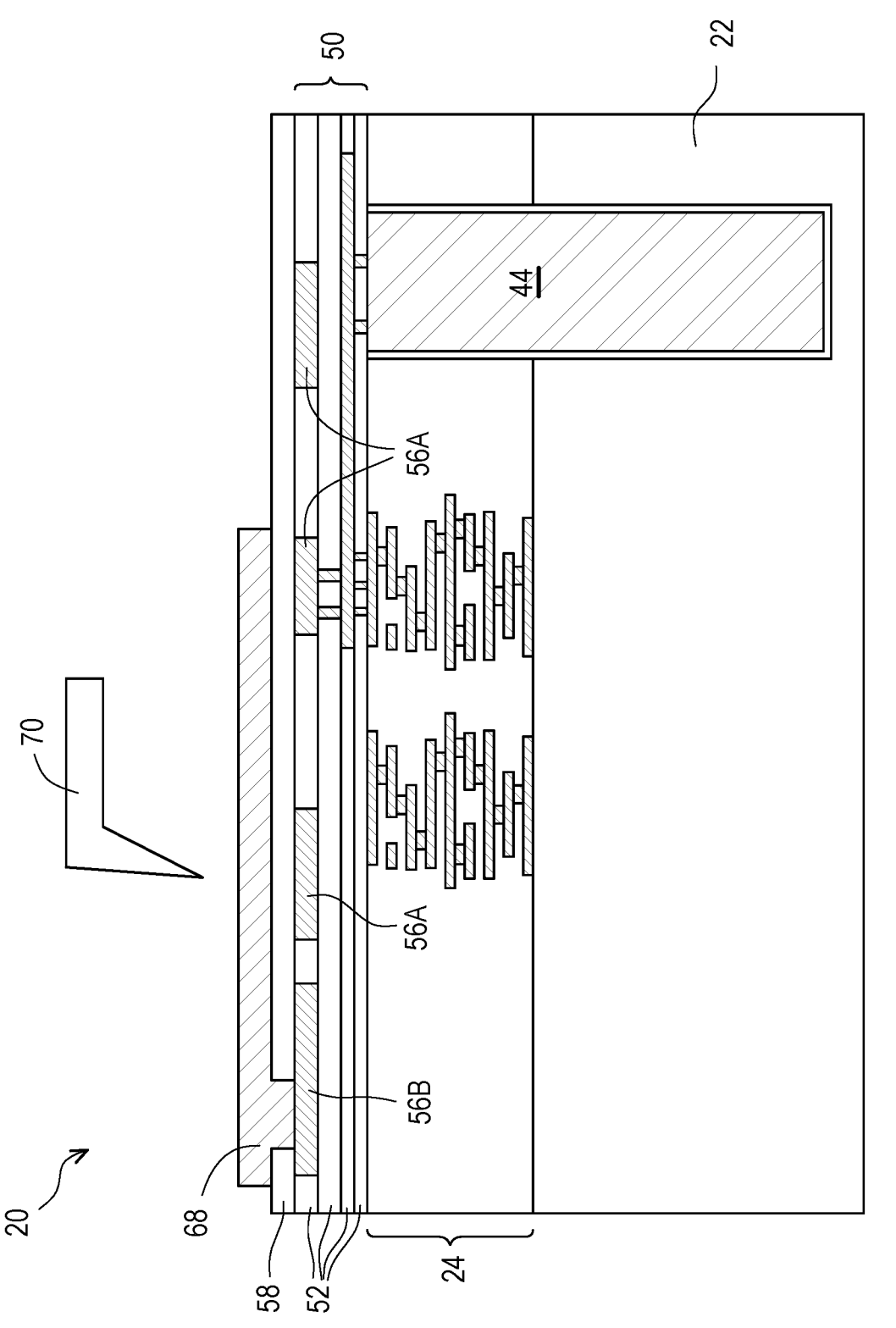

In FIG. 12, the photoresist 64 and underlying portion of the seed layer 62 are removed to form a probe pad 68. In some embodiments, the probe pad 68 has a planar top surface within process variations. The photoresist 64 may be removed by an acceptable ashing or stripping process, such as using an oxygen plasma or the like. The portions of the seed layer 62 may be removed by an acceptable etching process. FIGS. 12 and 13 do not separately illustrate the remaining portion of the seed layer 62 underlying the conductive material 66.

In some embodiments, the probe pad 68 is asymmetric in a plan view and has an extension portion 68E extending along a top surface of the passivation layer 58. In the illustrated embodiment of FIG. 12, the probe pad 68 has an extension portion 68E that extends toward the right side of FIG. 12 and a shorter, non-extension portion that extends toward the left side of FIG. 12. This is merely one example and the extension portion 68E can extend in any direction and in multiple directions.

In some embodiments, the probe pad 68 has a thickness T1. In some embodiments, the thickness T1 is in a range from 1 μm to 10 μm. In some embodiments, the shorter, non-extension portion of the probe pad 68 extends a distance D2. In some embodiments, the distance D2 can be as small as 5 μm. In some embodiments, the distance D2 can be in a range from 5 μm to 30 μm. In some embodiments, the extension portion 68E of the probe pad 68 extends a distance D3. In some embodiments, the distance D3 is in a range from 20 m to 100 μm.

In FIG. 13, acceptance testing, such as circuit probe testing, is performed on the integrated circuit die 20 to ascertain whether the integrated circuit die 20 is a known good die (KGD). In some embodiments, the acceptance testing is performed on the integrated circuit die 20 before singulation while it is in wafer form. In some embodiments, the acceptance testing is performed on integrated circuit die 20 after singulation when it is in die form. The integrated circuit die 20 may be tested using one or more probes 70. The probes 70 are physically and electrically coupled to the probe pads 68. Although not specifically illustrated, more than one probe 70 (e.g., two probes 70) may be coupled to corresponding sacrificial pads 68 (e.g., two probe pads 68). Integrated circuit dies 20 which fail the circuit probe testing may undergo rework steps and/or are not subsequently processed and packaged. Only integrated circuit dies 20 which can pass the circuit probe testing (e.g., KGDs) undergo subsequent processing and packaging. The testing may include providing power and ground voltages to sacrificial pads 68 in order to test the functionality of the integrated circuit die 20 (e.g., the integrated circuit devices and interconnect structure 24 and 50 within). In some embodiments, the circuit probe testing may include testing for known open or short circuits that may be expected based on the design of the integrated circuits within the integrated circuit die 20.

FIG. 14 illustrates the removal of the probe pad 68 from the integrated circuit die 20. In some embodiments, the probe pad 68 is removed by one or more etch process. In some embodiments, the conductive material 66 is removed with a first etching process, the seed layer 62 is removed by a second etching process, and the barrier layer, if present, is removed by a third etching process. In some embodiments, the etch processes may be any acceptable solder etching process, such as by wet or dry etching. The removal of the probe pad 68 re-exposes the top metal 56B through the opening 60.

Figures 15A, 15B, 15C:
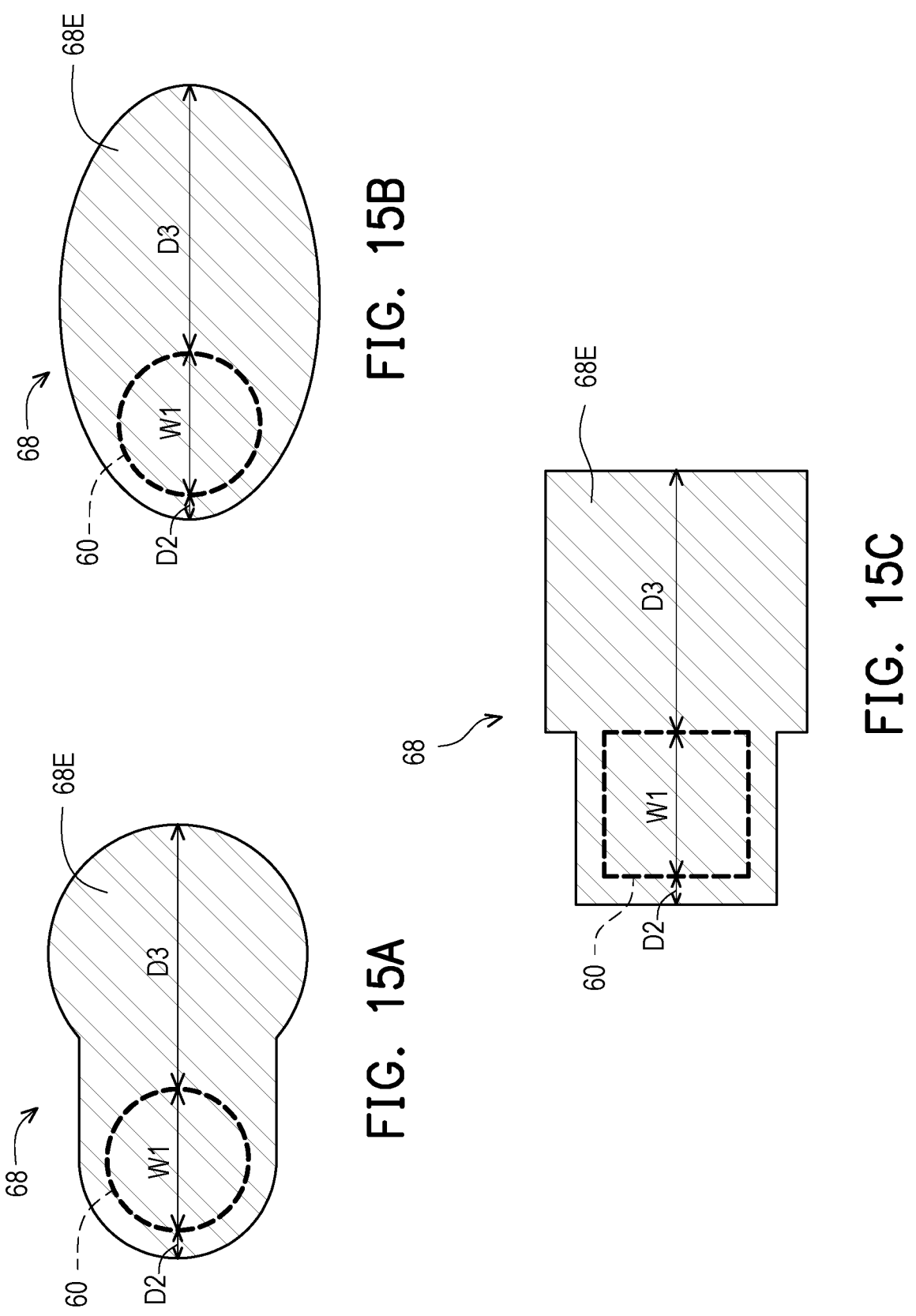
Figure 15E:
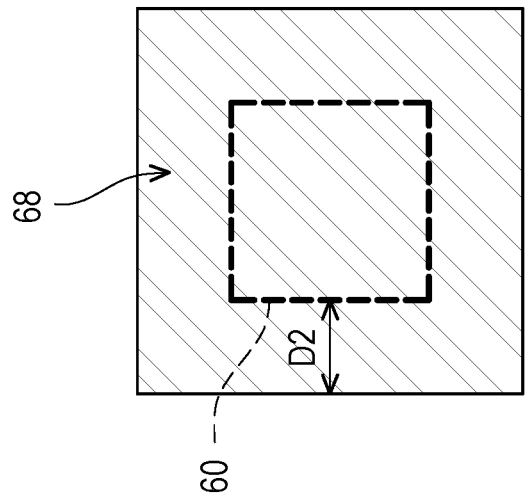
Figure 15D:
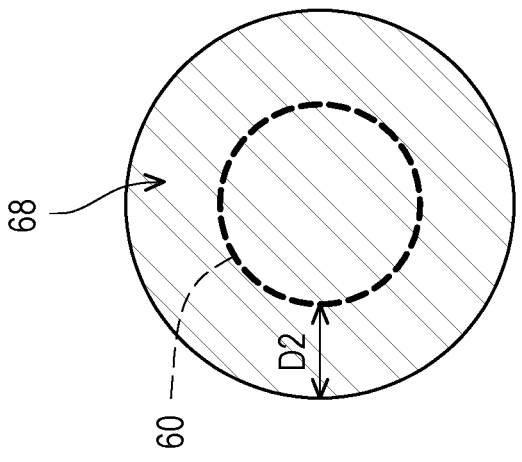

FIGS. 15A-15E illustrate plan views of the probe pad 68 in accordance with some embodiments. The probe pad 68 in a plan view can be various shapes and configurations, and these Figures illustrate some exemplary shapes/configurations but the disclosure is not limited to these shapes/configurations. FIG. 15A illustrates a probe pad 68 with a circular or rounded extension portion 68E extending from the opening 6o. FIG. 15B illustrates a probe pad 68 where the probe pad 68 is a circular or oval shape including the extension portion 68E and the non-extension portion of the probe pad 68. FIG. 15C illustrates a probe pad 68 with a square or rectangular extension portion 68E extending from a square or rectangular non-extension portion. FIG. 15D illustrates a probe pad 68 with a circular or rounded shape and without an extension portion 68E. FIG. 15E illustrates a probe pad 68 with a square or rectangular shape and without an extension portion 68E.

In FIGS. 15A, 15B, and 15D, the opening 6o has a circular or rounded shape in a plan view. In FIGS. 15C and 15E, the opening 6o has a square or rectangular shape in a plan view.

In some embodiments, the area in the plan view of the top metal 56B is more than 2000 times smaller than the area in the plan view of the sacrificial probe pad 68. In some embodiments, the sacrificial probe pad 68 has a size of 50 μm by 50 μm and the top metal 56B has a size of 1 μm by 1 μm. Thus, in those embodiments, the area in the plan view of the top metal 56B is 2500 times smaller than the area in the plan view of the sacrificial probe pad 68. By having a removable probe pad, embodiments of the present disclosure allow for interconnect routing, formation of bond vias and bond pads, and the like in the area that was previously occupied by the probe pad 68 (see, e.g., FIGS. 13, 19A, and 19B).

Figure 16:
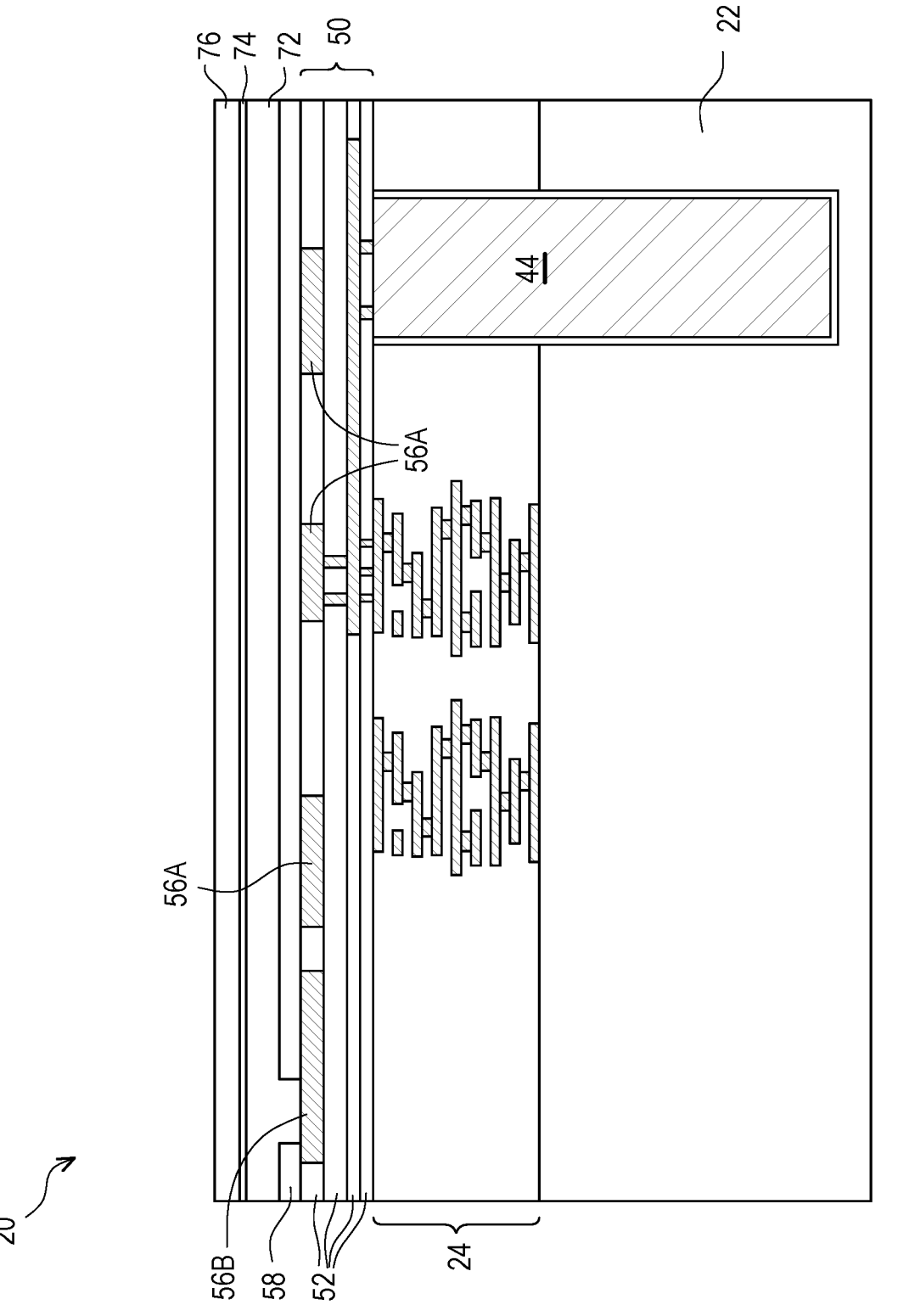

In FIG. 16, dielectric layers 72, 74, and 76 are formed over the passivation layer 58 with dielectric layer 72 being formed in the opening 60 in the passivation layer 58. Although FIG. 16 illustrates three dielectric layers 72, 74, and 76, more or fewer than three dielectric layers may be formed. The dielectric layer 74 fills the opening 60 in the passivation layer 58 and physically contacts the top metal 56B. The dielectric layer is separated from the top metal structures 56A by the passivation layer 58. The dielectric layer 72 provides a planar top surface to form the dielectric layers 74 and 76 on and may be considered a planarization dielectric layer 72. The dielectric layer 74 may provide etch stop functions during subsequent formation of bond pads and bond vias and may be considered an etch stop layer 74. The dielectric layer 76 may provide dielectric bonding functions and may be considered a bonding dielectric layer 76.

In some embodiments, the dielectric layers 72, 74, and 76 are formed of a silicon-containing material. For example, the dielectric layers 72, 74, and 76 may include an oxide such as silicon oxide, a nitride such as silicon nitride, an oxynitride such as silicon oxynitride, the like, or a combination thereof.

Figure 17:
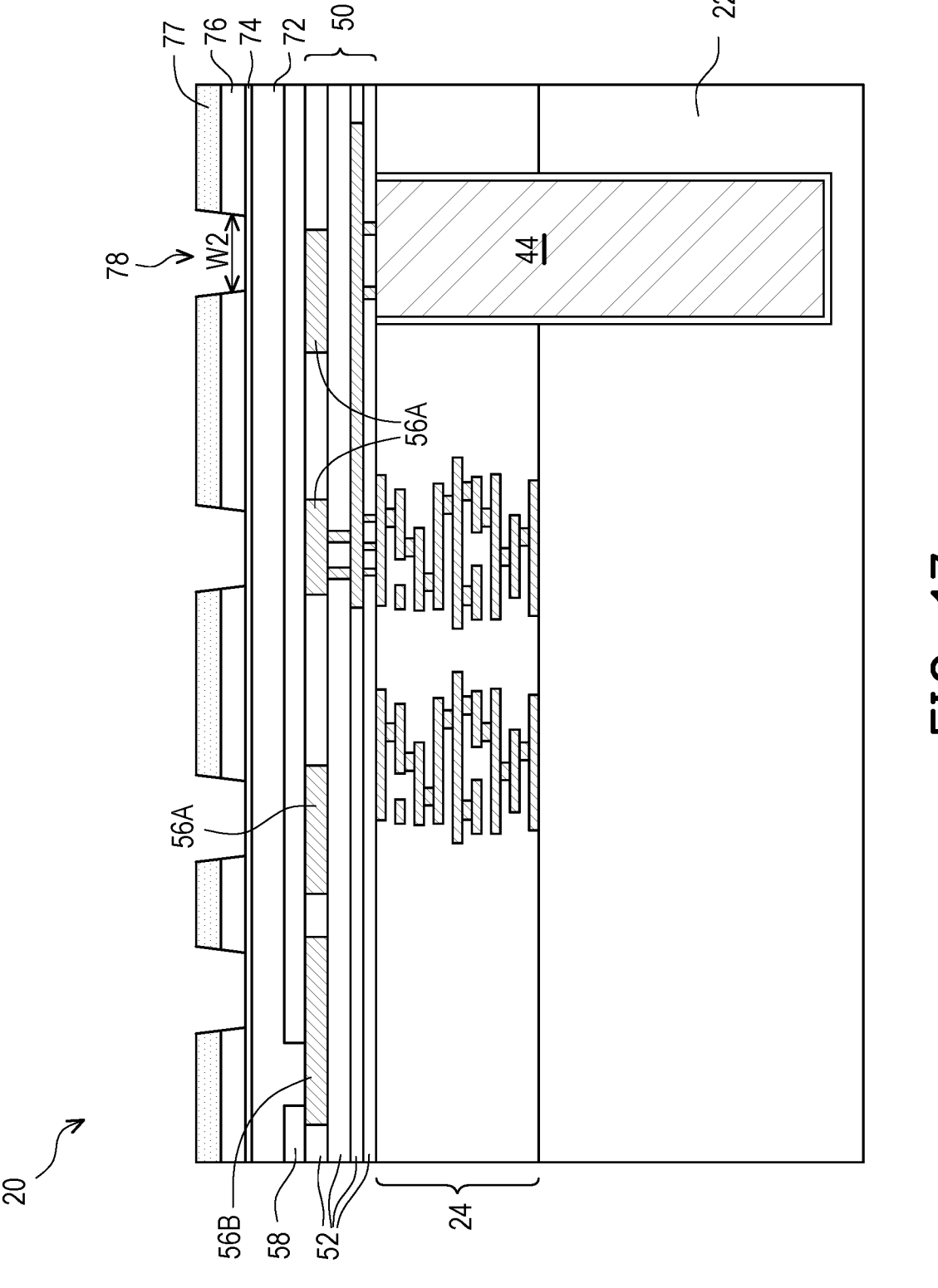
Figure 18:
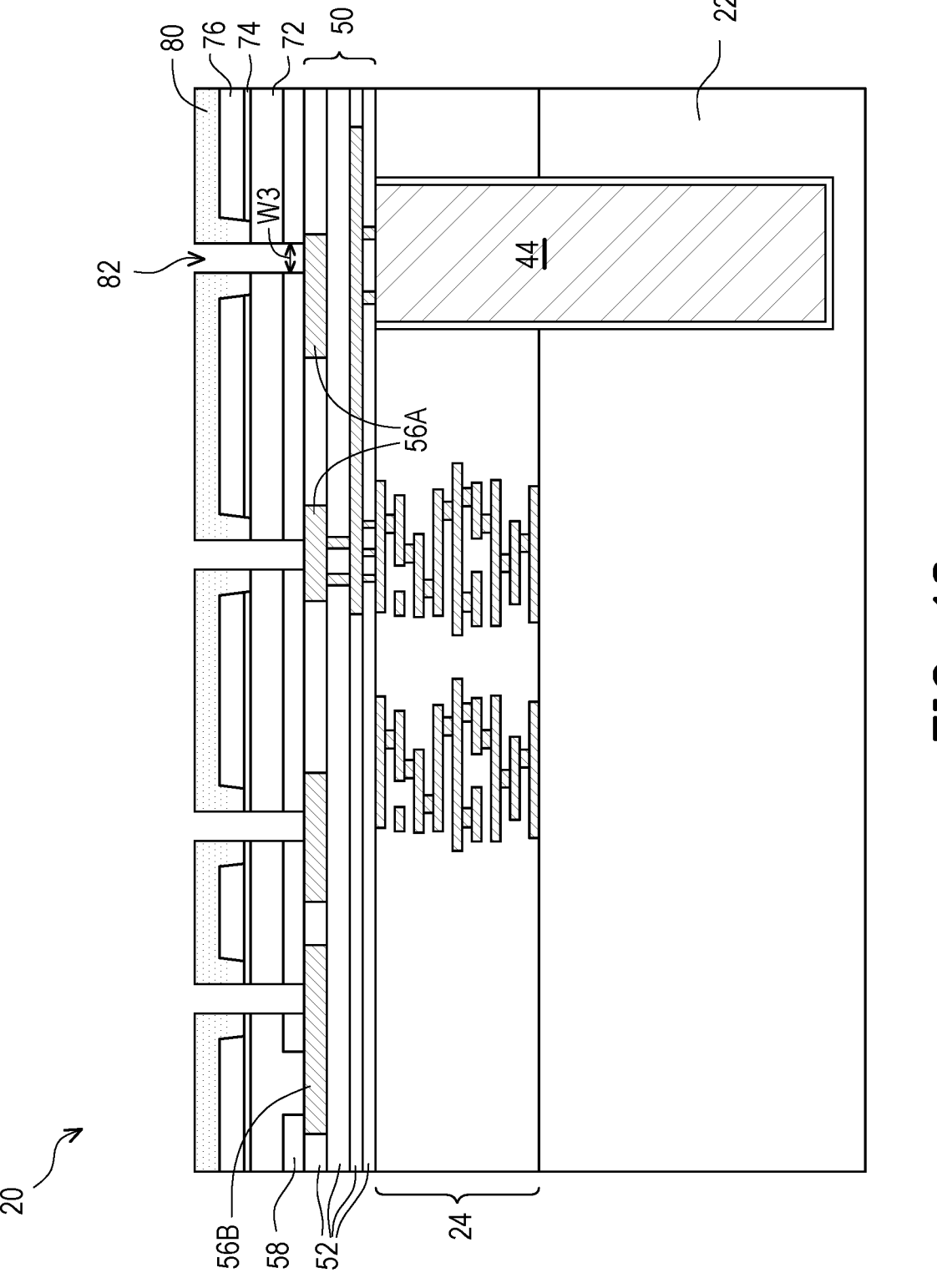

FIGS. 17 through 19 illustrate the formation of bond pad vias 86 and bond pads 88 are formed in the dielectric layers 72, 74, and 76 and connected to the top metal 56A. The bond pad vias 86 and bond pads 88 may be formed using be achieved using any suitable process, such as a single dama-scene process, a dual damascene process, combinations thereof, or the like. FIGS. 17 through 19 illustrate a dual damascene process.

In FIG. 17, a photoresist 77 is formed and patterned on the dielectric layer 76. The photoresist 77 may be formed by spin coating or the like and may be exposed to light for patterning. The pattern of the photoresist 77 corresponds to openings 78 for the bond pads 88 (see FIG. 19). Further in FIG. 17, the dielectric layer 76 is patterned to form the openings 78 using the patterned photoresist 77 as a mask with the patterning process stopping on the dielectric layer 74. The exposed portions of the dielectric layer 76 may be removed, such as by using an acceptable etching process, such as by wet and/or dry etching. The openings 78 have a width W2. In some embodiments, the width W2 is as small as 1.4 µm. In some embodiments, the width W2 is in a range from 1.4 µm to 5 µm.

FIG. 18 illustrates the removal of the photoresist 77, the formation and patterning of photoresist 80, and the pattern-ing of dielectric layers 74 and 72. The photoresist 77 may be removed by an acceptable ashing or stripping process, such as using an oxygen plasma or the like. Further in FIG. 18, the photoresist 80 is formed and patterned on the patterned dielectric layer 76 and in the openings 78. The photoresist 80 may be formed by spin coating or the like and may be exposed to light for patterning. The pattern of the photoresist 80 corresponds to openings 82 for the bond pad vias 86 (see FIG. 19). Further in FIG. 18, the dielectric layers 74 and 72 are patterned to form the openings 82 using the patterned photoresist 8o as a mask with the patterning process expos-ing portions of the top metal 56A. The exposed portions of the dielectric layers 74 and 72 may be removed, such as by using an acceptable etching process, such as by wet and/or dry etching. The openings 82 have a width W3. In some embodiments, the width W3 is as small as 0.5 µm. In some embodiments, the width W3 is in a range from 0.5 µm to 3 µm.

Figure 19A:
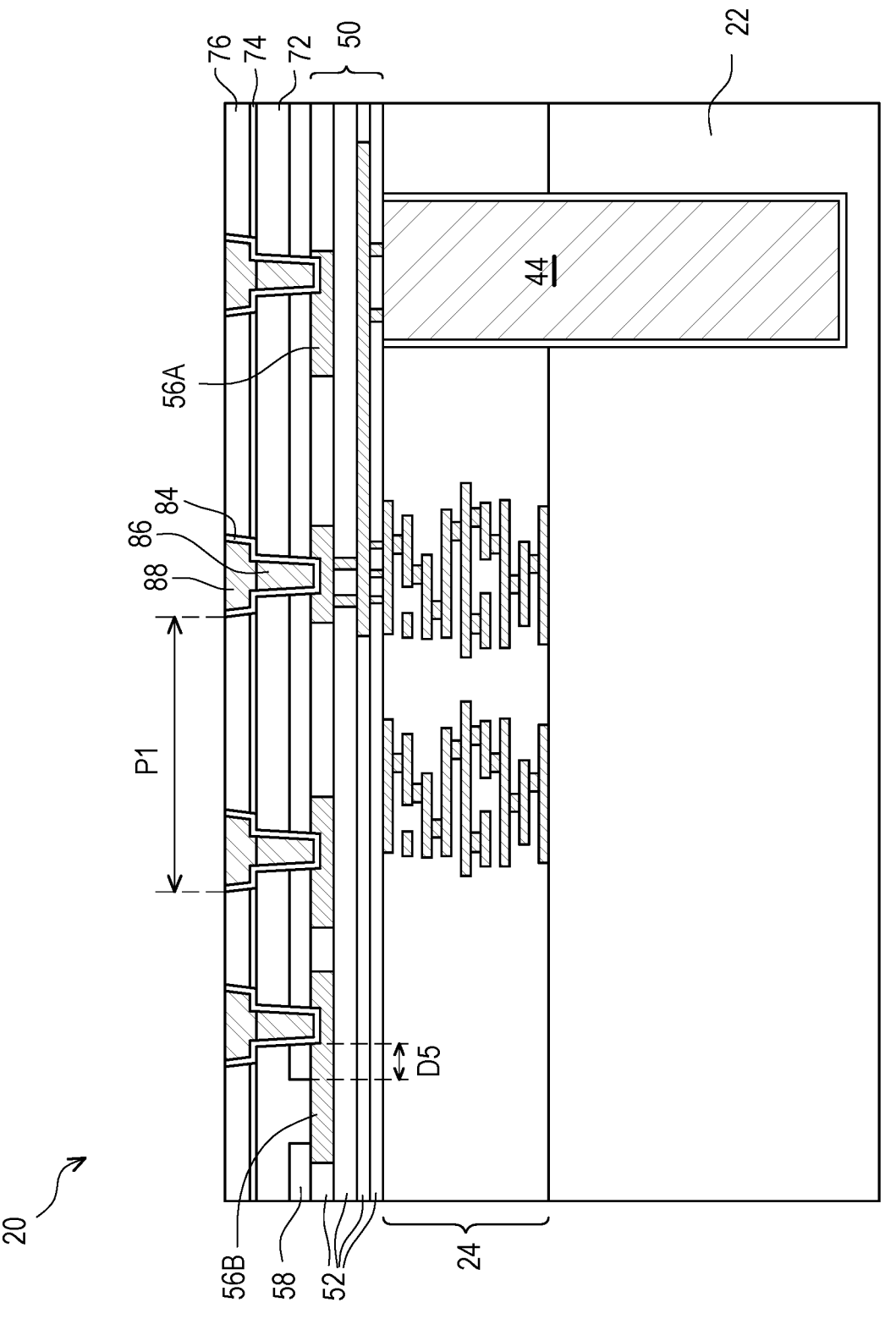
Figure 19B:
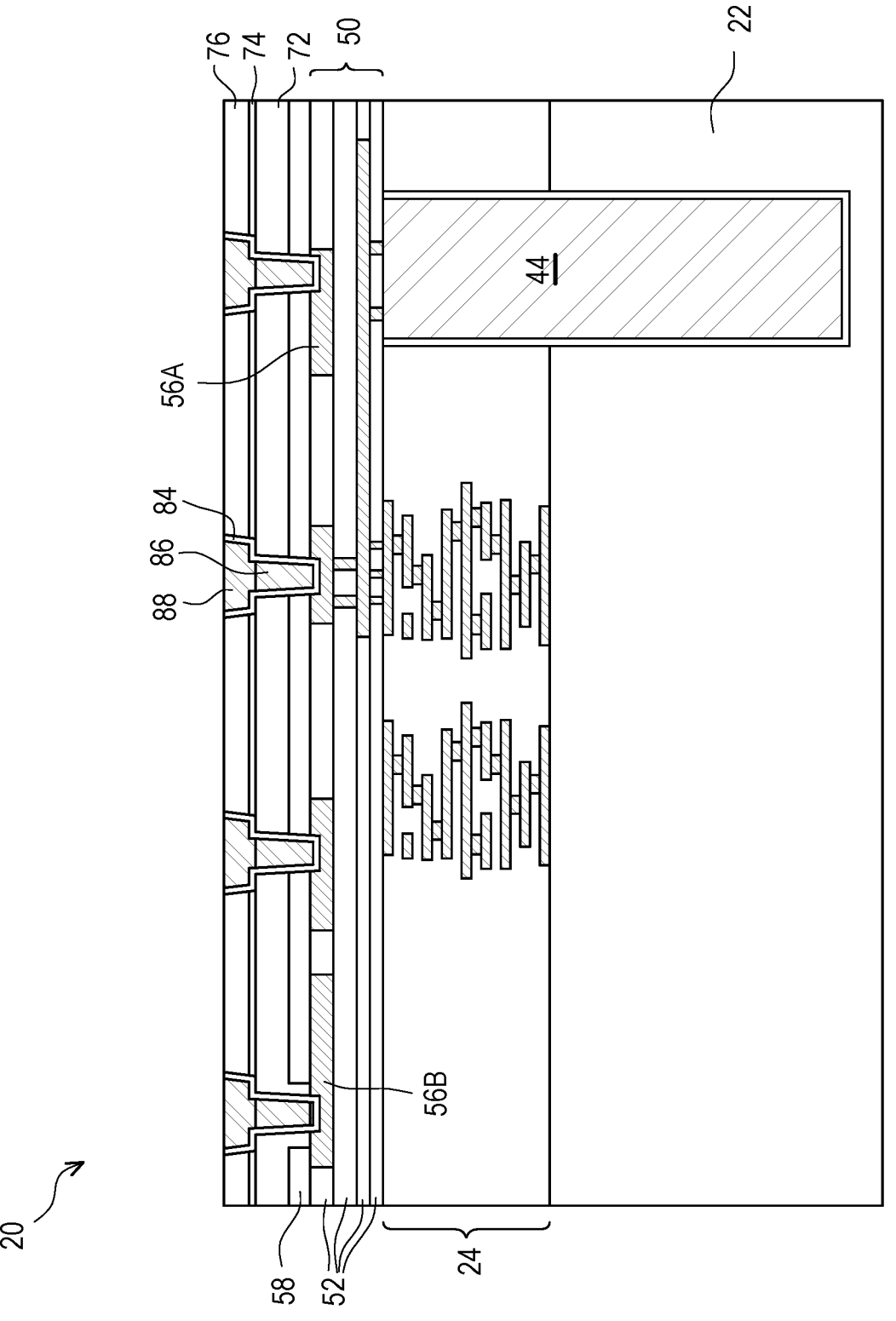

FIGS. 19A and 19B illustrate the removal of the photo-resist 80 and the formation of a barrier layer 84, the bond pad vias 86, and the bond pads 88 in the openings 78 and 82. In FIG. 19A a bond pad via 86 is formed on top metal 56B but not in the opening 60. In FIG. 19, a bond pad via 86 is formed the opening 60.

The barrier layer 84 may be formed in the openings prior to forming bond pad vias 86 and the bond pads 88. In some embodiments, the barrier layer 84 may comprise Ti, TiN, the like, or a combination thereof. The bond pad vias 86 and the bond pads 88 may be formed by similar processes and materials as the top metal 56 and vias 54 and the description is not repeated herein. The bond pads 88 may be formed of or comprise copper, for example. Adjacent bond pads 88 have a pitch P1. In some embodiments, the pitch P1 is as small as 3.0 µm. In some embodiments, the pitch P1 is in a range from 3.0 µm to 9.0 µm. In FIG. 19A, a nearest edge of the opening 60 is a distance D5 from a nearest edge of the bond pad via 86. In some embodiments, the distance D5 may be as small as 2 µm. In some embodiments, the distance D5 may be in a range from 2 m to 30 µm.

The top surfaces of the bond pads 88 are coplanar (within process variation) with the top surface of the uppermost dielectric layer 76. The planarization is achieved through a chemical mechanical polishing (CMP) process or a mechanical grinding process.

Figure 20:
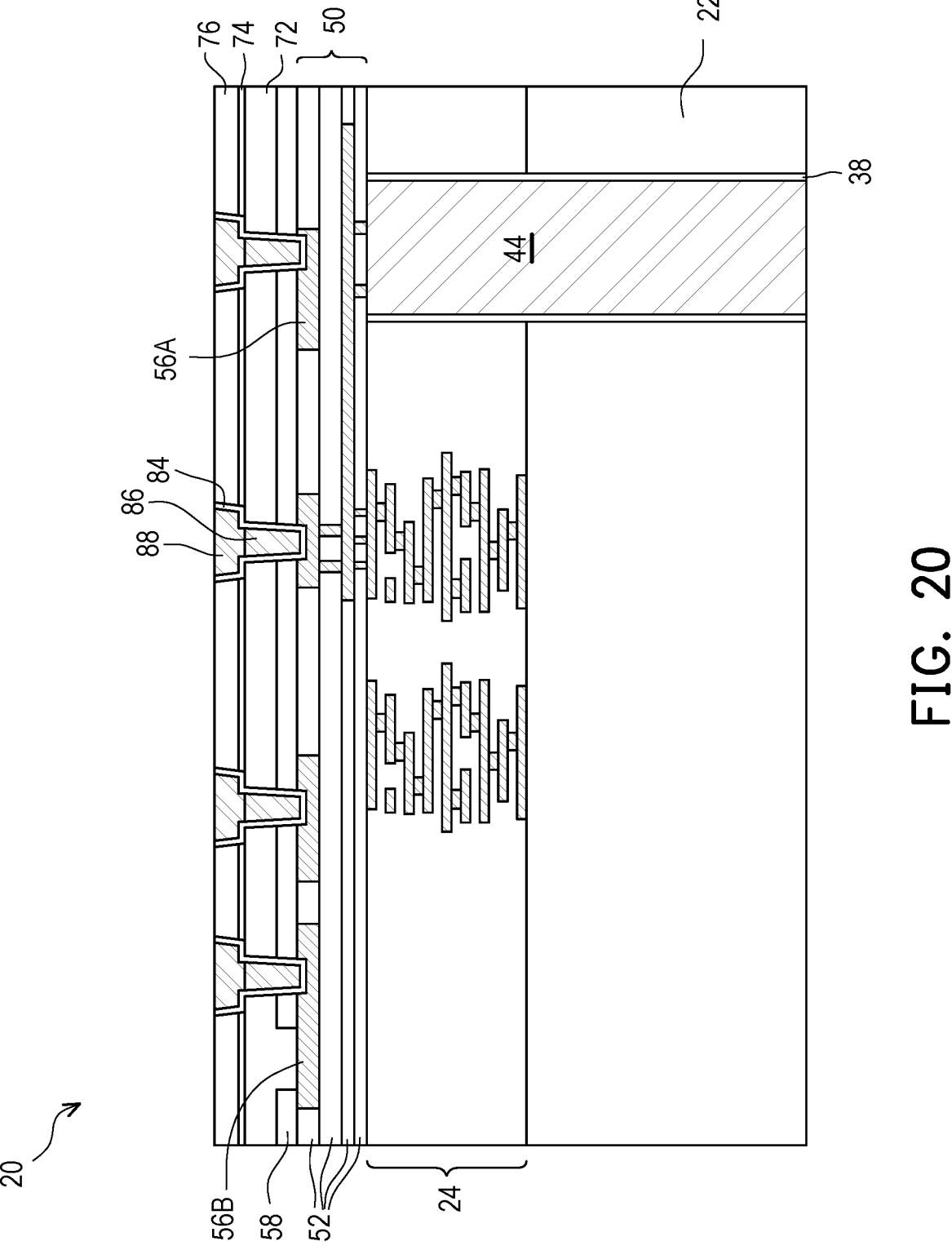

As shown in FIG. 20, the integrated circuit die 20 is thinned by thinning the substrate 22 before the subsequent singulation process. The thinning may be performed through a planarization process such as a mechanical grinding pro-cess or a CMP process. The thinning process exposes the TSV 44 and the liner 38. After thinning, the TSV 44 provides electrical connection from a back side of the substrate 22 to a front side of the substrate 22 (e.g., the interconnects 24 and 50 and bond pads 88).

Figure 21:
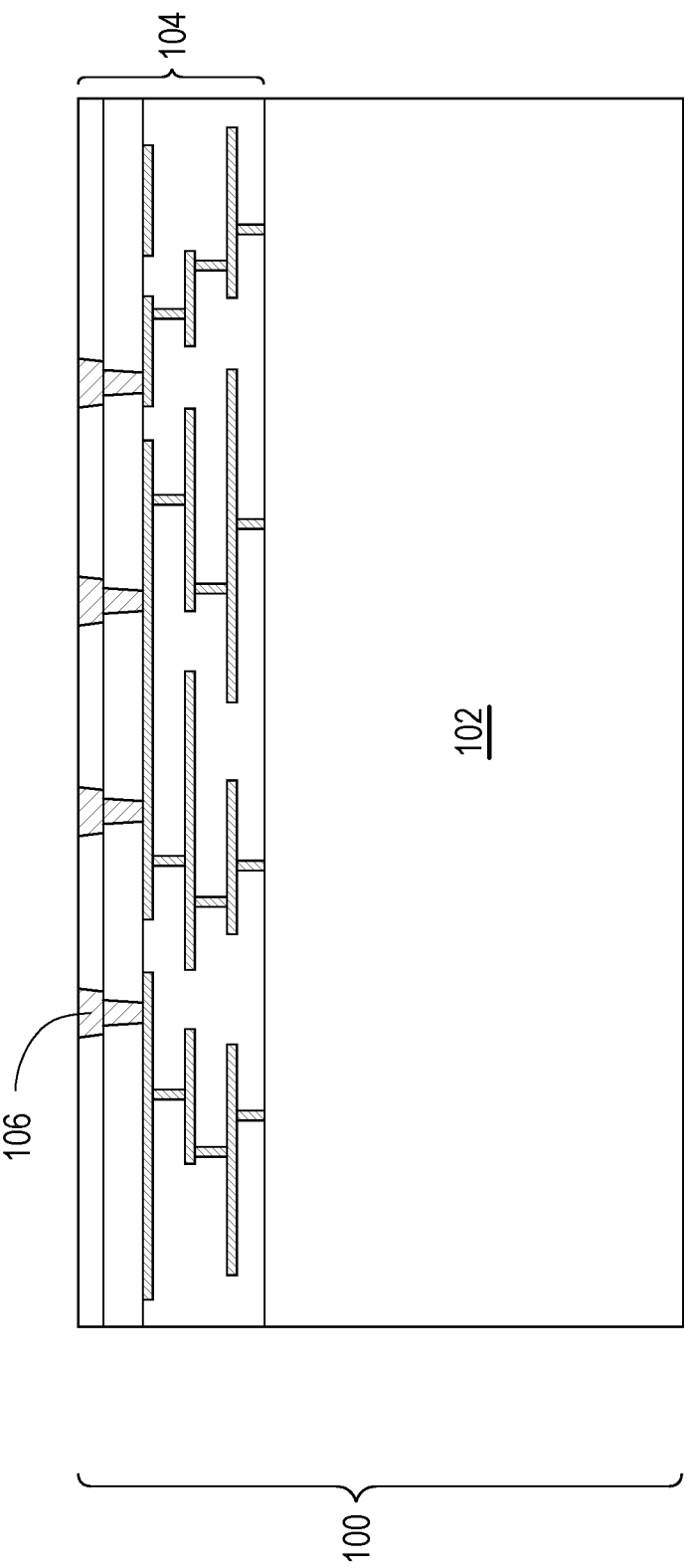
FIGS. 21 and 22 illustrate cross-sectional views of intermediate stages in the formation of a package according to embodiments.

The integrated circuit die 20 of the disclosed method results in one or more top metal 56B structures not having a bond pad 88 and bond pad via 86 overlying and connected to the top metal 56B. These top metal 56B may be referred to as testing top metal 56B structures. These top metal 56B have the dielectric layer 72 over and physically contacting the top metal 56B FIG. 21 illustrates a package structure 100. The package structure 100 includes a substrate 102, similar to the sub-strate 22 of the integrated circuit die 20, and an interconnect structure 104 including bond pads 106. The interconnect structure 104 and the bond pads 106 may be similar to the interconnect structures 24 and 50 and bond pads 88, respec-tively, described above and the descriptions are not repeated herein. The package structure 100 may be referred to as a die 100.

Figure 22:
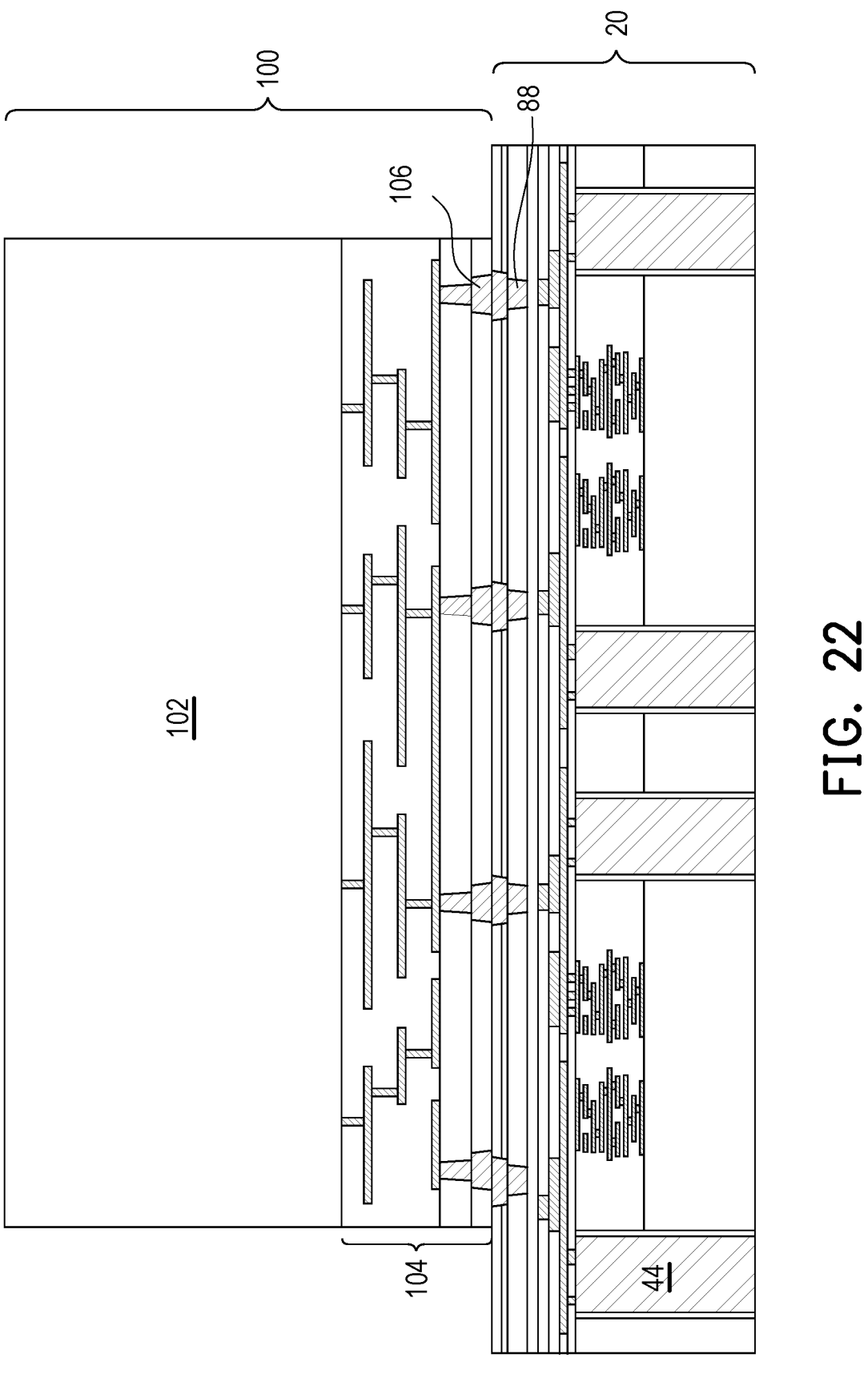

In FIG. 22, the integrated circuit die 20 is bonded to the package structure 100. The bonding of the integrated circuit die 20 to the package structure 100 may be achieved through direct bonding, in which both metal-to-metal direct bonding (between the bond pads 88 and 106) and dielectric-to-dielectric bonding (such as Si—O—Si bonding between surface dielectric layers of the integrated circuit die 20 and the package structure 100) are formed. Furthermore, there may be a single integrated circuit die 20 or a plurality of dies 20 bonded to the same package structure 100. The plurality of dies 20 bonded to the same package structure 100 may be identical to, or different from, each other to form a homog-enous or a heterogeneous structure. In some embodiments, a package structure includes multiple package structures 100 and multiple integrated circuit dies 20 (see, e.g., FIGS. 23 through 34).

The die 20 is disposed face up such that the front sides of the die 20 face the package structure 100 and the back sides of the dies 20 face away from the package structure 100. The die 20 is bonded to the package structure 100 at an interface 108. As illustrated by FIG. 22, the direct bonding process directly bonds the topmost dielectric layer of the intercon-nect structure 104 of the package structure 100 to the topmost dielectric layer 76 of the die 20 at the interface 108 through fusion bonding. In an embodiment, the bond between the topmost dielectric layer of the interconnect structure 104 and the topmost dielectric layer 76 of the die 20 may be an oxide-to-oxide bond. The direct bonding process further directly bonds the bond pads 88 of the die 20 to the bond pads 106 of the package structure 100 at the interface 108 through direct metal-to-metal bonding. Thus, electrical connection between the die 20 and the package structure 100 is provided by the physical connection of the bond pads 88 to the bond pads 106.

As an example, the direct bonding process starts with aligning the die 20 with the package structure 100, for example, by aligning the bond pads 88 to the bond pads 106. When the die 20 and the package structure 100 are aligned, the bond pads 88 may overlap with the corresponding bond pads 106. Next, the direct bonding includes a pre-bonding step, during which the die 20 is put in contact with the package structure 100. The direct bonding process continues with performing an anneal, for example, at a temperature between 150° C. and 400° C. for a duration between 0.5 hours and 3 hours, so that the copper in the bond pads 88 and the bond pads 106 inter-diffuses to each other, and hence the direct metal-to-metal bonding is formed.

Figure 23:
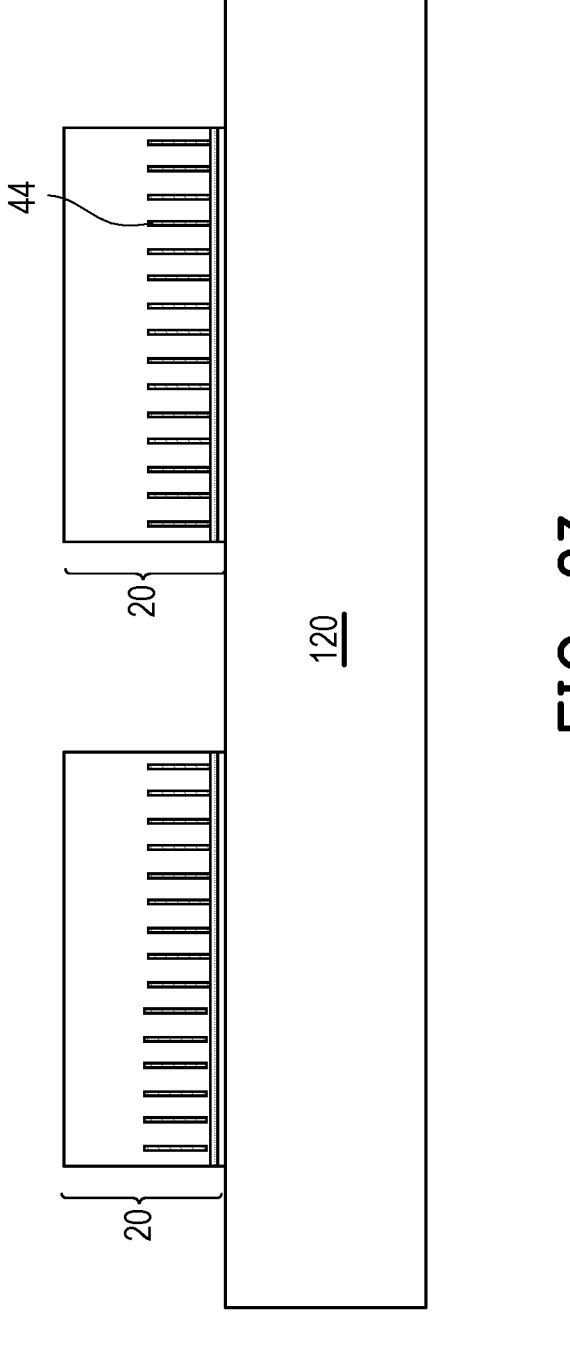
FIGS. 23 through 35 illustrate cross-sectional views and a plan view of intermediate stages in the formation of a package according to embodiments.

FIGS. 23 through 35 illustrate cross-sectional views and a plan view of intermediate stages in the formation of a package structure 150 according to an embodiment. In FIG. 23, faces (e.g., front-sides) of multiple dies 20 are attached to a carrier substrate 120. In some embodiments, the dies 20 are bonded to the carrier substrate 120 through a fusion bonding process. The fusion bonding process has been described above and the description is not repeated herein.

In some embodiments, the dies 20 are attached to the carrier substrate 120 with a release layer (not shown). The carrier substrate 120 may be a glass carrier substrate, a ceramic carrier substrate, or the like. The carrier substrate 120 may be a wafer, such that multiple packages can be formed on the carrier substrate 120 simultaneously. The release layer, if present, may be formed of a polymer-based material, which may be removed along with the carrier substrate 120 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate 120, or may be the like. The top surface of the release layer may be planarized and may have a high degree of planarity.

Figure 24:
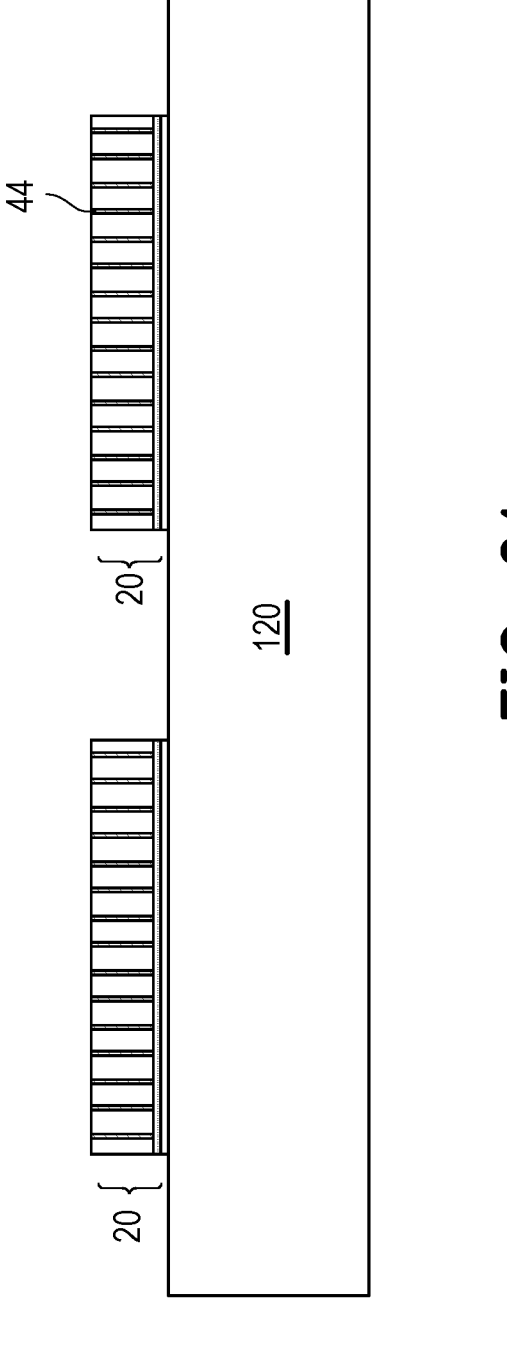

In FIG. 24, the dies 20 are thinned by thinning the substrate 22. The thinning may be performed through a planarization process such as a mechanical grinding process or a CMP process. The thinning process exposes the TSV 44 and the liner 38. After thinning, the TSV 44 provides electrical connection from a back side of the substrate 22 to a front-side of the substrate 22 (e.g., the interconnects 24 and 50 and bond pads 88). After the thinning process, the die 20 has a thickness in a range from 5 μm to 50 μm.

Figure 25:
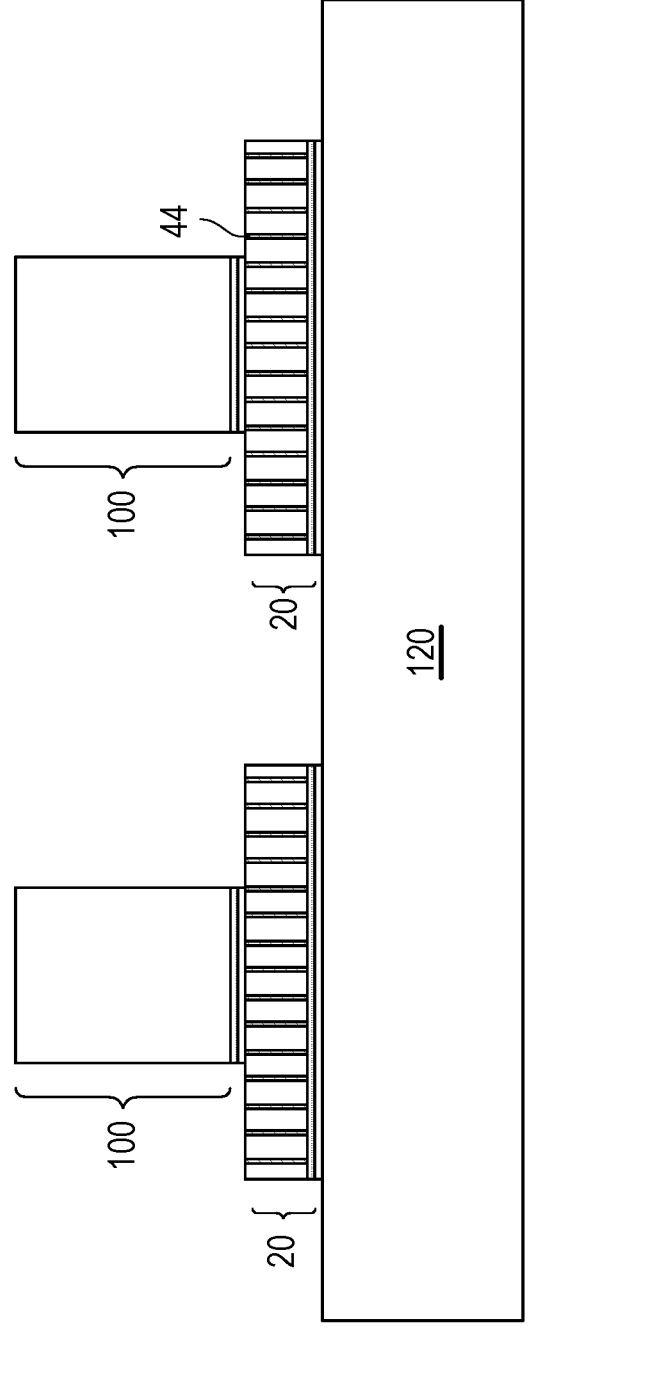

In FIG. 25, front-sides of dies 100 (e.g., sides with the bond pads 106) are bonded to the backsides of the dies 20 (e.g., exposed portions of TSVs 44) in a front-to-back configuration. The bonding of the dies 100 to the dies 20 may be achieved through direct bonding, in which both metal-to-metal direct bonding (between the bond pads 106 and TSVs 44) and dielectric-to-dielectric bonding (such as Si—O—Si bonding between surface dielectric layers of the dies 20 and 100) are formed. The bonding of the dies 100 electrically couples the dies 100 to the dies 20 through the bond pads 106 of the dies 100 and the TSVs 44 of the dies 20.

Figure 26:
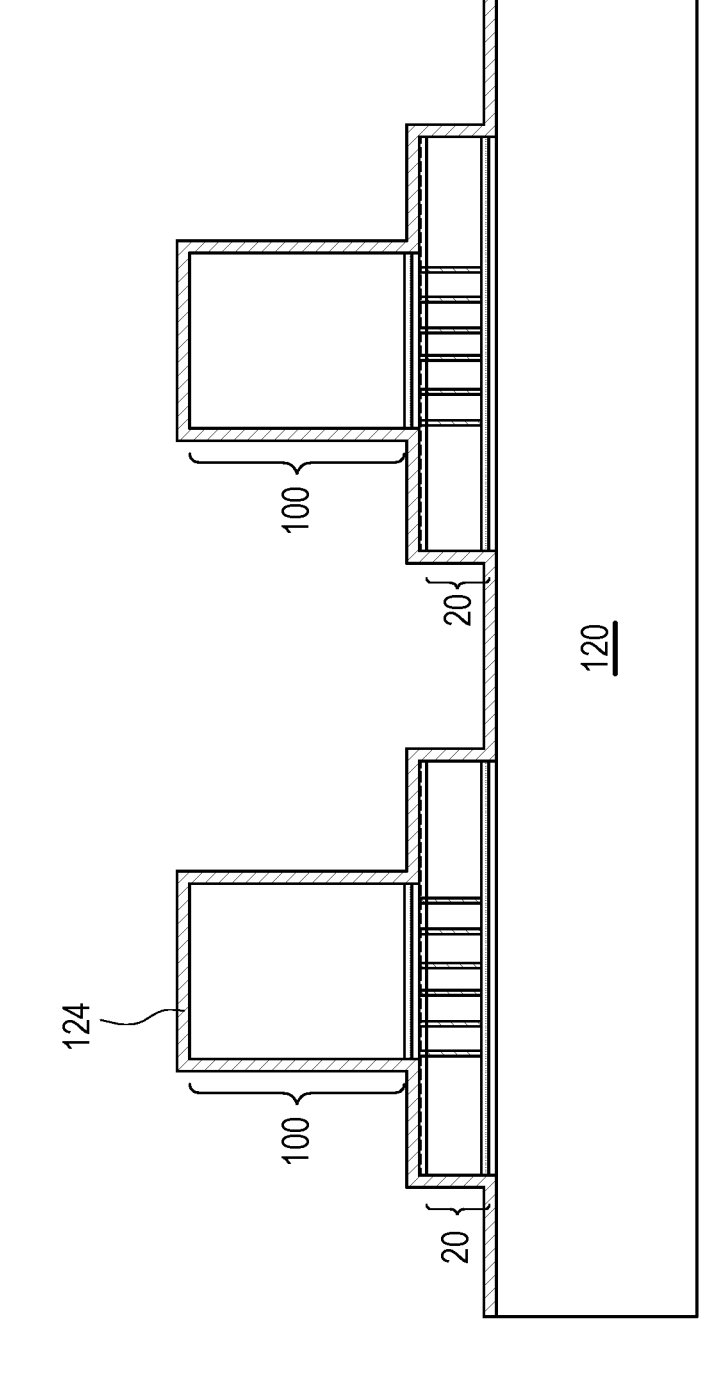

In FIG. 26, a seed layer 124 is formed over the carrier substrate 120, the dies 20, and the dies 100. The materials and formation processes of the seed layer 124 may be similar to the seed layer 40 described above and the description is not repeated herein.

Figure 27:
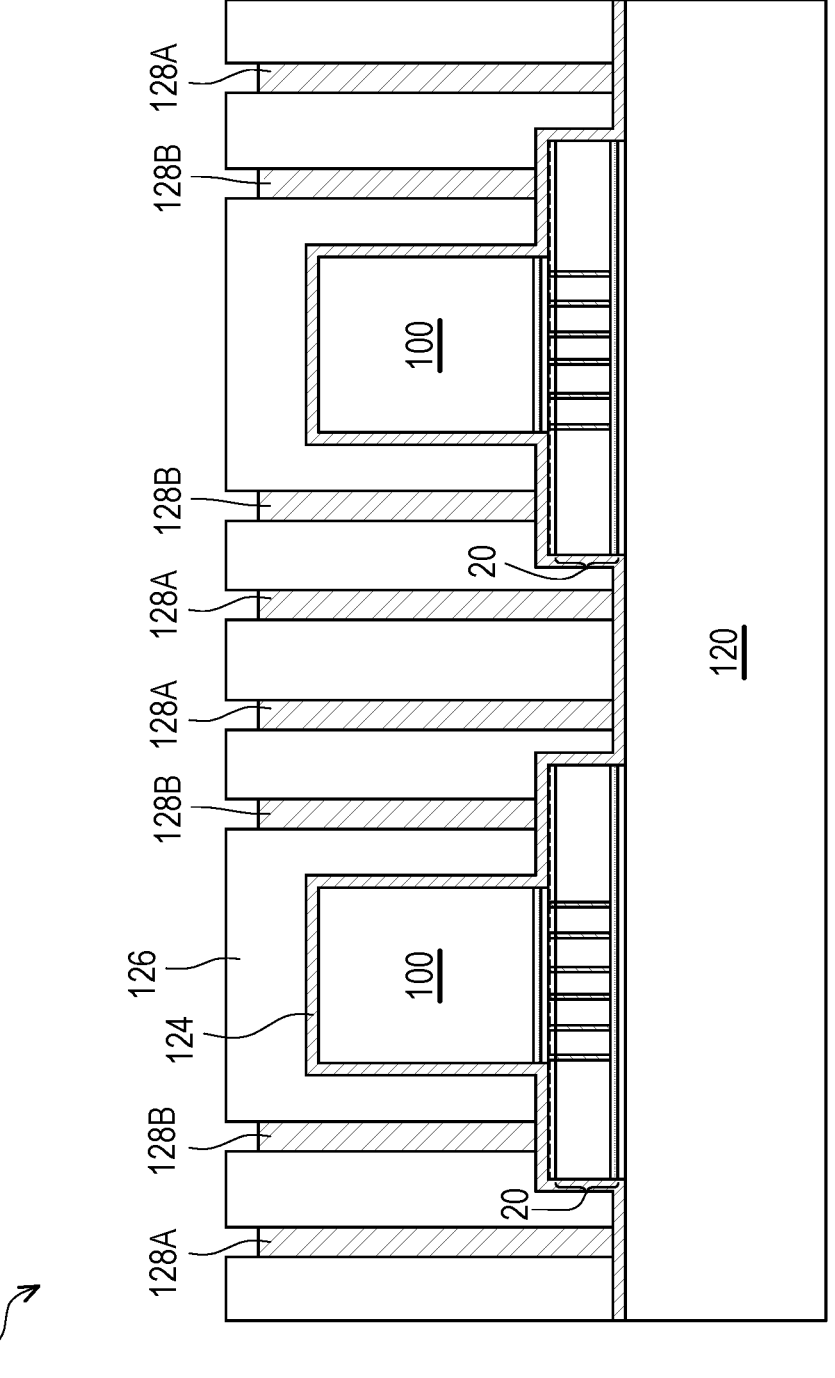
Figure 28:
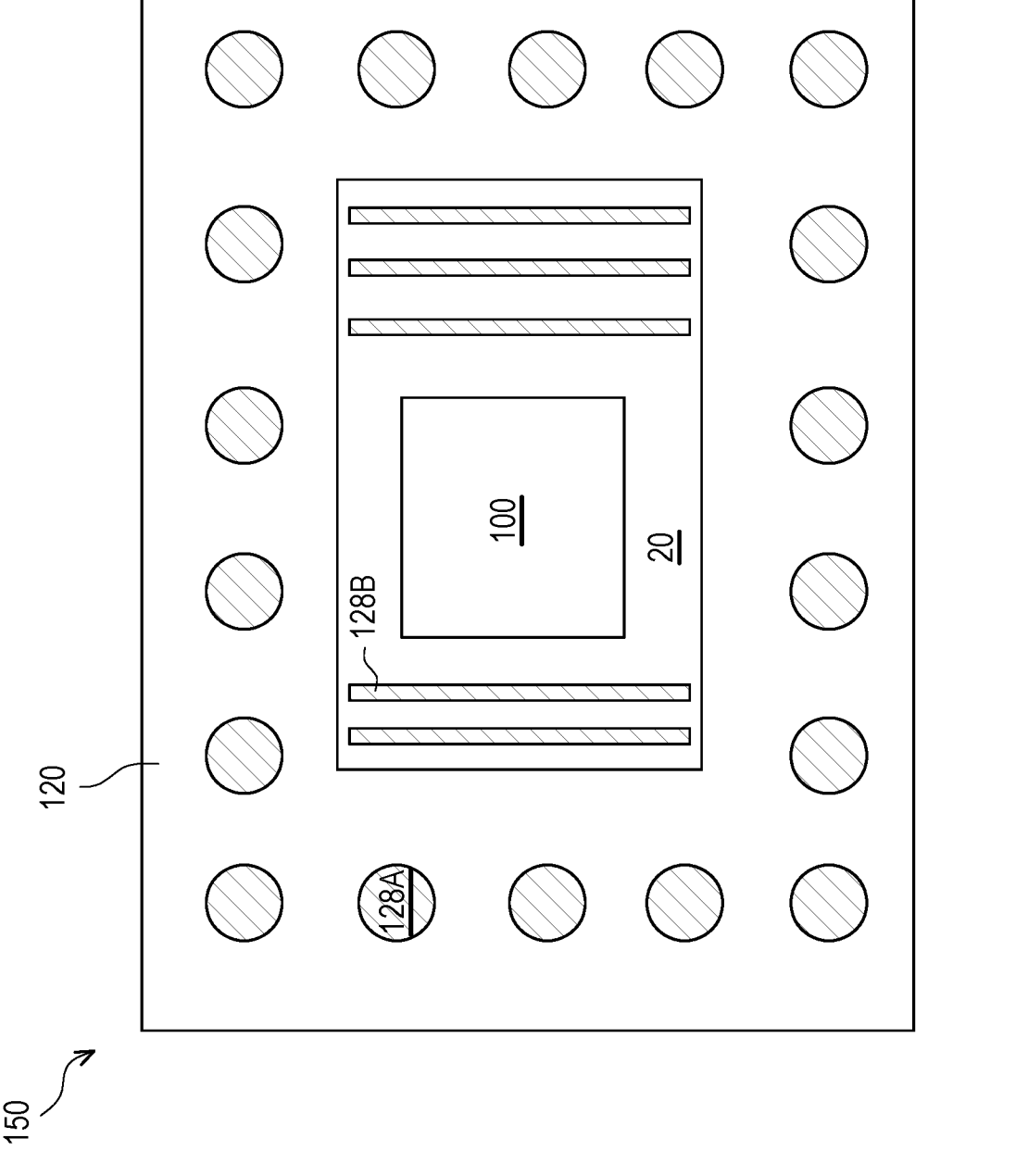

In FIG. 27, through vias 128 are formed on the seed layer 124, with through vias 128A being over the carrier substrate 120 and through vias 128B being over the dies 20. The through vias 128A may be used for connection between subsequently formed redistribution structure 140 and package components 200 (see, e.g., FIG. 35). The through vias 128B may be used for connection between dies 20 and package components 200 (see, e.g., FIG. 35). As illustrated in FIG. 28, which is a plan view of FIG. 27, in some embodiments, the through vias 128B may be elongated in a fin shape over the die 20 and the through vias 128A may be cylinders and circular in the plan view. In some embodiments, the through vias 128B may be used to dissipate heat from the dies 20 and 100 as well as electrically couple the dies 20.

As an example to form the through vias 128, a photoresist 126 is formed and patterned on the seed layer 124. The photoresist 126 may be formed by spin coating or the like and may be exposed to light for patterning. The pattern of the photoresist 126 corresponds to the through vias 128. A conductive material is then formed in the openings of the photoresist 126. The conductive material may be a metal such as copper, titanium, tungsten, aluminum, or the like, which may be formed by plating, such as electroless plating or electroplating from the seed layer, or the like.

Figure 29:
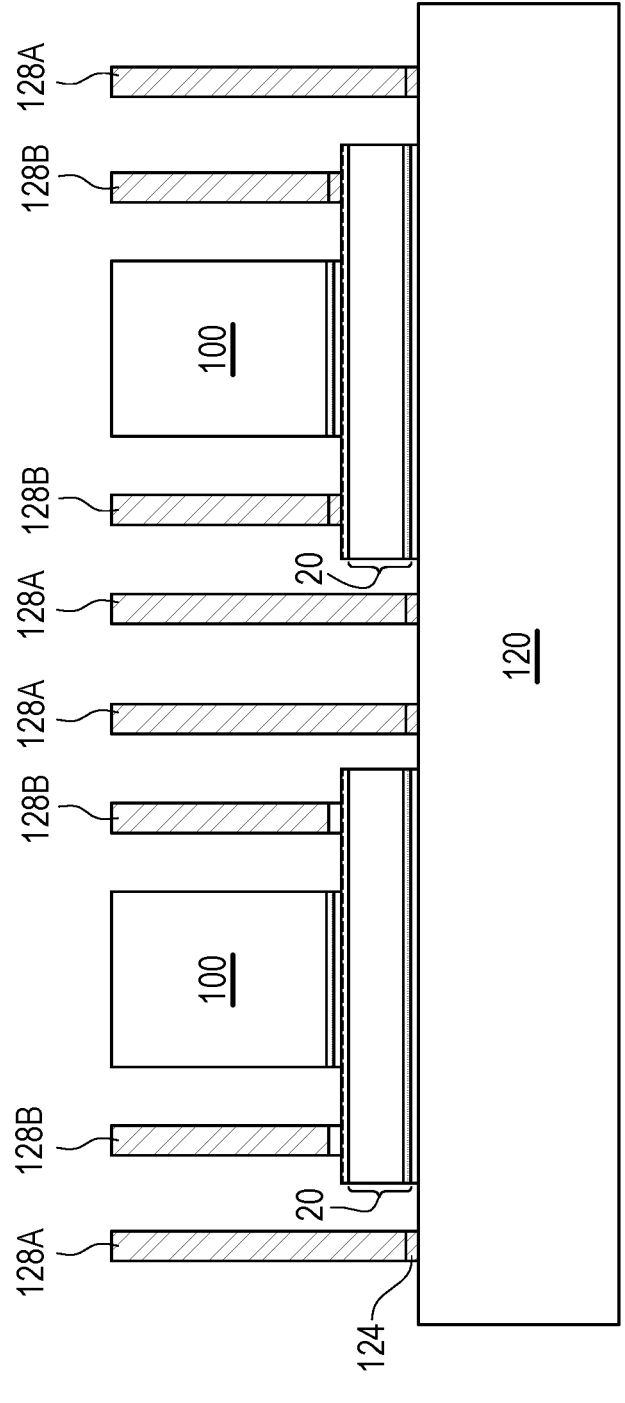

In FIG. 29, the photoresist 126 is removed. The photoresist 126 may be removed by any acceptable ashing or stripping process, such as using an oxygen plasma or the like. The remaining portions of the conductive material forms the through vias 128A and 128B.

Figure 30:
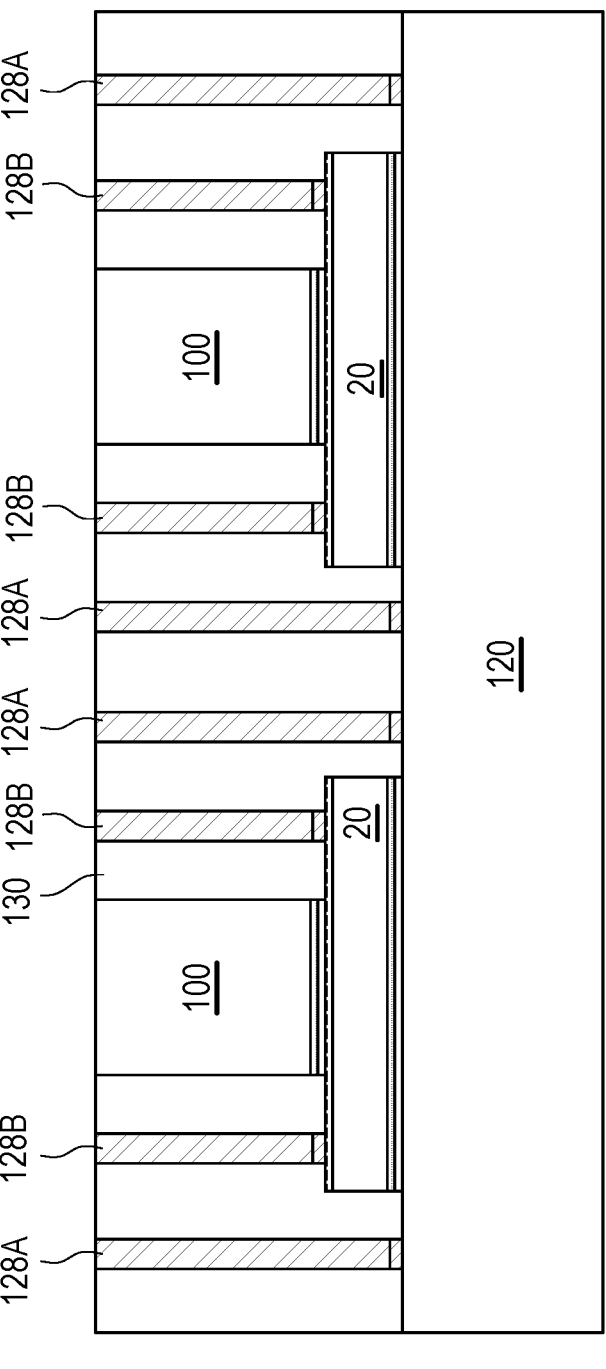
Figure 30:

In FIG. 30, an encapsulant 130 is formed around the dies 20, the dies 100, and the through vias 116. After formation, the encapsulant 130 encapsulates the dies 20, the dies 100, and the through vias 116. The encapsulant 130 may be a molding compound, epoxy, or the like. In some embodiments, the encapsulant 130 includes a polymer resin having fillers disposed therein. The encapsulant 130 may be applied by compression molding, transfer molding, or the like, and may be dispensed such that the dies 100 and the through vias 128 are buried or covered. The encapsulant 130 is further dispensed in gap regions between the dies 100, the dies 20, and the through vias 128. The encapsulant 130 may be applied in liquid or semi-liquid form and then subsequently cured. A planarization process may be performed on the encapsulant 130 to expose the through vias 128. The planarization process may remove material of the encapsulant 130, the backsides of the dies 100, and the through vias 128 until the through vias 128 are exposed. After the planarization process, top surfaces of the encapsulant 130, the through vias 128, and the backsides of the dies 100 are substantially coplanar (within process variations) such that they are level with one another. The planarization process may be, for example, a chemical-mechanical polish (CMP), a grinding process, or the like. In some embodiments, the planarization process may be omitted, for example, if the through vias 128 are already exposed.

Figure 31:
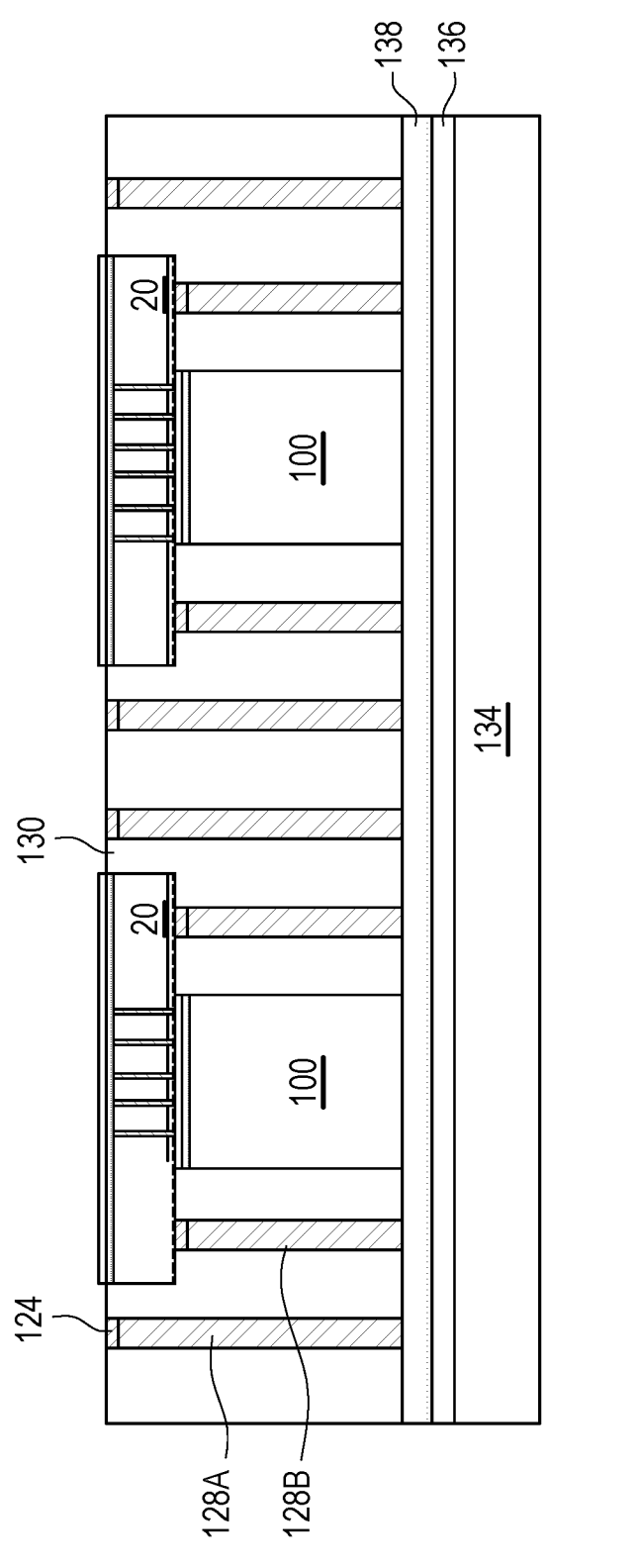

In FIG. 31, a carrier swap process is performed. The swap process includes attaching the backsides of the dies 100 and the encapsulant 130 to a second carrier substrate 134 and removing the carrier substrate 120. In some embodiments, before attaching the backsides of the dies 100 and the encapsulant 130 to a second carrier substrate 134, a passivation layer 138 is formed on the backsides of the dies 100 and the encapsulant 130. The materials and formation processes of the passivation layer 138 may be similar to the passivation layer 58 described above and the description is not repeated herein. The passivation layer 138 covers the exposed backsides of the through vias 128, the dies 100, and the encapsulant 130.

The structure of FIG. 30 including the passivation layer 138 may be flipped over and placed on the carrier substrate 134 with a release layer 136. The structure does not have to be a carrier substrate and may be any acceptable support structure, such as tape or a frame. The materials of the carrier substrate 134 and the release layer 136 may be similar to the carrier substrate 120 and the release layer described above and the descriptions are not repeated herein.

After the structure is attached the second carrier substrate 134, a debonding process is performed to detach (or "debond") the carrier substrate 120 from the dies 20, the through vias 128, and the encapsulant 130. After the carrier substrate 120 is removed, the front-sides of the dies 20 and the encapsulant 130 are exposed. In some embodiments, the debonding process includes projecting a light such as a laser light or an UV light on a release layer (if present) so that the release layer decomposes under the heat of the light and the carrier substrate 120 can be removed. A cleaning process may optionally be performed to remove residue of the release layer.

Figure 32:
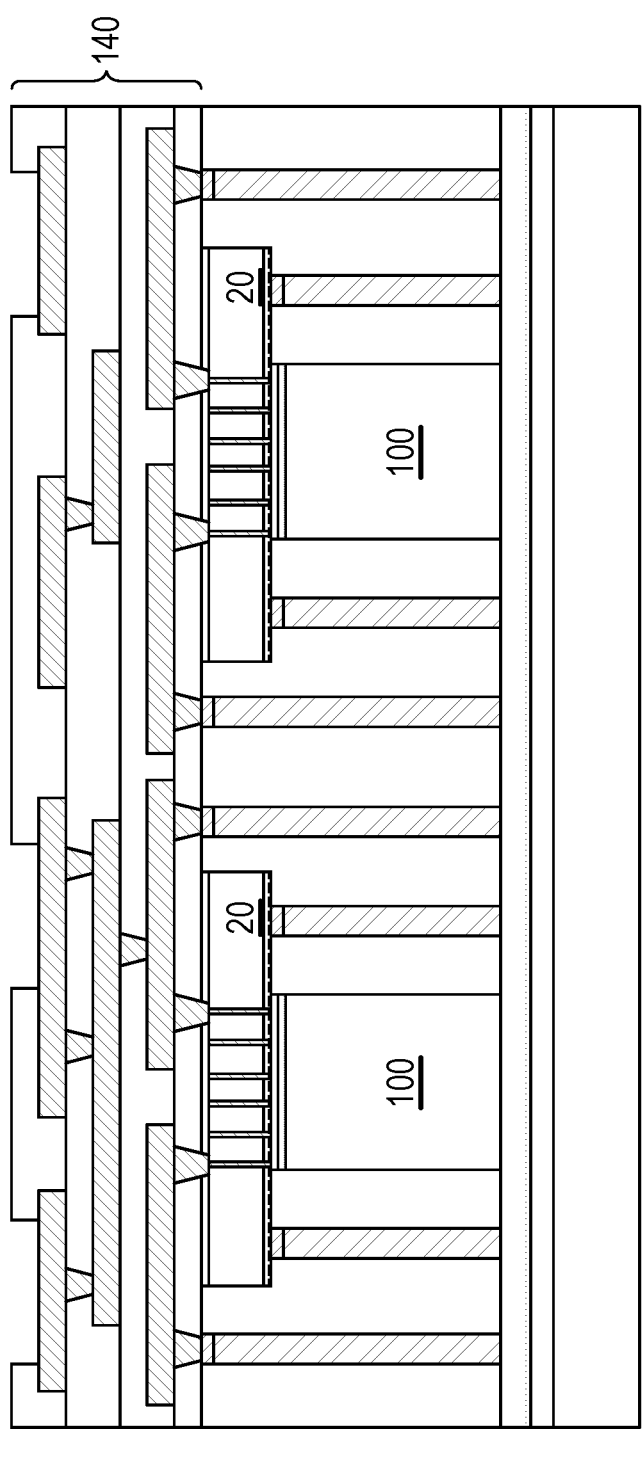

In FIG. 32, a redistribution structure 140 is formed on the encapsulant 130, the through vias 128A, and the dies 20. The redistribution structure 140 may include redistribution lines (RDLs), such as metal traces (or metal lines), and vias underlying and connected to the metal traces. The redistribution lines of the redistribution structure 140 are physically and electrically connected to the TSVs 44 of the dies 20 and the through vias 128A.

In accordance with some embodiments of the present disclosure, the RDLs are formed through plating processes, wherein each of the RDLs includes a seed layer (not shown) and a plated metallic material over the seed layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the RDLs. The patterning forms openings through the photoresist to expose the seed layer. A conductive material is formed in the openings of the photoresist and on the exposed portions of the seed layer. The conductive material may be formed by plating, such as electroplating or electroless plating, or the like. The seed layer and the plated metallic material may be formed of the same material or different materials. The conductive material may be a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet and/or dry etching. The remaining portions of the seed layer and conductive material form the RDLs.

Dielectric or passivation layers may be formed over each layer of the metal traces. In some embodiments, the dielectric or passivation layers are formed of a polymer, which may be a photo-sensitive material such as PBO, polyimide, BCB, or the like, that may be patterned using a lithography mask. In other embodiments, the dielectric or passivation layers are formed of a nitride such as silicon nitride; an oxide such as silicon oxide, PSG, BSG, BPSG; or the like. The dielectric or passivation layers may be formed by spin coating, lamination, CVD, the like, or a combination thereof.

Openings may be formed in the top dielectric or passivation layer with a patterning process, exposing some or all of the top metal layer of the redistribution structure 140. The patterning process may be an acceptable process, such as by exposing the dielectric or passivation layer to light when the dielectric layer is a photo-sensitive material or by etching using, for example, an anisotropic etch.

The redistribution structure 140 is illustrated as an example. More or fewer dielectric layers and metallization layers than illustrated may be formed in the redistribution structure 140 by repeating or omitting the steps previously described.

Figure 33:
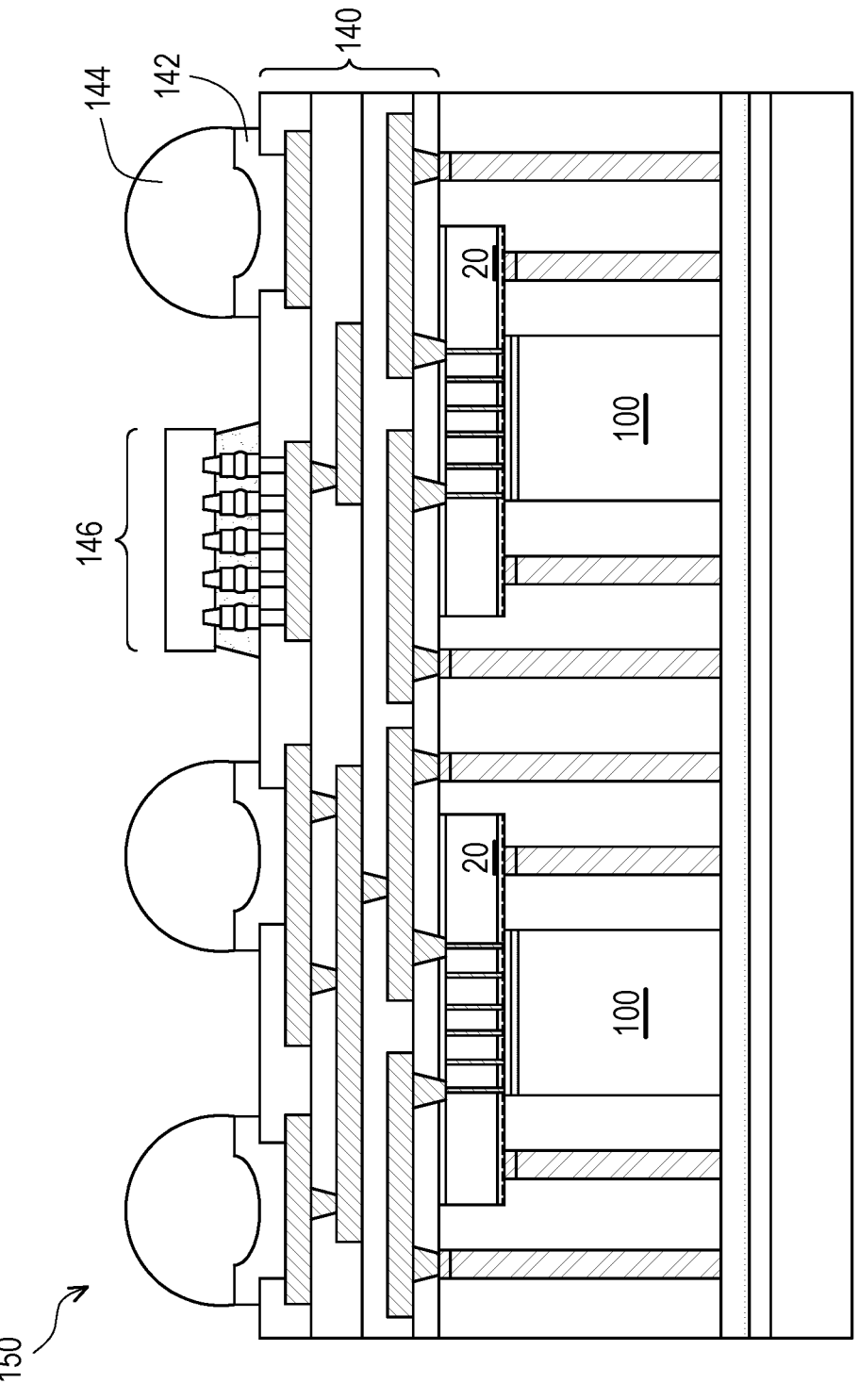

In FIG. 33, under-bump metallizations (UBMs) 142 are formed for external connection to the redistribution structure 140. The UBMs 142 have bump portions on and extending along the top surface of the upper dielectric layer of the redistribution structure 140, and have via portions extending through the upper dielectric layer of the redistribution structure 140 to physically and electrically couple the upper metallization layer of the redistribution structure 140. As a result, the UBMs 142 are electrically connected to the through vias 128 and the dies 20 (e.g., the interconnects 50 and the TSVs 44). The UBMs 142 may be formed of the same material as the metallization layers of the redistribution structure 140, and may be formed by a similar process. In some embodiments, the UBMs 142 have a different size (such as a greater size) than the metallization layers of the redistribution structure 140.

Conductive connectors 144 are formed on the UBMs 142. The conductive connectors 148 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 144 may include a conductive material such as solder, copper, aluminum, gold, nickel, silver, palladium, tin, the like, or a combination thereof. In some embodiments, the conductive connectors 144 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 144 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. The conductive connectors 144 are disposed at the front-sides of the package components 150.

In some embodiments, passive devices 146 (e.g., surface mount devices (SMDs)) may be attached to the package component 150 (e.g., bonded to the UBMs 142 or the metallization layers of the redistribution structure 140). The passive devices 146 may be bonded to a same surface of the package component 150 as the conductive connectors 144.

Figure 34:
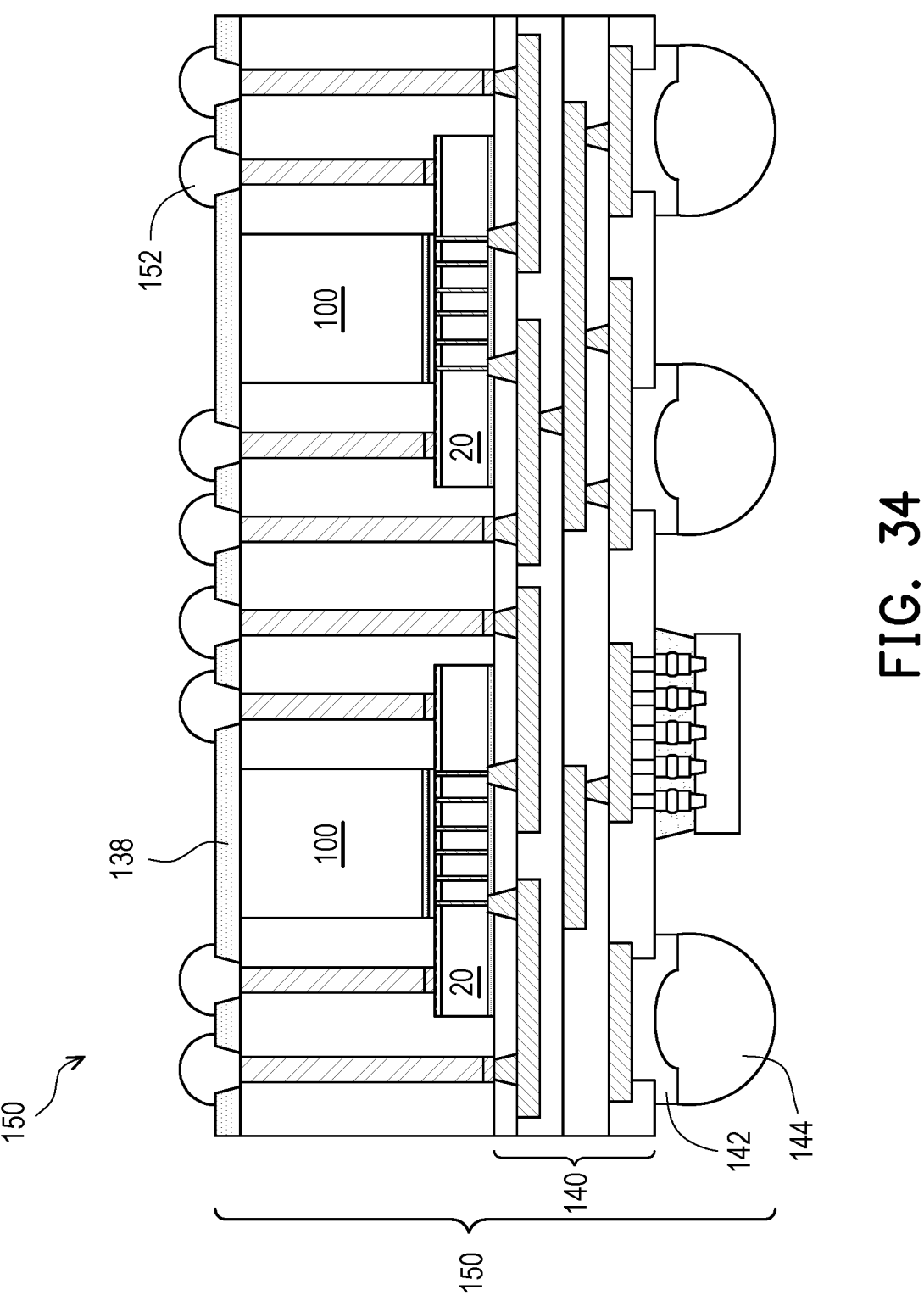

In FIG. 34, a carrier substrate de-bonding is performed to detach (or "de-bond") the carrier substrate 134 from the passivation layer 138. In accordance with some embodiments, the de-bonding includes projecting a light such as a laser light or an UV light on the release layer 136 so that the release layer 136 decomposes under the heat of the light and the carrier substrate 134 can be removed. The structure is then flipped over and placed on a tape (not shown).

Further in FIG. 34, conductive connectors 152 are formed extending through the passivation layer 138 to contact the through vias 128. Openings are formed through the passivation layer 138 to expose portions of the through vias 128. The openings may be formed, for example, using laser drilling, etching, or the like. The conductive connectors 152 are formed in the openings. In some embodiments, the conductive connectors 152 comprise flux and are formed in a flux dipping process. In some embodiments, the conductive connectors 152 comprise a conductive paste such as solder paste, silver paste, or the like, and are dispensed in a printing process. In some embodiments, the conductive connectors 152 are formed in a manner similar to the conductive connectors 144, and may be formed of a similar material as the conductive connectors 144.

Figure 35:
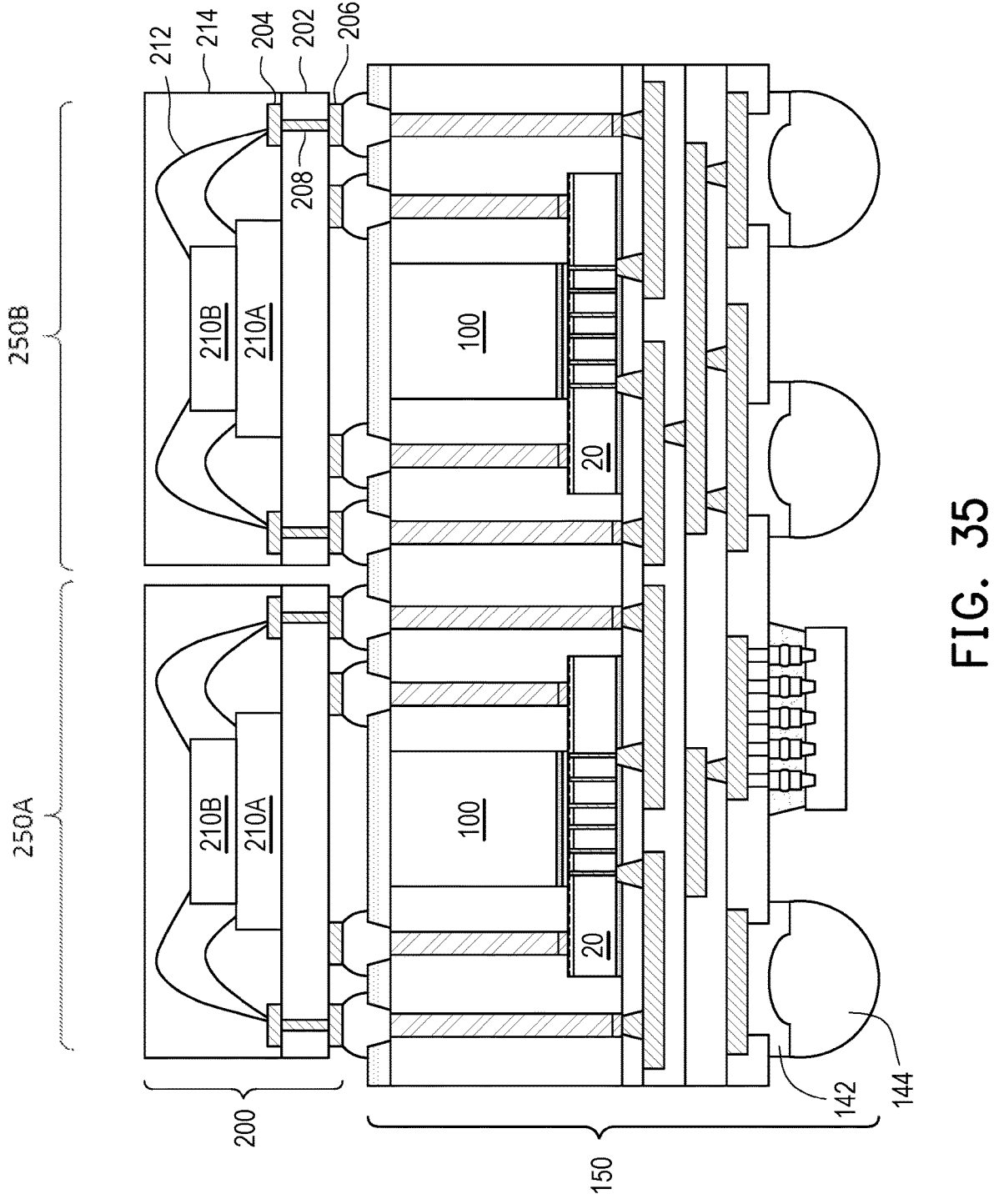

In FIG. 35, second package components 200 are coupled to the package component 150. Two second package components 200 are illustrated in FIG. 35, but more or fewer second package components 200 may be included in the package structure than is shown in FIG. 35. In some embodiments, the structure in FIG. 35 includes multiple package regions 250 (e.g., 250A and 250B) that are singulated to form individual package structures from the package regions 250A and/or 250B.

The second package components 200 include, for example, a substrate 202 and one or more stacked dies 210 (e.g., 210A and 210B) coupled to the substrate 202. Although one set of stacked dies 210 (210A and 210B) is illustrated, in other embodiments, a plurality of stacked dies 210 (each having one or more stacked dies) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and conductive vias 208. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202, to couple to the conductive connectors 152. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In some embodiments, the bond pads 204 and bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules.

The stacked dies 210 and the wire bonds 212 may be encapsulated by a molding material 214. The molding material 214 may be molded on the stacked dies 210 and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210 and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the package component 150 by way of the conductive connectors 152 and the bond pads 206. In some embodiments, the stacked dies 210 may be coupled to the dies 20 and 100 through the wire bonds 212, the bond pads 204 and 206, conductive vias 208, the conductive connectors 152, the through vias 128, and the redistribution structure 140.

In some embodiments, a solder resist (not shown) is formed on the side of the substrate 202 opposing the stacked dies 210. The conductive connectors 152 may be disposed in openings in the solder resist to be electrically and mechanically coupled to conductive features (e.g., the bond pads 206) in the substrate 202. The solder resist may be used to protect areas of the substrate 202 from external damage.

In some embodiments, the conductive connectors 152 have an epoxy flux (not shown) formed thereon before they are reflowed with at least some of the epoxy portion of the epoxy flux remaining after the second package components 200 are attached to the package component 150.

In some embodiments, an underfill (not shown) is formed between the package component 150 and the second package components 200, surrounding the conductive connectors 152. The underfill may reduce stress and protect the joints resulting from the reflowing of the conductive connectors 152. The underfill may be formed by a capillary flow process after the second package components 200 are attached, or may be formed by a suitable deposition method before the second package components 200 are attached. In embodiments where the epoxy flux is formed, it may act as the underfill.

The package component 150 depicted in FIG. 35 is a system-on-integrated-circuit (SoIC) structure bonded in a face-to-back configuration. Alternatively, the integrated circuit die 20 and the package structure 100 may be bonded in a face-to-face configuration (see, e.g., FIG. 22).

FIGS. 36 through 40 illustrate cross-sectional views of the integrated circuit die 20 in accordance with some embodiments. These embodiments include a redistribution line (RDL) 260 between the interconnect structure 50 and the bond pad vias 86. Details regarding this embodiment that are similar to those for the previously described embodiment will not be repeated herein.

Figure 36:
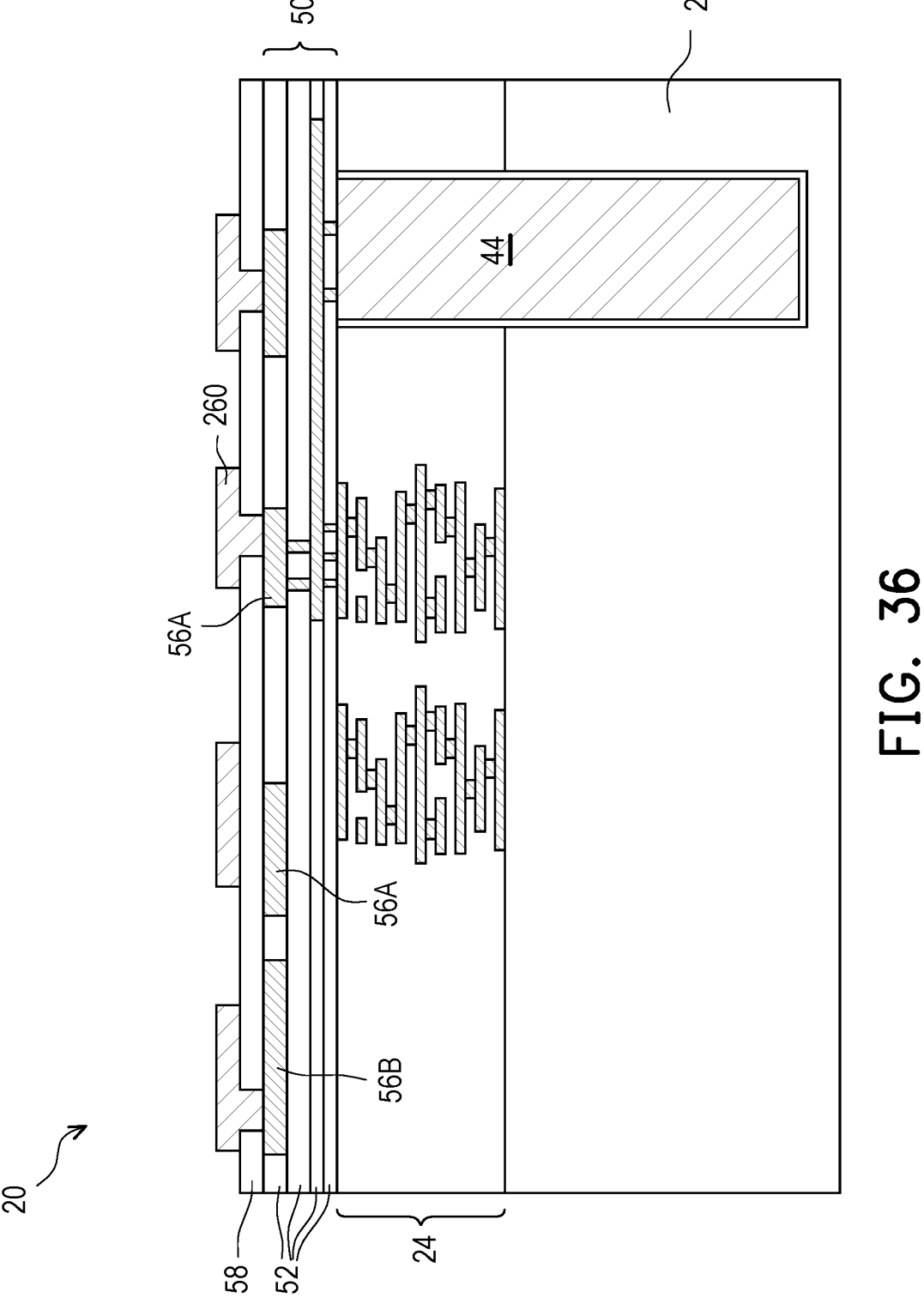
FIGS. 36, 37, 38A, 38B, and 39-41 illustrate cross-sectional views of intermediate stages in the formation of a die according to embodiments.

FIG. 36 illustrates a structure at a similar point in processing as FIG. 7 described above. Further, FIG. 36 includes a redistribution line (RDL) 260 over the passivation layer 58 and electrically coupled to the top metal 56. The materials and formation processes of the RDL 260 may be similar to the RDLs in the redistribution structure 140 described above and the description is not repeated herein.

Figure 37:
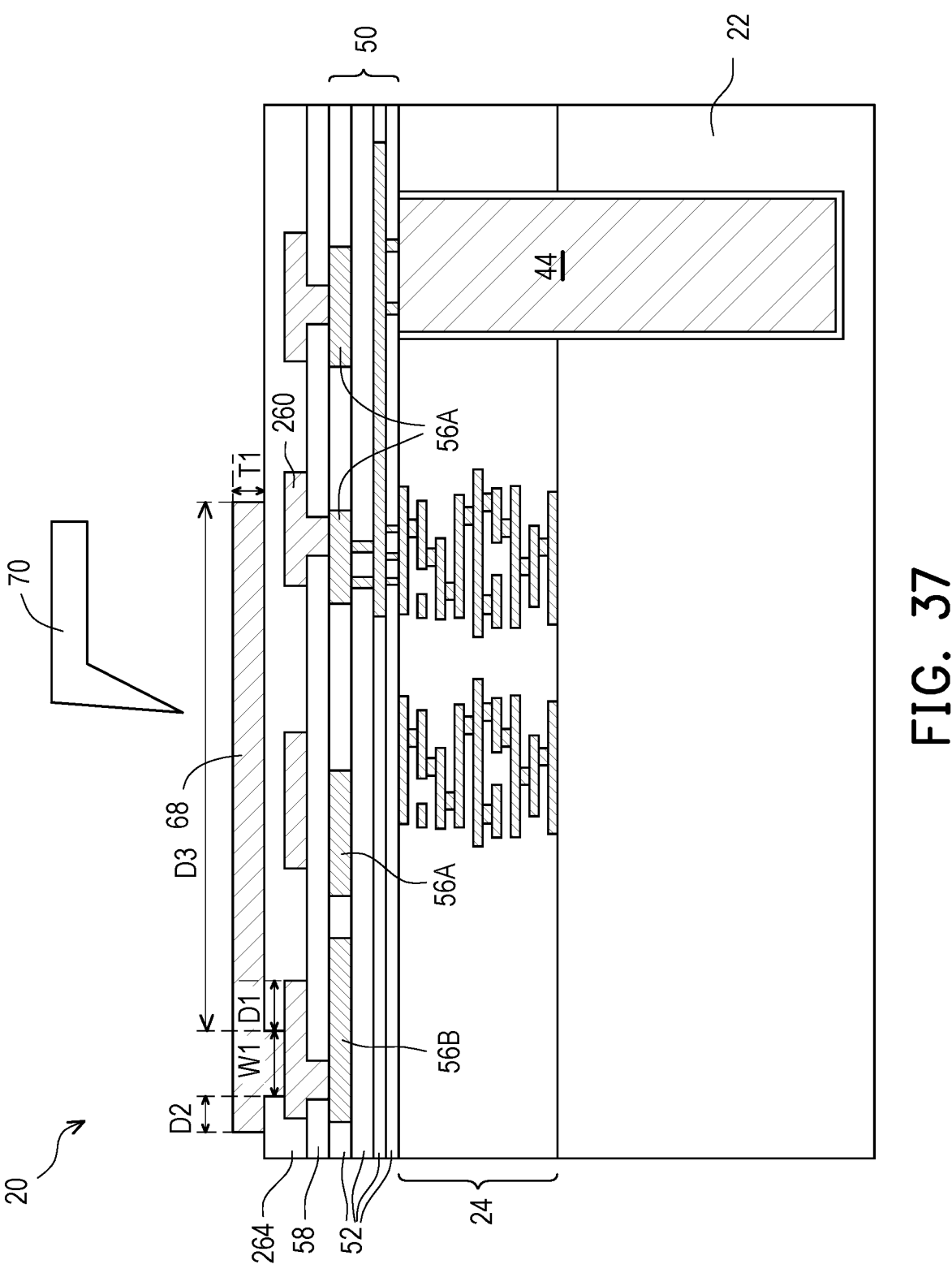

In FIG. 37, a passivation layer 264 is formed over the RDL 260 and the passivation layer 58. The materials and formation processes of the passivation layer 264 may be similar to the passivation layer 58 described above and the description is not repeated herein.

Further in FIG. 37, the probe pad 68 is formed over and extending through the passivation layer 264 and is electrically coupled to the RDL 260 on the top metal 56B. The materials and formation processes of the probe pad 68 have been described above and the description is not repeated herein.

As discussed in previous embodiments, acceptance testing, such as circuit probe testing, is performed on the integrated circuit die 20 to ascertain whether the integrated circuit die 20 is a known good die (KGD). In some embodiments, the acceptance testing is performed on the integrated circuit die 20 before singulation while it is in wafer form. In some embodiments, the acceptance testing is performed on integrated circuit die 20 after singulation when it is in die form. The integrated circuit die 20 may be tested using one or more probes 70. The probes 70 are physically and electrically coupled to the probe pads 68. After the testing, the probe pads 68 may be removed as described above.

Figure 38A:
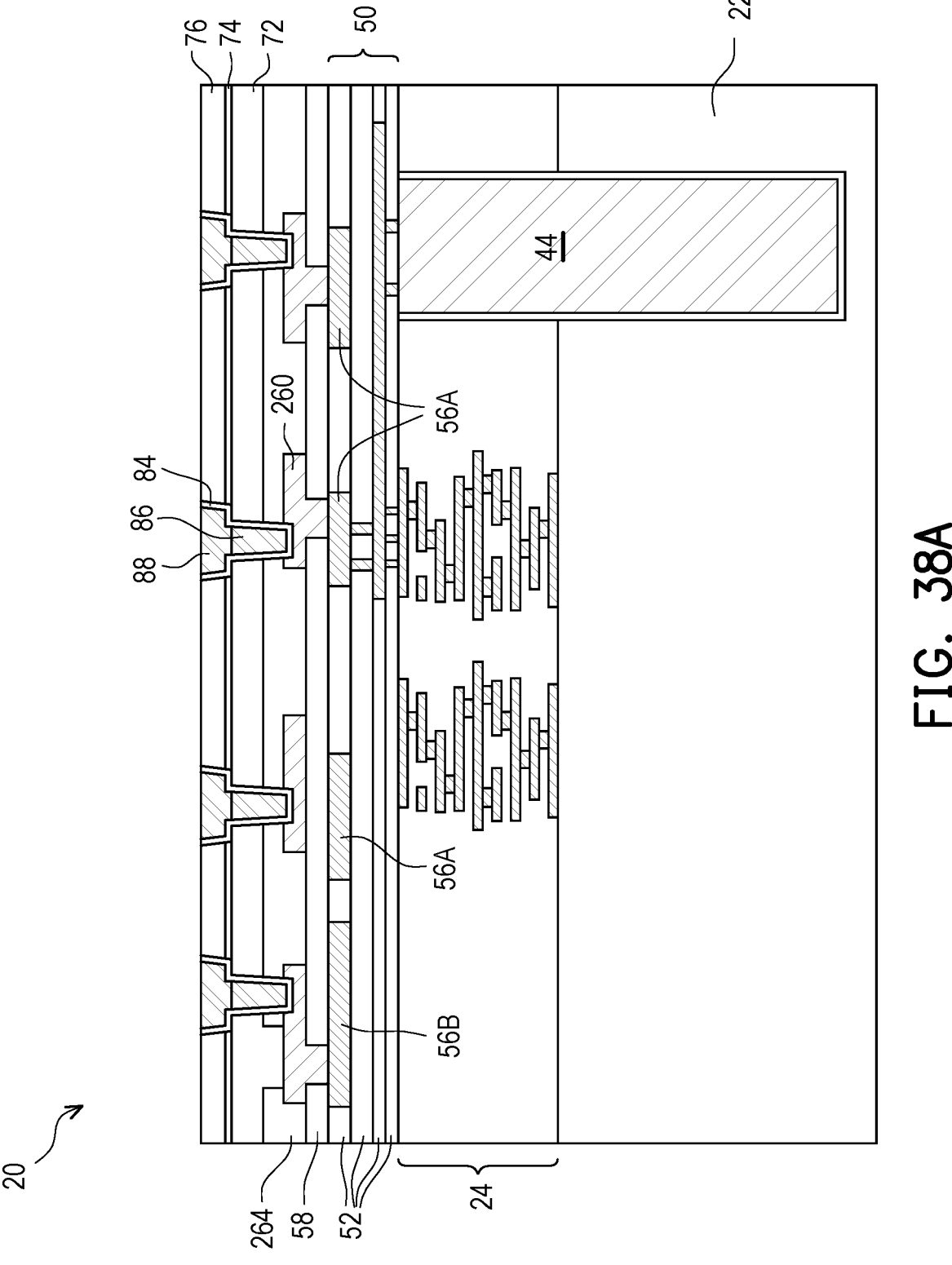
Figure 38B:
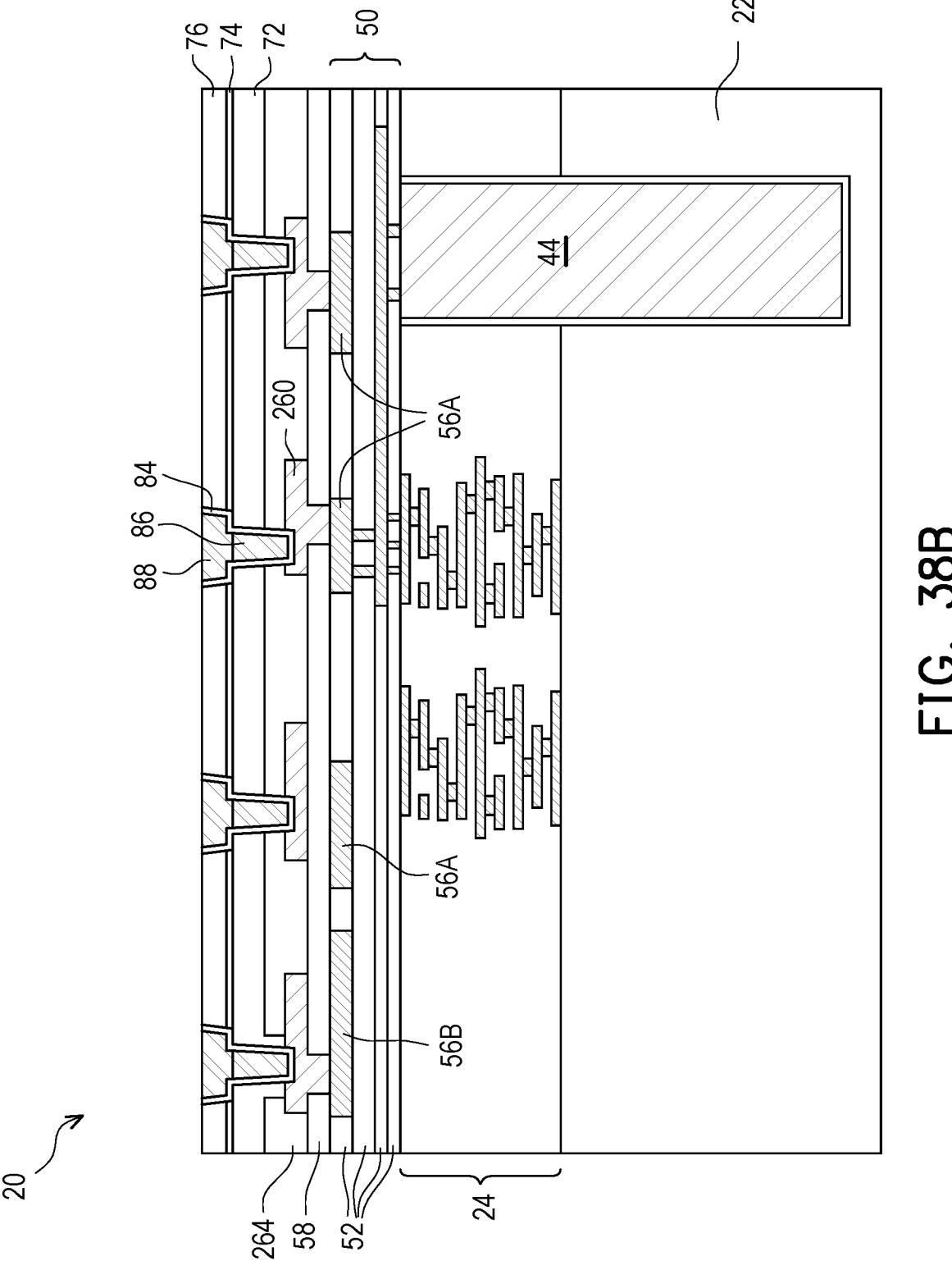

FIGS. 38A and 38B illustrate similar cross-sectional views as FIGS. 19A and 19B, respectively, with FIGS. 38A and 38B including the RDL 260. The materials and formation processes of the bond pad vias 86 and bond pads 88 have been described above and the description is not repeated herein.

Figure 39:
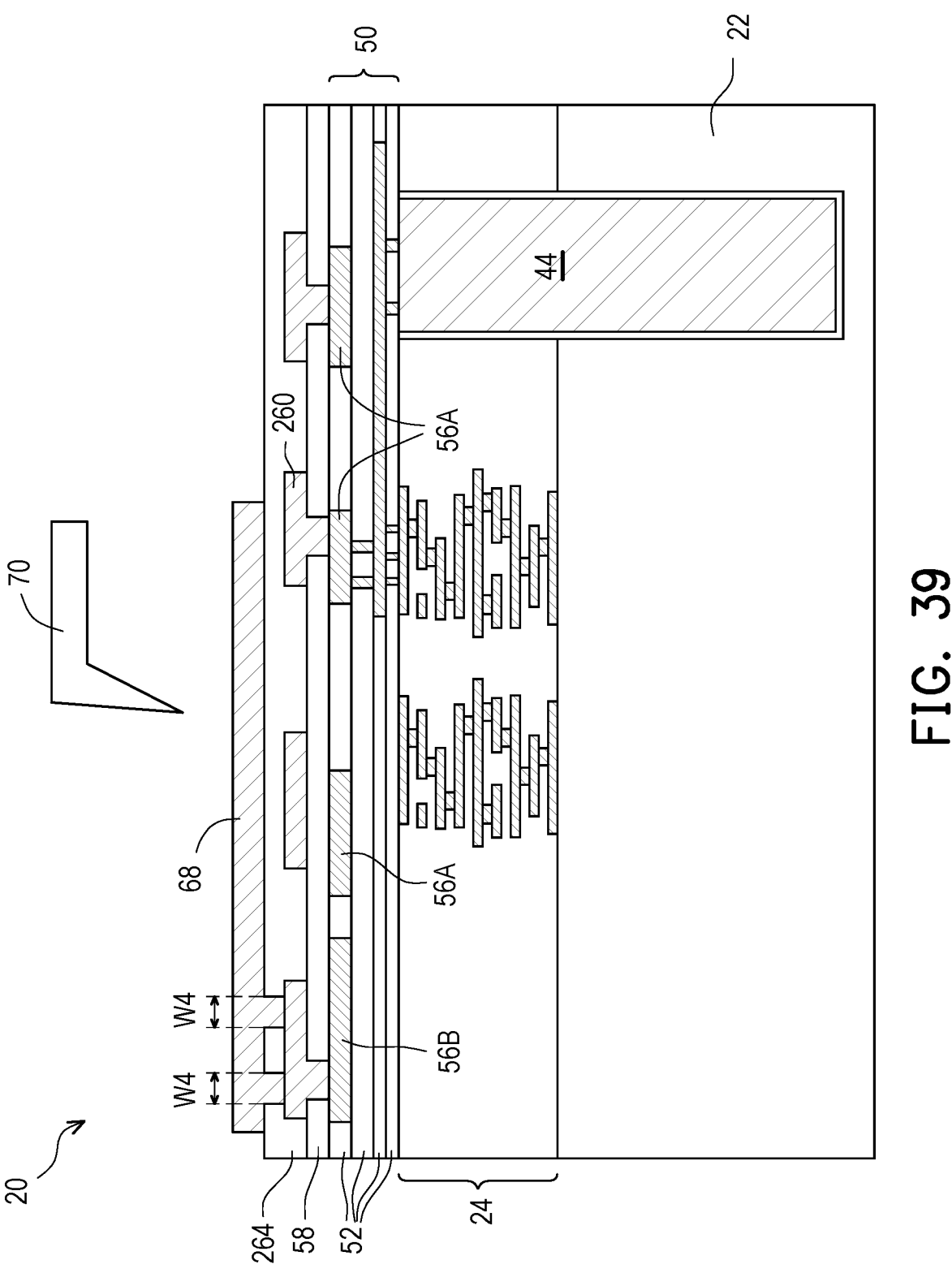

FIG. 39 illustrates a cross-sectional view of the integrated circuit die 20 in accordance with an embodiment similar to the embodiment in FIG. 37 described above. In FIG. 39, the probe pad 68 is coupled to the RDL 260 through two openings through the passivation layer 264 instead of a single opening as shown in FIG. 37. In some embodiments, the openings through the passivation layer 264 each have a width W4 in a range from 1 μm to 10 μm.

As discussed in previous embodiments, acceptance testing, such as circuit probe testing, is performed on the integrated circuit die 20 to ascertain whether the integrated circuit die 20 is a known good die (KGD). In some embodiments, the acceptance testing is performed on the integrated circuit die 20 before singulation while it is in wafer form. In some embodiments, the acceptance testing is performed on integrated circuit die 20 after singulation when it is in die form. The integrated circuit die 20 may be tested using one or more probes 70. The probes 70 are physically and electrically coupled to the probe pads 68. The probes 70 are physically and electrically coupled to the probe pads 68. After the testing, the probe pads 68 may be removed as described above.

Figure 40:
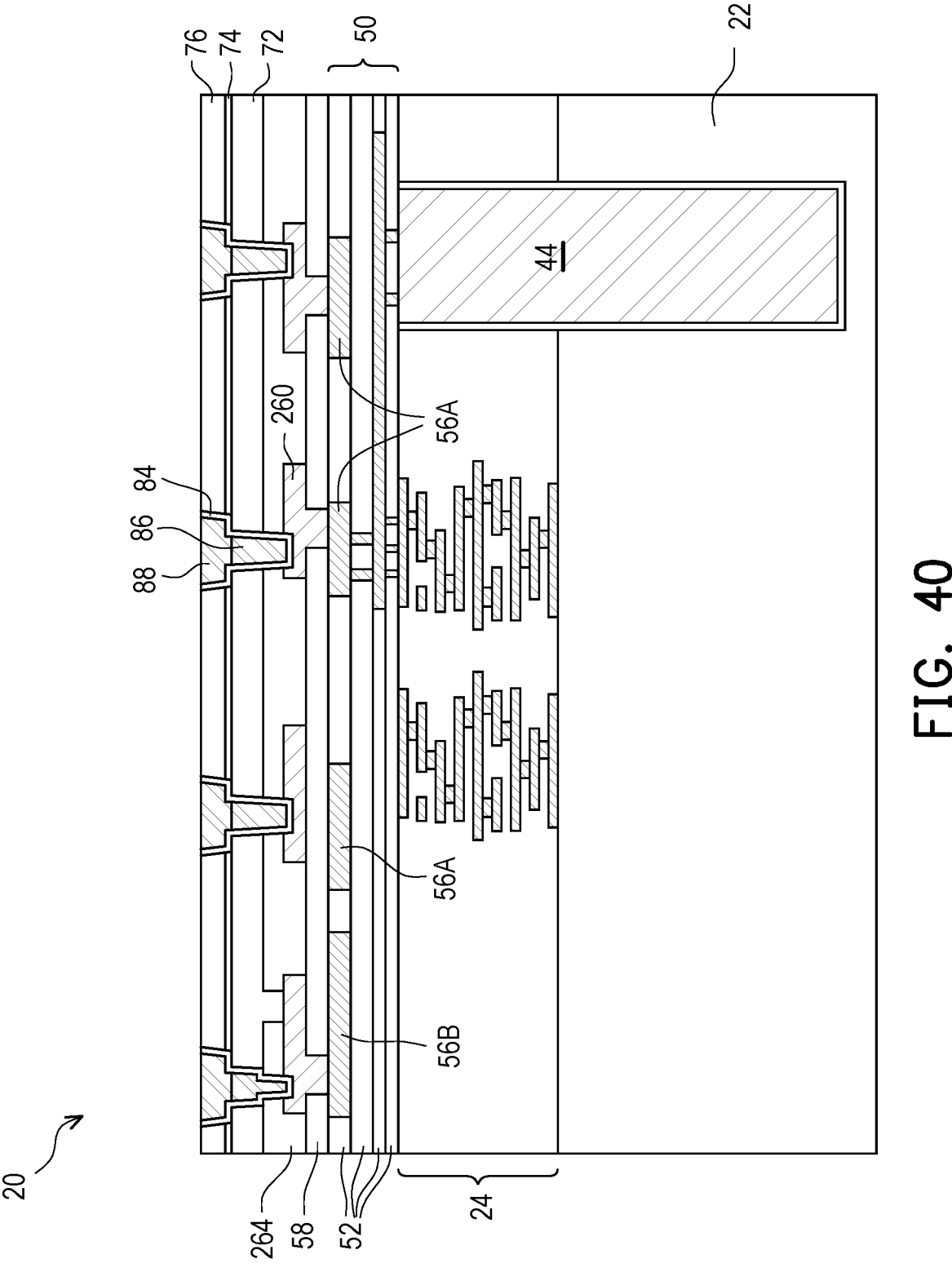

In FIG. 40, the dielectric layers 72, 74, and 76, the bond pad vias 86, the bond pads 88, and barrier layer 84 have been formed over the structure of FIG. 39. In the illustrated embodiment, at least one of the bond pad vias 86 is formed in the opening of the passivation layer 264 that was used by the probe pad 68 before it was removed. In this embodiment, the portion of the bond pad via 86 formed in the dielectric layer 72 is wider than the portion of the bond pad via 86 formed in the probe pad opening of the passivation layer 264. In some embodiments, the bond pad via 86 in the dielectric layer 72 has a width in a range from 2 μm to 20 μm. In some embodiments, the bond pad via 86 in the probe pad opening of the passivation layer 264 has a width in a range from 1 μm to 10 μm. In some embodiments, the bond pad 88 has a width in a range from 3 μm to 25 μm.

Figure 41:
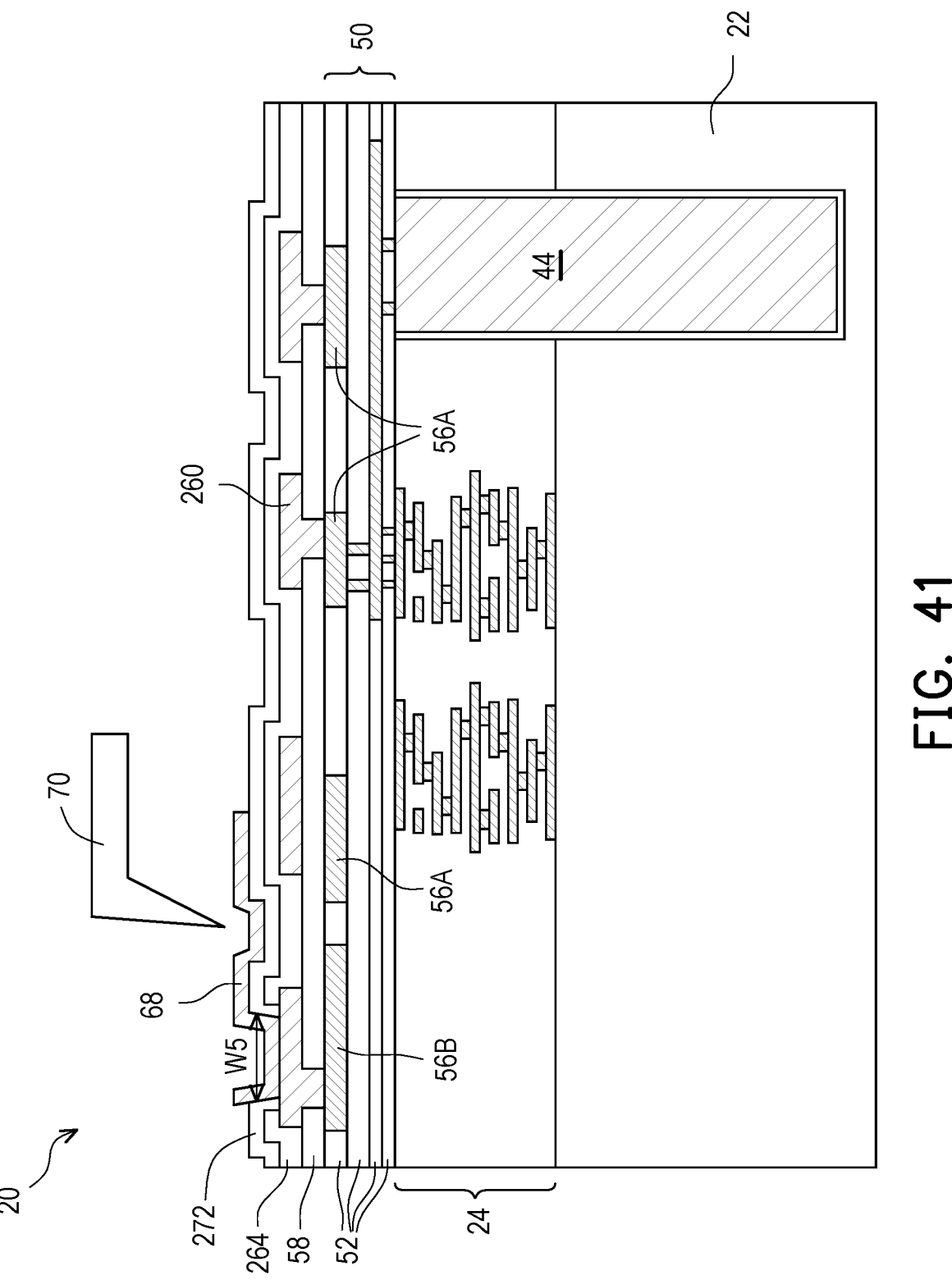

FIG. 41 illustrates a cross-sectional view of the integrated circuit die 20 in accordance with some embodiments. In these embodiments, one or more of the passivation layers are conformal layers with top surfaces that follow the topography of the underlying structures. For example, in FIG. 41, the top surface of the passivation layer 264 follows the topography of the underlying RDL 260 and passivation layer 58, whereas in, for example, FIG. 37, the top surface of the passivation layer 264 is planar and does not follow the underlying topography. Details regarding this embodiment that are similar to those for the previously described embodiment will not be repeated herein.

In FIG. 41, after the passivation layer 264 is formed over the RDL 260, an opening is formed through the passivation layer 264 to expose a portion of the RDL 260 connected to the top metal 56B. This opening may be formed in a similar manner to opening 60 described above and the description is not repeated herein.

After that opening is formed, a third passivation layer 272 is formed over the second passivation layer 264, in the opening of the second passivation layer 264, and along the exposed top surface of the RDL 260. The third passivation layer 272 may also be a conformal layer. The materials and formation processes of passivation layer 272 may be similar to the passivation layer 58 and 264 described above and the description is not repeated herein.

After the formation of the third passivation layer 272, an opening is formed through the third passivation layer 272 to expose a portion of the RDL 260 connected to the top metal 56B. This opening may be formed in a similar manner to opening 60 described above and the description is not repeated herein. The opening through the third passivation layer 272 has a width W5. In some embodiments, the width W5 is in a range from 10 μm to 50 μm. In some embodiments, the width W5 is in a range from 2 μm to 20 μm.

Further in FIG. 41, the probe pad 68 is formed over and extending through the passivation layers 272 and 264 and is electrically coupled to the RDL 260 on the top metal 56B. The materials and formation processes of the probe pad 68 have been described above and the description is not repeated herein. In this embodiment, the probe pad 68 has a non-planar bottom surface and a non-planar top surface resulting from the conformal depositions of the passivation layers 264 and 272.

As discussed in previous embodiments, acceptance testing, such as circuit probe testing, is performed on the integrated circuit die 20 to ascertain whether the integrated circuit die 20 is a known good die (KGD). In some embodiments, the acceptance testing is performed on the integrated circuit die 20 before singulation while it is in wafer form. In some embodiments, the acceptance testing is performed on integrated circuit die 20 after singulation when it is in die form. The integrated circuit die 20 may be tested using one or more probes 70. The probes 70 are physically and electrically coupled to the probe pads 68. The probes 70 are physically and electrically coupled to the probe pads 68. After the testing, the probe pads 68 may be removed as described above.

FIGS. 42 through 46C illustrate cross-sectional views of intermediate stages in the formation of a package component 360 in accordance with some embodiments. Details regarding this embodiment that are similar to those for the previously described embodiment will not be repeated herein.

Figure 42:
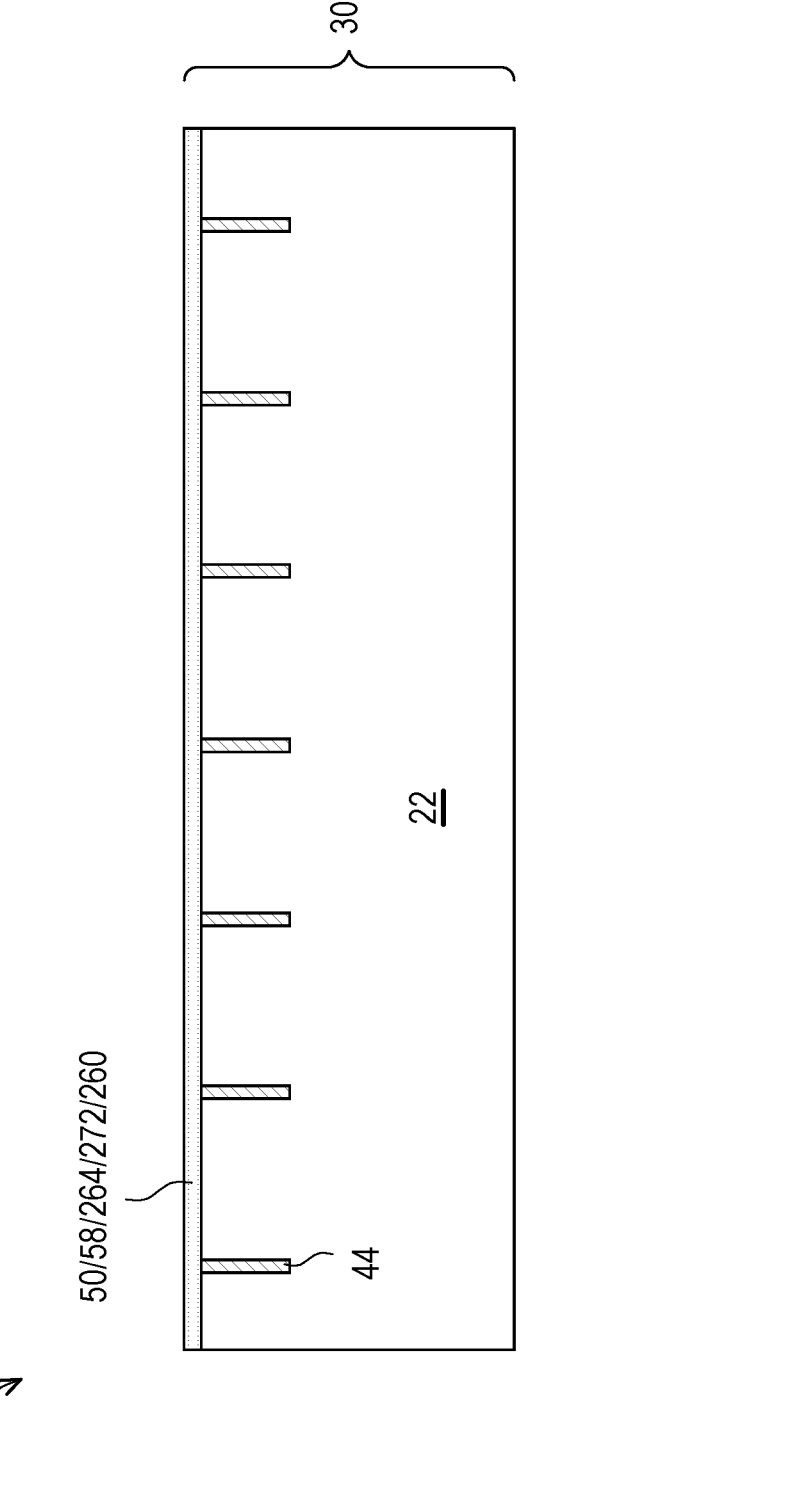
FIGS. 42-45, 46A, 46B, 46C, and 47 illustrate cross-sectional views of intermediate stages in the formation of a package according to embodiments.

In FIG. 42, a wafer 300 is illustrated. The wafer 300 may be similar to the die 20 described above in FIG. 41 except that the wafer 300 is not necessarily going to undergo a singulation step to form dies but, in some embodiments, may be left in wafer form and packaged. Details of the interconnect structure 50, passivation layers 58, 264, and 272, and RDL 260 is described above and the description is not repeated herein.

Figure 43:
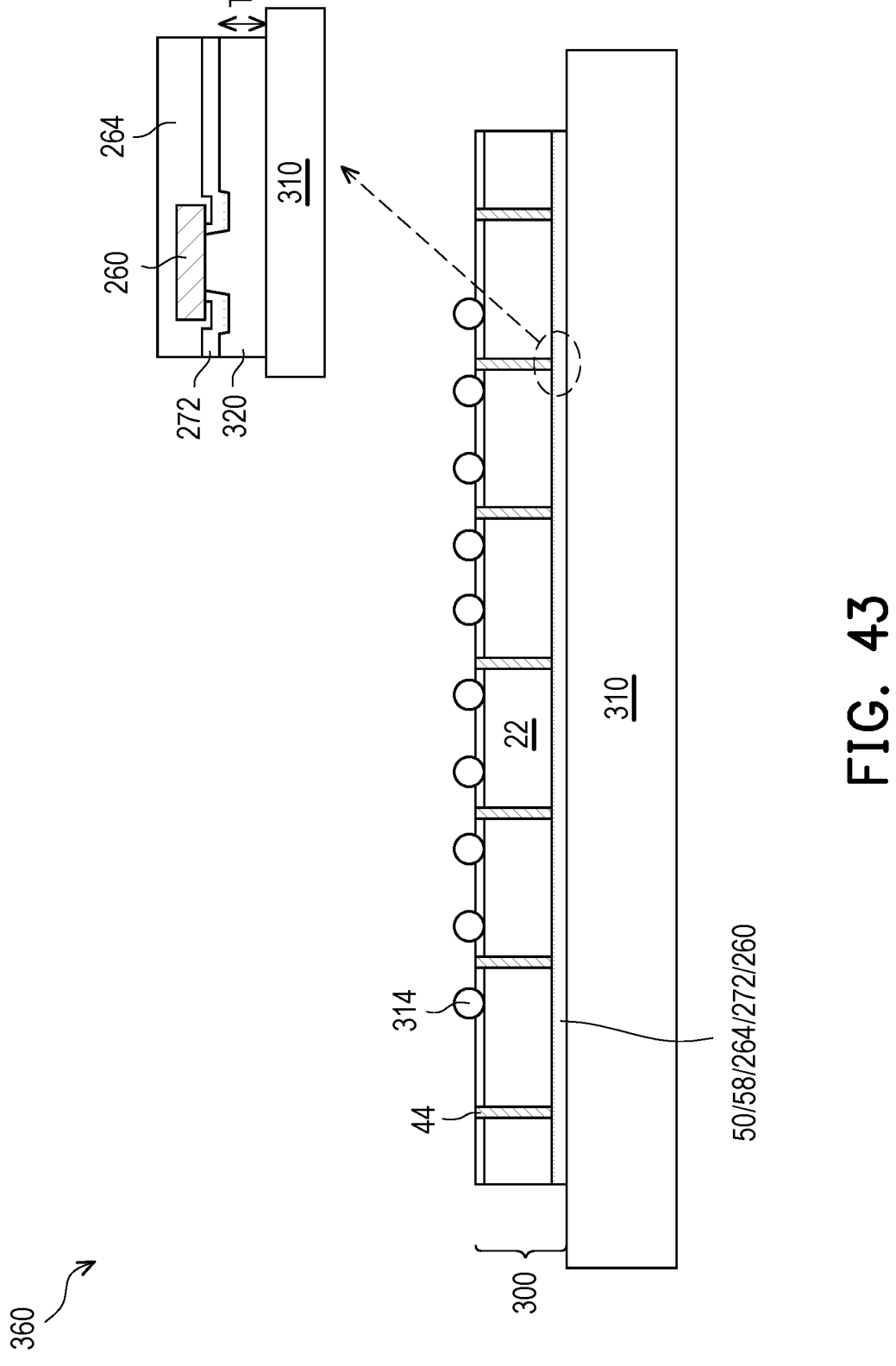

In FIG. 43, after the chip probe testing and the removal of the probe pad 68, the wafer 300 is attached to a carrier substrate 310. FIG. 43 includes a detailed view of the attaching interface between the wafer 300 and the carrier substrate 310. The attaching of the wafer 300 to the carrier substrate 310 may be similar to the attaching of dies 20 to carrier substrate 120. In some embodiments, the wafer 300 is attached to the carrier substrate 310 with an adhesive layer 320, such as a die attach film or the like. The adhesive layer 320 has a thickness T2. In some embodiments, the thickness T2 is in a range from 10 μm to 40 μm. As illustrated in FIG. 43, the adhesive layer 320 extends into the opening of the third passivation layer 272 and physically contacts the RDL 260.

Further in FIG. 43, the wafer 300 is thinned to expose the TSVs 44 at the backside of the wafer 300. The thinning process has been described above and the description is not repeated herein.

After the thinning process, conductive connectors 314 are formed on the backside of the wafer 300. In some embodiments, a backside redistribution structure may be formed on the thinned backside of the wafer 300 with the conductive connectors 314 formed on the backside redistribution structure. The materials and formation processes of backside redistribution structure may be similar to the redistribution structure 140 described above and the description is not repeated herein. The materials and formation processes of conductive connectors 314 may be similar to the conductive connectors 144/146 described above and the description is not repeated herein. In some embodiments, the conductive connectors 314 are micro bumps.

Figure 44:
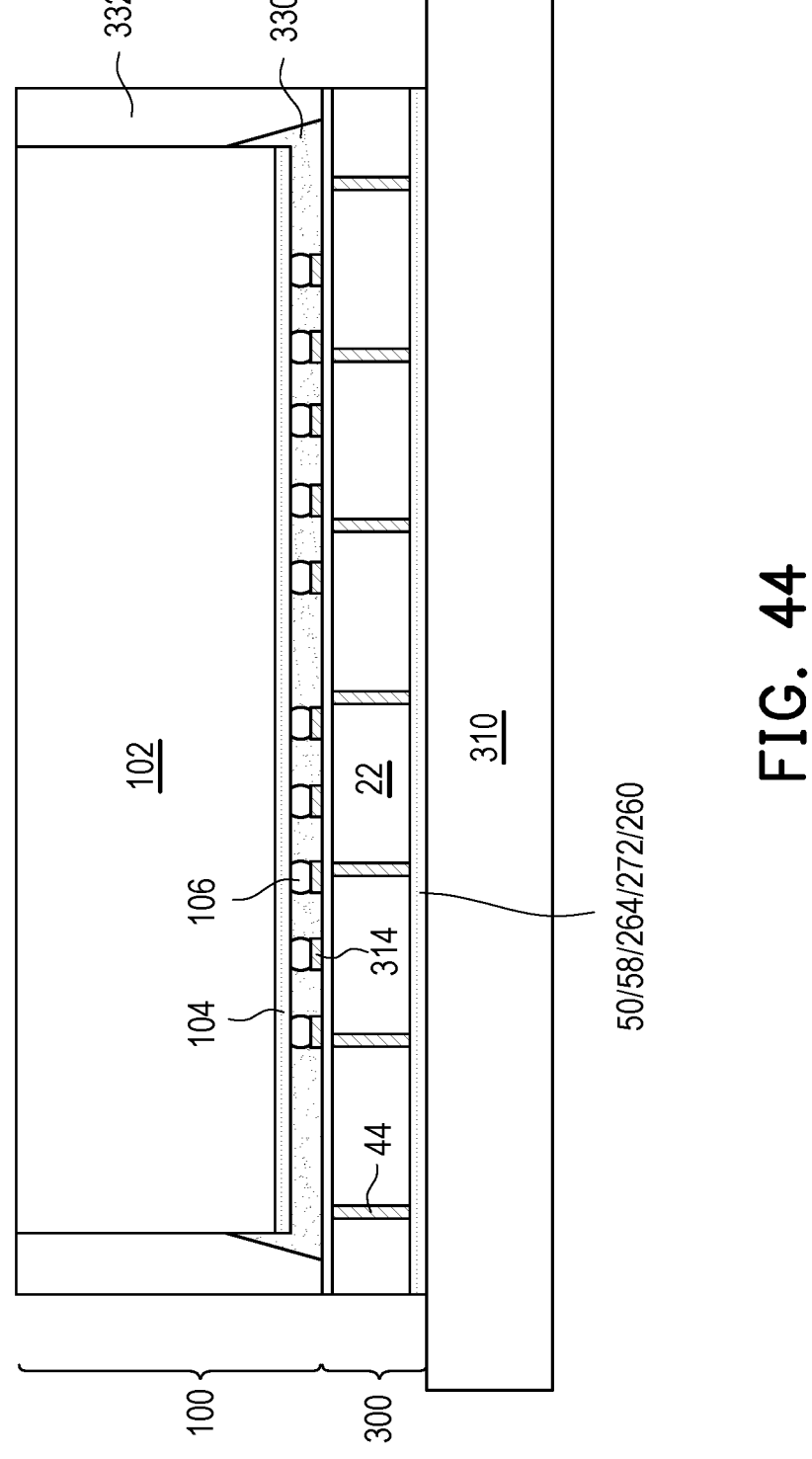

In FIG. 44, a die 100 is bonded to the backside of the wafer 300. The die 100 may be similar to the package component 100 described above in FIG. 21 except that, in this embodiment, the die 100 is not necessarily direct bonded to the wafer 300 but may include die connectors or other connection types that are bonded to the wafer 300. For example, connectors 106 of the die 100 may be die connectors and be bonded to the conductive connectors 314 to electrically and physically couple the die 100 to the wafer 300.

In some embodiments, an underfill 330 is formed between the die 100 and the wafer 300, surrounding the conductive connectors 314/106. The underfill may reduce stress and protect the joints resulting from the reflowing of the conductive connectors 314/106. The underfill may be formed by a capillary flow process after the die 100 is attached, or may be formed by a suitable deposition method before the die 100 is attached. In embodiments where the epoxy flux is formed, it may act as the underfill.

In FIG. 44, an encapsulant 332 is formed around the die 100 and the underfill 330 and on the wafer 300. After formation, the encapsulant 332 encapsulates the die 100 and the underfill 330. The encapsulant 332 may be a molding compound, epoxy, or the like. In some embodiments, the encapsulant 332 includes a polymer resin having fillers disposed therein. The encapsulant 332 may be applied by compression molding, transfer molding, or the like, and may be dispensed such that the die 100 and the underfill 330 are buried or covered. The encapsulant 332 may be applied in liquid or semi-liquid form and then subsequently cured. A planarization process may be performed on the encapsulant 332 to expose the backside of the die 100. The planarization process may remove material of the encapsulant 332 and the substrate 102. After the planarization process, top surfaces of the encapsulant 332 and the backsides of the dies 100 are substantially coplanar (within process variations) such that they are level with one another. The planarization process may be, for example, a chemical-mechanical polish (CMP), a grinding process, or the like. In some embodiments, the planarization process may be omitted.

Figure 45:
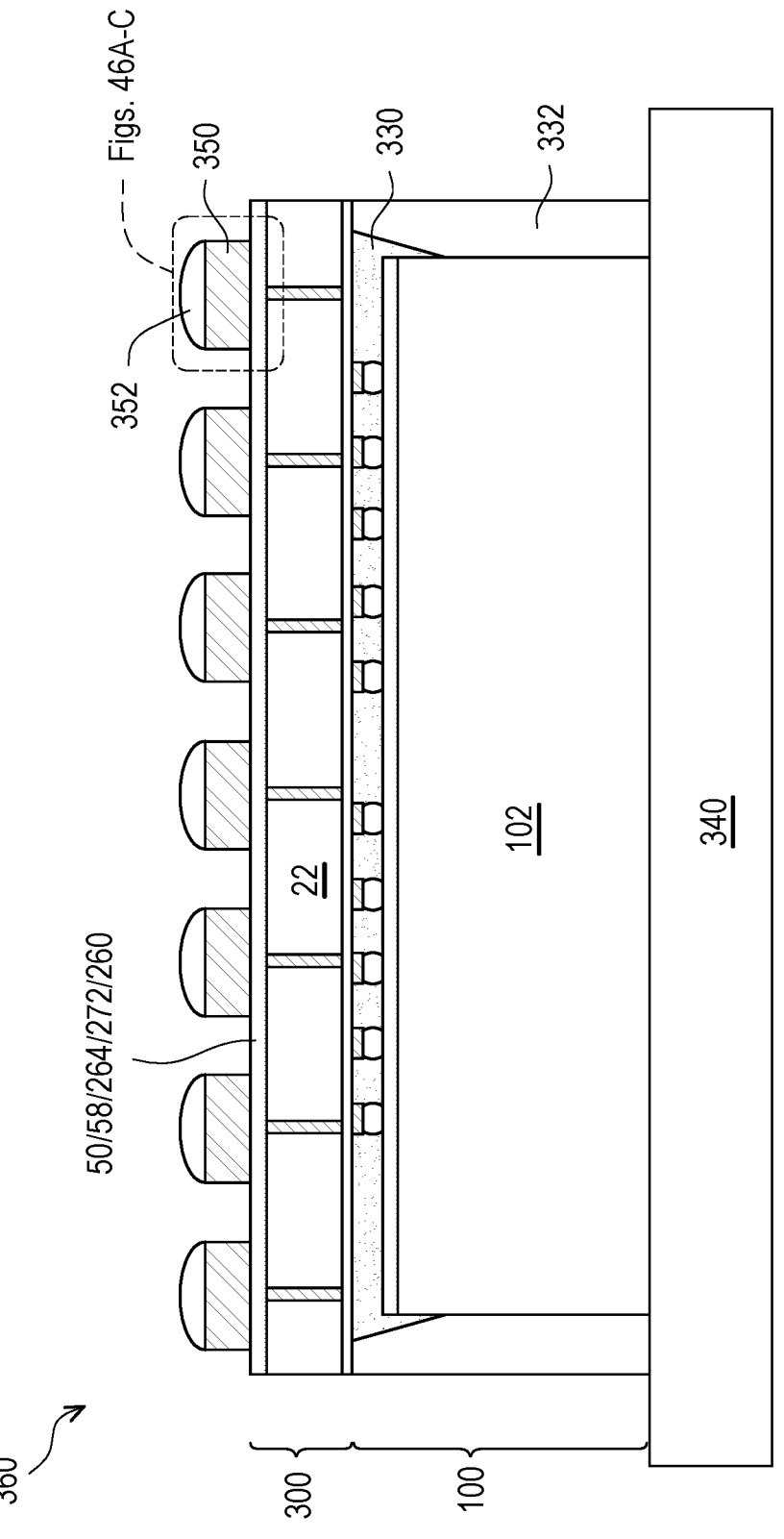

In FIG. 45, a carrier swap process is performed. The swap process includes attaching the backside of the dies 100 and the encapsulant 332 to a second carrier substrate 340 and removing the first carrier substrate 310.

The structure of FIG. 44 may be flipped over and placed on the carrier substrate 340 with a release layer (not shown). The structure does not have to be a carrier substrate and may be any acceptable support structure, such as tape or a frame. The materials of the carrier substrate 340 and the release layer may be similar to the carrier substrate 120 and the release layer described above and the descriptions are not repeated herein.

After the structure is attached the second carrier substrate 340, a debonding process is performed to detach (or "debond") the carrier substrate 310 from wafer 300. After the carrier substrate 310 is removed, the front-sides of the wafer 300 is exposed.

Further in FIG. 45, metallizations 350 and conductive connectors 352 are formed on the RDL 260 of the wafer 300. In some embodiments, the metallizations 350 and conductive connectors 352 are formed in a similar manner and materials to the metallizations 142 and conductive connectors 144 and the descriptions are not repeated herein.

In other embodiments, the wafer 300 may be bonded to the die 100 in a face-to-face configuration. For example, the face of the wafer 300 could be bonded to the face of the die 100.

Figures 46A, 46B, 46C:
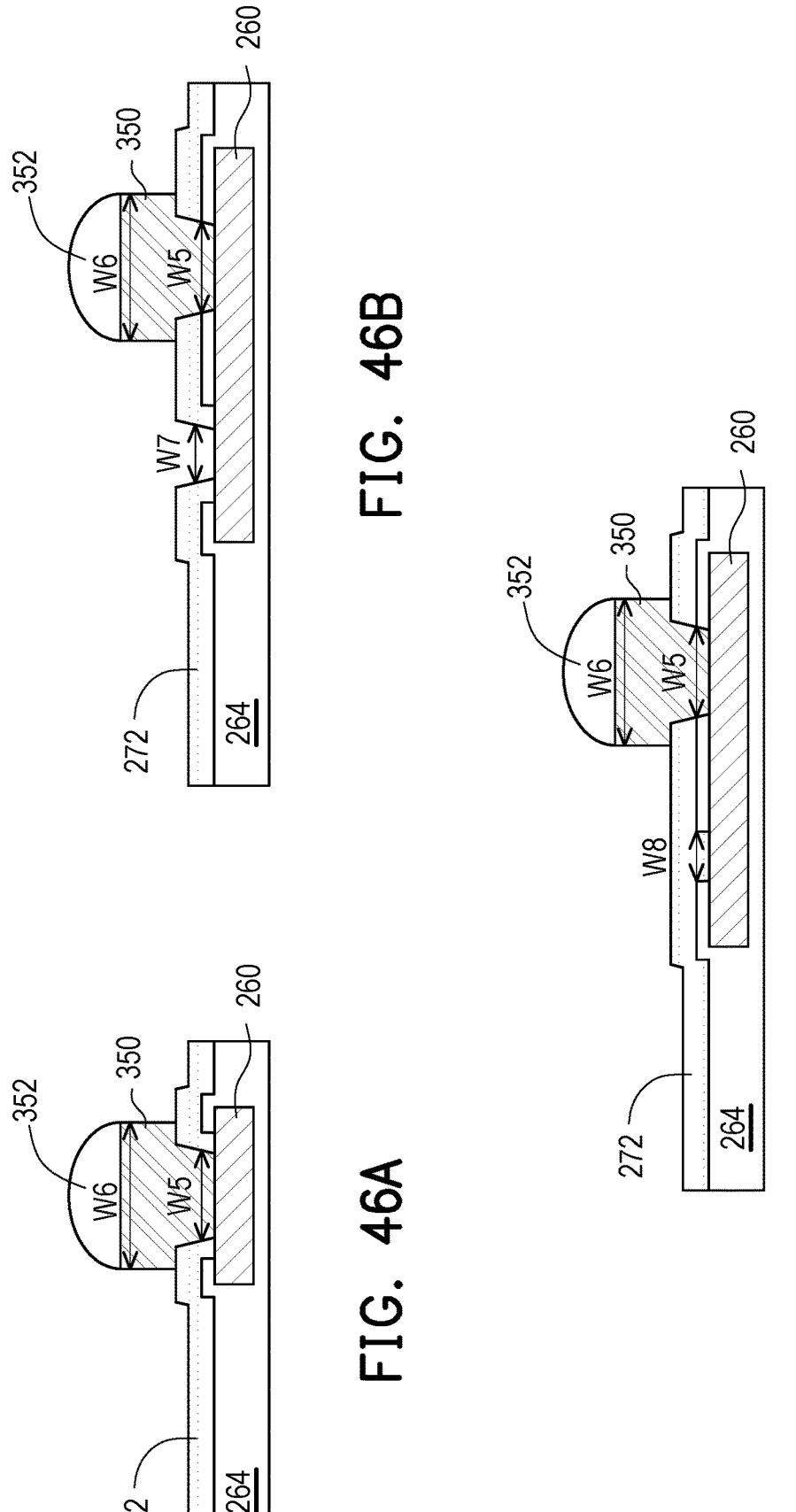

FIGS. 46A, 46B, and 46C illustrate detailed views of the various configurations of the metallizations 350 and conductive connectors 352. In FIG. 46A, the metallization 350 and conductive connector 352 are formed in the opening used by the probe pad 68 as shown, for example, in FIG. 41. The metallization 350 and the conductive connector 352 have a width W6. In some embodiments, the width W6 is in a range from 20 μm to 80 μm. In some embodiments, the width W6 is larger than the width W5.

In FIG. 46B, the metallization 350 and conductive connector 352 are not formed in the opening used by the probe pad 68 as shown, for example, in FIG. 41. In this embodiment, the opening used by the probe pad 68 has a width W7 and is smaller than the opening required for the metallization 350 and conductive connector 352, which has a width W5. In some embodiments, the width W7 is in a range from 2 μm to 20 μm.

In FIG. 46C, the metallization 350 and conductive connector 352 are not formed in the opening used by the probe pad 68 as shown, for example, in FIG. 41. In this embodiment, the probe pad 68 is formed and removed before the passivation layer 272 is formed. In this embodiment, the probe pad is formed through an opening in the second passivation layer 264 with a width W8 to contact the RDL 260. After the probe pad 68 is removed, the passivation layer 272 is formed over the passivation layer 264 and may fill the opening in the passivation layer 264 with the width W8. The width W8 is smaller than the opening for the metallization 350 and conductive connector 352, which has a width W5. In some embodiments, the width W8 is in a range from 1 μm to 20 μm.

Figure 47:
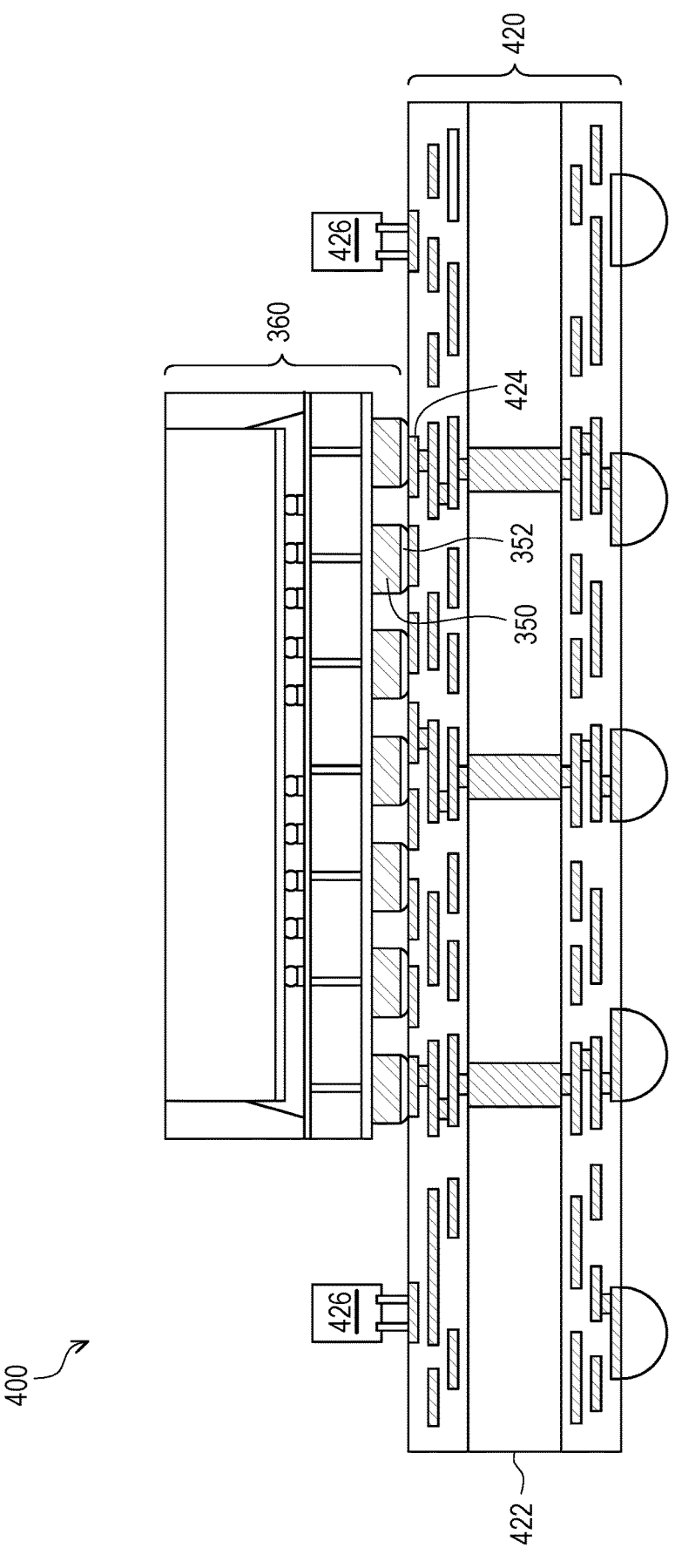

In FIG. 47, a package component 360 is attached to a package substrate 420 using the conductive connectors 352 to form a package structure 400. The package substrate 420 includes a substrate core 422, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 222 may be a SOI substrate. Generally, an SOI substrate includes a layer of a semiconductor material such as epitaxial silicon, germanium, silicon germanium, SOI, SGOI, or combinations thereof. In another embodiment, the substrate core 422 is an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate core 422.

The substrate core 422 may include active and passive devices (not separately illustrated). Devices such as transistors, capacitors, resistors, combinations thereof, and the like may be used to generate the structural and functional requirements of the design for the system. The devices may be formed using any suitable methods.

The substrate core 422 may also include metallization layers and vias, and bond pads 424 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, or the like). In some embodiments, the substrate core 422 is substantially free of active and passive devices.

The conductive connectors 352 are reflowed to attach the metallizations 350 to the bond pads 424. The conductive connectors 352 connect the package component 360, including the RDL 260 and interconnect structure 50, to the package substrate 420, including metallization layers of the substrate core 422. Thus, the package substrate 420 is electrically connected to the die 100. In some embodiments, passive devices (e.g., surface mount devices (SMDs), not separately illustrated) may be attached to the package component 360 (e.g., bonded to the metallizations 350) prior to mounting on the package substrate 420. In such embodiments, the passive devices may be bonded to a same surface of the package component 360 as the conductive connectors 352. In some embodiments, passive devices 426 (e.g., SMDs) may be attached to the package substrate 420, e.g., to the bond pads 424.

In some embodiments, an underfill (not shown) is formed between the package component 360 and the package substrate 420, surrounding the conductive connectors 352. The underfill may be formed by a capillary flow process after the package component 360 is attached or may be formed by any suitable deposition method before the package component 360 is attached. The underfill may be a continuous material extending from the package substrate 420 to wafer 300 (e.g., to the passivation layer 272).

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments discussed herein may be discussed in a specific context, namely an interconnect structure with a sacrificial probe pad that can be integrated into a device (e.g., a chip or die) or a package (e.g., system on integrated chip (SoIC), a chip-on-wafer (CoW) package structure, or a wafer-on-wafer (WoW) package structure). The interconnect structure includes sacrificial probe pad to allow intermediate testing of the chip or device for known good die integration while increasing the area for interconnect routing. In some embodiments, the sacrificial probe pad is formed of a material that can be removed after the testing is performed so that underlying metallization layers can be reached by conductive vias. In some embodiments, the same metallization feature or metal pad is that the sacrificial probe pad is formed on subsequently has a conductive via formed on. Further, in some embodiments, the subsequent conductive via is formed in the same opening that the sacrificial probe pad was formed in. In conventional structures, the probe pad is not removable, and the underlying area is not reachable by conductive vias such that the underlying area is not used for interconnect routing but is unutilized space of the interconnect. By having the probe pad be removable, the routing area of the interconnect can be increased.

An embodiment is a method including a first dielectric layer over a first substrate, the first dielectric layer having a first metallization pattern therein. The method also includes forming a second dielectric layer over the first dielectric layer and the first metallization pattern. The method also includes forming a sacrificial pad over and extending into the second dielectric layer, the sacrificial pad being electrically coupled to a first conductive feature in the first metallization pattern. The method also includes performing a circuit probe test on the sacrificial pad. The method also includes after performing the circuit probe test, performing an etch process, the etch process removing the sacrificial pad.

Embodiments may include one or more of the following features. The method further includes after removing the sacrificial pad, forming a first bond via in a third dielectric layer over the second dielectric layer and the first conductive feature, the first bond via being electrically coupled to the first conductive feature in the first metallization pattern, and forming a first bond pad in a fourth dielectric layer over the first bond via and the third dielectric layer, the first bond pad being electrically coupled to the first bond via. The third dielectric layer physically contacts the first conductive feature. The sacrificial pad extends into a first opening of the second dielectric layer to physically contact the first conductive feature, where the first bond via extends into a second opening of the second dielectric layer to physically contact the first conductive feature. The second opening is within the first opening. The sacrificial pad is overlapping with a second conductive feature. Forming the sacrificial pad includes, depositing a seed layer over and extending through the second dielectric layer, and plating a solder material on the seed layer. The method further including forming a first patterned mask over the first dielectric layer, performing an etch process using the first patterned mask as a mask, the etch process forming a third opening through the first dielectric layer and partially through the first substrate, forming a liner in the third opening, filling the third opening with a conductive material, and thinning the first substrate to expose a portion of the conductive material in the third opening, the conductive material extending through the first dielectric layer and the first substrate forming a through substrate via. The method further including forming a third dielectric layer over the second dielectric layer, the sacrificial pad extending through the second and third dielectric layers to physically contact the first conductive feature, after removing the sacrificial pad, attaching the third dielectric layer to a carrier substrate with an adhesive layer, the adhesive layer physically contacting the first conductive feature, and after attaching the third dielectric layer to the carrier substrate with an adhesive layer, bonding a package structure to the first substrate with conductive connectors.

An embodiment is a method including forming a first interconnect structure over a first substrate, the first interconnect structure including dielectric layers and metallization patterns therein, the metallization patterns including a top metal layer including top metal structures. The method also includes forming a passivation layer over the top metal structures of the first interconnect structure. The method also includes forming a first opening through the passivation layer, a first top metal structure of the top metal structures being exposed through the first opening. The method also includes forming a probe pad in the first opening and over the passivation layer, the probe pad being electrically connected to the first top metal structure. The method also includes performing a circuit probe test on the probe pad. The method also includes after performing the circuit probe test, removing the probe pad. The method also includes and after removing the probe pad, forming a bond pad and a bond via in dielectric layers over the passivation layer, the bond pad and bond via being electrically coupled to the first top metal structure of the top metal structures.

Embodiments may include one or more of the following features. The method where the probe pad is overlapping with a second top metal structure. Removing the probe pad includes performing an etch process, the etch process removing the probe pad and exposing the first top metal structure in the first opening. The probe pad includes a solder. The second opening is within the first opening. Forming bond pads and bond vias in dielectric layers over the passivation layer includes forming a first dielectric layer over the passivation layer, forming a second dielectric layer over the first dielectric layer, patterning the first and second dielectric layers to expose the first top metal structure and a second top metal structure of the top metal structures, forming bond vias over the first and second top metal structure and in the first dielectric layer, the bond vias being electrically coupled to first and second top metal structures, and forming a first bond pads over the bond vias and in the second dielectric layer, the first bond pads being electrically coupled to the bond vias. The first dielectric layer extends through the passivation layer and physically contacts the first top metal structure. The method further including direct bonding the second dielectric layer and the first bond pads to a third dielectric layer and second bond pads of a package structure, the package structure including a second substrate and a second interconnect structure over the second substrate, the third dielectric layer and the second bond pads being part of the second interconnect structure. The method further including after direct bonding the second dielectric layer and the first bond pads to the third dielectric layer and the second bond pads of the package structure, forming a first redistribution structure over the first substrate, the first redistribution structure including dielectric layers and metallization patterns therein, the metallization patterns of the first redistribution structure being electrically coupled to the through substrate via, and forming a first set of conductive bumps over and electrically coupled to the first redistribution structure.

An embodiment is a structure including a first interconnect structure over a first substrate, the first interconnect structure including dielectric layers and metallization patterns therein. The structure also includes a through substrate via extending through the first interconnect structure and the first substrate. The structure also includes a first top metal structure and a second top metal structure in a first dielectric layer over the first interconnect structure. The structure also includes a second dielectric layer over the second top metal structure and partially over the first top metal structure. The structure also includes a third dielectric layer over the second dielectric layer, the third dielectric layer extending through the second dielectric layer to physically contact the first top metal structure. The structure also includes a first bond via in the second and third dielectric layers over the first top metal structure, the first bond via being electrically coupled to the first top metal structure. The structure also includes a first bond pad in a fourth dielectric layer over the first bond via, the first bond pad being electrically coupled to the first bond via. The structure also includes a second bond via in the second and third dielectric layers over the second top metal structure, the second bond via being electrically coupled to the second top metal structure. The structure also includes a second bond pad in a fourth dielectric layer over the second bond via, the second bond pad being electrically coupled to the second bond via.

Embodiments may include one or more of the following features. The structure where the third dielectric layer does not physically contact the second top metal structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first dielectric layer over a first substrate, the first dielectric layer having a first metallization pattern therein;
forming a second dielectric layer over the first dielectric layer and the first metallization pattern;
forming a sacrificial pad over and extending into the second dielectric layer, the sacrificial pad being electrically coupled to a first conductive feature in the first metallization pattern;
performing a circuit probe test on the sacrificial pad;
after performing the circuit probe test, performing an etch process, the etch process removing the sacrificial pad; and
after removing the sacrificial pad, forming a first bond via in a third dielectric layer over the second dielectric layer and the first conductive feature, the first bond via being electrically coupled to the first conductive feature in the first metallization pattern, the third dielectric layer physically contacting the first conductive feature.

2. The method of claim 1 further comprising:
forming a first bond pad in a fourth dielectric layer over the first bond via and the third dielectric layer, the first bond pad being electrically coupled to the first bond via.

3. The method of claim 1, further comprising:
forming a second bond via in the third dielectric layer and the second dielectric layer, the second bond via being electrically coupled to a second conductive feature in the first metallization pattern.

4. The method of claim 2, wherein the sacrificial pad extends into a first opening of the second dielectric layer to physically contact the first conductive feature, wherein the first bond via extends into a second opening of the second dielectric layer to physically contact the first conductive feature.

5. The method of claim 4, wherein the second opening is within the first opening.

6. The method of claim 1, wherein the sacrificial pad is overlapping with a second conductive feature.

7. The method of claim 1, wherein forming the sacrificial pad comprises;
depositing a seed layer over and extending through the second dielectric layer; and
plating a solder material on the seed layer.

8. The method of claim 1 further comprising:
forming a first patterned mask over the first dielectric layer;
performing an etch process using the first patterned mask as a mask, the etch process forming a third opening through the first dielectric layer and partially through the first substrate;
forming a liner in the third opening;
filling the third opening with a conductive material; and
thinning the first substrate to expose a portion of the conductive material in the third opening, the conductive material extending through the first dielectric layer and the first substrate forming a through substrate via.

9. A method comprising:
forming a first interconnect structure over a first substrate, the first interconnect structure comprising dielectric layers and metallization patterns therein, the metallization patterns including a top metal layer including top metal structures;
forming a passivation layer over the top metal structures of the first interconnect structure;
forming a first opening through the passivation layer, a first top metal structure of the top metal structures being exposed through the first opening;
forming a probe pad in the first opening and over the passivation layer, the probe pad being electrically connected to the first top metal structure;
performing a circuit probe test on the probe pad, the probe pad being over and extending along a top surface of the passivation layer during the circuit probe test;
after performing the circuit probe test, removing the probe pad; and
after removing the probe pad, forming a bond pad and a bond via in dielectric layers over the passivation layer, the bond pad and bond via being electrically coupled to the first top metal structure of the top metal structures.

10. The method of claim 9, wherein the probe pad is overlapping with a second top metal structure.

11. The method of claim 9, wherein removing the probe pad comprises:
performing an etch process, the etch process removing the probe pad and exposing the first top metal structure in the first opening.

12. The method of claim 9, wherein the probe pad comprises a solder.

13. The method of claim 9 further comprising:
forming a second opening through the passivation layer, the bond via being in the second opening, wherein the second opening is within the first opening.

14. The method of claim 10, wherein forming bond pads and bond vias in dielectric layers over the passivation layer comprises:
forming a first dielectric layer over the passivation layer;
forming a second dielectric layer over the first dielectric layer;
patterning the first and second dielectric layers to expose the first top metal structure and a second top metal structure of the top metal structures;
forming bond vias over the first and second top metal structures and in the first dielectric layer, the bond vias being electrically coupled to the first and second top metal structures; and
forming first bond pads over the bond vias and in the second dielectric layer, the first bond pads being electrically coupled to the bond vias.

15. The method of claim 14, wherein the first dielectric layer extends through the passivation layer and physically contacts the first top metal structure.

16. The method of claim 14 further comprising:

direct bonding the second dielectric layer and the first bond pads to a third dielectric layer and second bond pads of a package structure, the package structure comprising a second substrate and a second interconnect structure over the second substrate, the third dielectric layer and the second bond pads being part of the second interconnect structure.

17. The method of claim 16 further comprising after direct bonding the second dielectric layer and the first bond pads to the third dielectric layer and the second bond pads of the package structure, forming a first redistribution structure over the first substrate, the first redistribution structure comprising dielectric layers and metallization patterns therein, the metallization patterns of the first redistribution structure being electrically coupled to the through substrate via; and forming a first set of conductive bumps over and electrically coupled to the first redistribution structure.

18. The method of claim 9, further comprising:

forming a second bond pad and a second bond via in dielectric layers over the passivation layer, the second bond pad and the second bond via being electrically coupled to a second top metal structure of the top metal structures.

19. A structure comprising:

a first interconnect structure over a first substrate, the first interconnect structure comprising dielectric layers and metallization patterns therein;

a through substrate via extending through the first interconnect structure and the first substrate;

a first top metal structure and a second top metal structure in a first dielectric layer over the first interconnect structure;

a second dielectric layer over the second top metal structure and partially over the first top metal structure;

a third dielectric layer over the second dielectric layer, the third dielectric layer extending through the second dielectric layer to physically contact the first top metal structure;

a first bond via in the second and third dielectric layers over the first top metal structure, the first bond via being electrically coupled to the first top metal structure;

a first bond pad in a fourth dielectric layer over the first bond via, the first bond pad being electrically coupled to the first bond via;

a second bond via in the second and third dielectric layers over the second top metal structure, the second bond via being electrically coupled to the second top metal structure; and a second bond pad in a fourth dielectric layer over the second bond via, the second bond pad being electrically coupled to the second bond via.

20. The structure of claim 19, wherein the third dielectric layer does not physically contact the second top metal structure.

* * * * *